United States Patent
Lynch et al.

(10) Patent No.: US 11,930,604 B1
(45) Date of Patent: Mar. 12, 2024

(54) PORTABLE ELECTRONIC DEVICE CASE ACCESSORY SYSTEM

(71) Applicant: Pioneer Square Brands, Inc., Seattle, WA (US)

(72) Inventors: Riley Edwin Lynch, Greensboro, NC (US); Quentin Wade Forbes, Winston Salem, NC (US)

(73) Assignee: Pioneer Square Brands, Inc., High Point, NC (US)

( * ) Notice: Subject to any disclaimer, the term of this patent is extended or adjusted under 35 U.S.C. 154(b) by 0 days.

(21) Appl. No.: 18/219,062

(22) Filed: Jul. 6, 2023

Related U.S. Application Data

(63) Continuation-in-part of application No. 18/219,051, filed on Jul. 6, 2023, which is a continuation-in-part of application No. 18/211,743, filed on Jun. 20, 2023.

(51) Int. Cl.
| | |
|---|---|
| *H04M 1/00* | (2006.01) |
| *H05K 5/00* | (2006.01) |
| *H05K 5/02* | (2006.01) |

(52) U.S. Cl.
CPC ......... *H05K 5/0086* (2013.01); *H05K 5/0013* (2013.01); *H05K 5/0204* (2013.01); *H05K 5/023* (2013.01)

(58) Field of Classification Search
CPC ... H05K 5/0086; H05K 5/0204; H05K 5/0217
See application file for complete search history.

(56) References Cited

U.S. PATENT DOCUMENTS

| | | | | |
|---|---|---|---|---|
| 2008/0053851 | A1* | 3/2008 | Ko | A45C 11/00 206/320 |
| 2014/0099526 | A1* | 4/2014 | Powell | G06K 7/10881 429/100 |
| 2016/0134142 | A1* | 5/2016 | Murphy | H02J 7/0044 455/573 |
| 2019/0269212 | A1* | 9/2019 | Swart | A45C 11/182 |
| 2020/0076937 | A1* | 3/2020 | Ackerman | H04B 1/3888 |
| 2022/0191670 | A1* | 6/2022 | Kutscher | H04W 4/90 |

\* cited by examiner

*Primary Examiner* — Shantell L Heiber
(74) *Attorney, Agent, or Firm* — Grandview Law

(57) ABSTRACT

Systems involve implementations such as a first case assembly including a base including an interior surface and an exterior surface, first, second, and third side walls and an interior surface at least partially bounding an interior area to receive at least a portion of a portable electronic device, and a coupler assembly including a portion of the exterior surface of the base; and an accessory assembly configured to provide at least one electric communication or power function for the portable electronic device, wherein the accessory assembly being sized and shaped to couple with the coupler assembly of the case assembly. Other aspects are described in the claims, drawings, and text forming a part of the present disclosure.

15 Claims, 93 Drawing Sheets

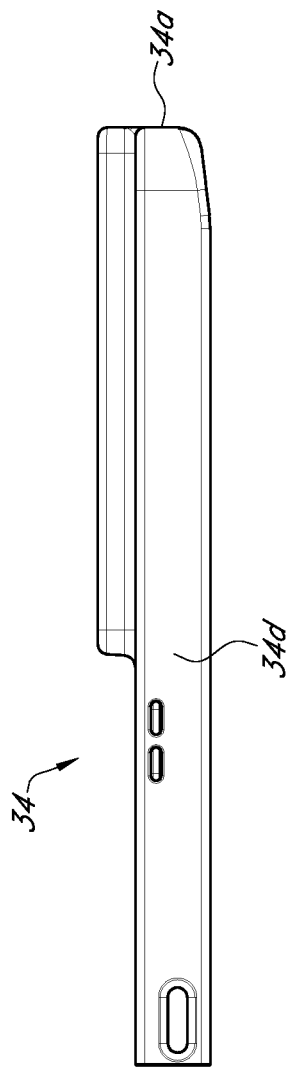
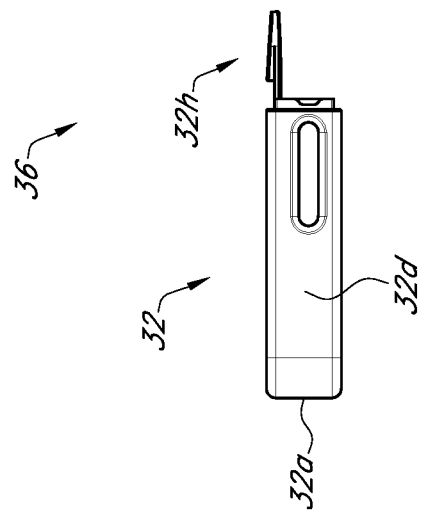
FIG. 50

PORTABLE ELECTRONIC DEVICE CASE ACCESSORY SYSTEM

SUMMARY

In one or more aspects a system for a portable electronic computing device including (I) a case assembly including (A) a base, (B) a first side wall extending perpendicular to the base, (C) a second side wall extending perpendicular to the base and extending perpendicular to the first side wall, (D) a third side wall extending perpendicular to the base and extending perpendicular to the first side wall, wherein the first side wall, the second side wall, the third side wall, and the base at least in part bounding a first interior area to receive the portable electronic device, and (E) a coupler assembly including a second interior area bounded in part by the base without being bounded by the first side wall, the second side wall and the third side wall; and (II) an accessory assembly configured to provide at least one portable electronic device service function, wherein the accessory assembly being sized and shaped to couple with the coupler assembly of the case assembly. Wherein the at least one portable electronic device service function includes storage of electrical power. Wherein the accessory assembly includes a first side, the first side including an elongated groove, wherein the accessory assembly includes a second side, the second side including an elongated groove, wherein the coupler assembly includes a first side wall, the first side wall including an elongated protrusion, wherein the coupler assembly includes a second side wall, the second side wall including an elongated protrusion, and wherein the elongated protrusions of the first side wall and the second side walls being sized, shaped, and positioned to engage with the elongated grooves of the first side and the second side of the accessory assembly, respectively, when the accessory assembly is coupled with the coupler assembly. Wherein the accessory assembly includes a main assembly and a cover assembly, and wherein the cover assembly being couplable with the main assembly. Wherein the cover assembly of the accessory assembly includes an interior side and an exterior side, wherein the cover assembly includes at least one protrusion extended from the interior side of the cover assembly, wherein the main assembly of the accessory assembly includes a back side, wherein the back side of the main assembly includes at least one notch, and wherein the at least one notch being sized, shaped, and positioned to engage with the at least one protrusion of the cover assembly when the cover assembly and main assembly are coupled together. Wherein the main assembly of the accessory assembly includes an L-shaped side profile with a base portion and an extended portion, and wherein the back side of the main assembly being part of both the base portion and the extended portion. Wherein the main assembly of the accessory assembly includes an electric plug extending therefrom. Wherein the coupler assembly of the case assembly includes an aperture sized and positioned to receive a portion of the base portion of the main assembly of the accessory assembly including the electric plug when the accessory assembly is coupled with the coupler assembly. Wherein the extended portion of the main assembly of the accessory assembly includes a hinged tab, and wherein the coupler assembly includes an aperture to receive the hinged tab when the accessory assembly is coupled with the coupler assembly. Wherein the extended portion of the main assembly of the accessory assembly includes a protrusion with an aperture, the protrusion extending from an end of the extended portion, and wherein the coupler assembly includes an aperture to receive the protrusion of the extended portion of the main assembly of the accessory assembly and an aperture to align with the aperture of the o the protrusion of the extended portion when the accessory assembly is coupled with the coupler assembly. Wherein the base portion of the main assembly of the accessory assembly includes an exterior electric interface externally accessible when the accessory assembly is coupled with the coupler assembly. Wherein the interface assembly being couplable with the main assembly of the accessory assembly, wherein the interface assembly includes an end wall bounding in part an interior area, and wherein the interface assembly includes an electric plug extending from the end wall into the interior area. Wherein the interface assembly includes a base with a first side in part bounding the interior area and a second side, and wherein the second side of the interface assembly includes an electric contacts interface. Wherein the main assembly of the accessory assembly includes an electric contacts interface, and wherein the electric contacts interface of the interface assembly is sized and positioned to engage the electric contacts interface of the main assembly of the accessory assembly when the accessory assembly is coupled with the interface assembly.

In one or more aspects a system for a portable electronic computing device including (I) a case assembly including (A) a base including a first side and a second side, wherein the first side of the base in part bounds an interior area to couple with the portable electronic device; and (II) an accessory assembly configured to provide at least one portable electronic device service function, wherein the second side of the base in part bounds an exterior area to couple with the accessory assembly. Wherein the case assembly includes at least one elongated groove, and wherein the accessory assembly includes at least one elongated protrusion to slidably couple with the at least one elongated groove of the case assembly. Wherein the at least one portable electronic device service function includes electronic-based communication.

In one or more aspects a system for a portable electronic computing device including (I) a case assembly including (A) a base including a first surface and a second surface, (A) a first side wall extending perpendicular to the base, (B) a second side wall extending perpendicular to the base and extending perpendicular to the first side wall, (C) a third side wall extending perpendicular to the base and extending perpendicular to the first side wall, wherein the first side wall, the second side wall, the third side wall, and the first surface of the base at least partially bound an interior area; and (D) a coupler assembly including a portion of the second surface of the base; and (II) an accessory assembly configured to provide at least one portable electronic device service function, wherein the accessory assembly being sized and shaped to couple with the coupler assembly of the case assembly. Wherein the case assembly includes at least one elongated protrusion, and wherein the accessory assembly includes at least one elongated groove to slidably couple with the at least one elongated groove of the case assembly. Wherein the at least one portable electronic device service function includes storage of electrical power.

In addition to the foregoing, other aspects are described in the claims, drawings, and text forming a part of the disclosure set forth herein. Various other aspects are set forth and described in the teachings such as text (e.g., claims and/or detailed description) and/or drawings of the present disclosure. The foregoing is a summary and thus may contain simplifications, generalizations, inclusions, or omissions of detail; consequently, those skilled in the art will appreciate that the summary is illustrative only and is NOT intended to be in any way limiting. Other aspects, features, and advantages of the devices and/or processes and/or other subject matter described herein will become apparent in the teachings set forth herein.

BRIEF DESCRIPTION OF THE FIGURES

For a more complete understanding of implementations, reference now is made to the following descriptions taken in connection with the accompanying drawings. The use of the same symbols in different drawings typically indicates similar or identical items, unless context dictates otherwise.

With reference now to the figures, shown are one or more examples of Portable Electronic Device Case Accessory System, articles of manufacture, compositions of matter for same that may provide context, for instance, in introducing one or more processes and/or devices described herein.

FIG. 50 is a partial-exploded-side-elevational view of the case assembly of FIG. 24.

DETAILED DESCRIPTION

Figure 1:
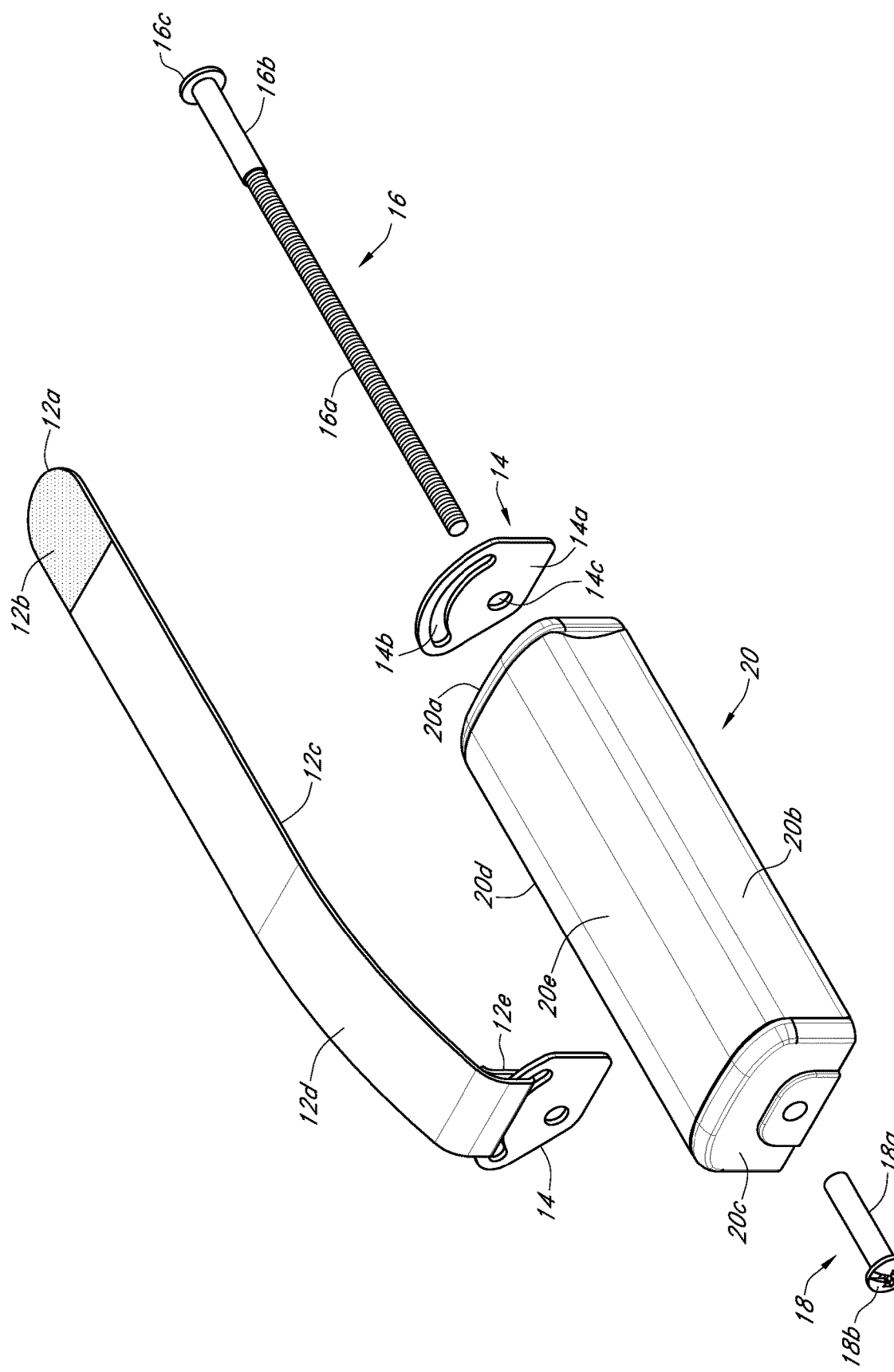
FIG. 1 is an exploded perspective view of a handle assembly.

In the following detailed description, reference is made to the accompanying drawings, which form a part hereof. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here.

Turning to FIG. 1, depicted therein is an exploded perspective view of handle assembly 10. Depicted implementation of handle assembly 10 is shown to include elongated strap assembly 12, bracket assembly 14, pin member 16, pin member 18, and bar member 20.

Depicted implementation of elongated strap assembly 12 is shown to include tip end portion 12a, first material portion 12b, second material portion 12c, edge portion 12d, and stitched end portion 12e. In implementations first material portion 12b and second material portion 12c are made from hook and loop material couplable with each other, respectively, or loop and hook material couplable with each other, respectively.

Depicted implementation of bracket assembly 14 is shown to include main portion 14a, curvilinear slot 14b, and aperture 14c. Depicted implementation of pin member 16 is shown to include rod portion 16a, collar portion 16b, and head portion 16c.

Depicted implementation of pin member 18 is shown to include rod portion 18a, and head portion 18b. In implementations pin member 16 is couplable with pin member 18. In implementations aperture 14c of bracket assembly 14 is shaped and sized to receive pin member 16 and pin member 18.

Depicted implementation of bar member 20 is shown to include end portion 20a, elongated side portion 20b, end portion 20c, elongated side portion 20d, and elongated top portion 20e. In implementations end portion 20a and end portion 20c can be positioned at least two inches from one another. In implementations elongated side portion 20b and elongated side portion 20d can be positioned at least one inch from one another.

Figure 2:
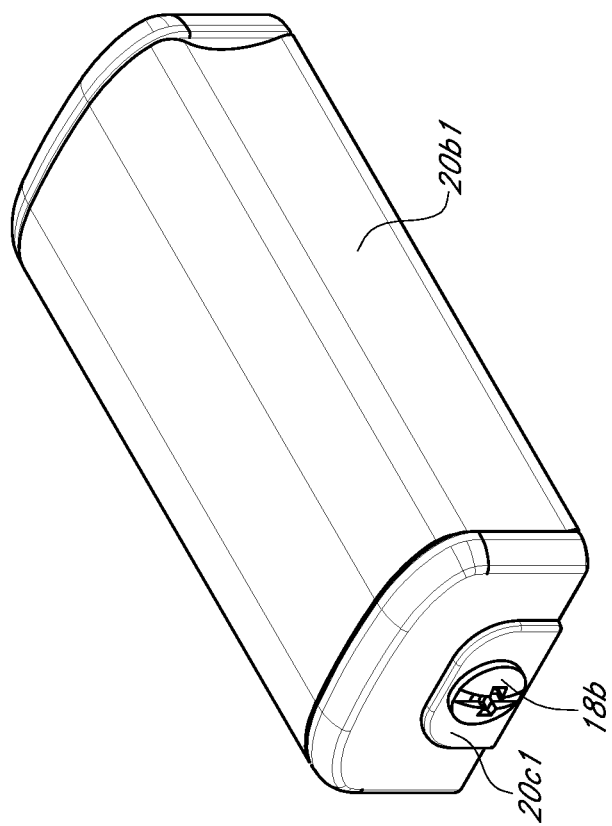
FIG. 2 is a top-perspective view of a handle member of the handle assembly of FIG. 1.

Turning to FIG. 2, depicted therein is a top-perspective view of bar member 20 of handle assembly 10. Depicted implementation of bar member 20 is shown to include elongated groove portion 20b1, and raised portion 20c1.

Figure 3:
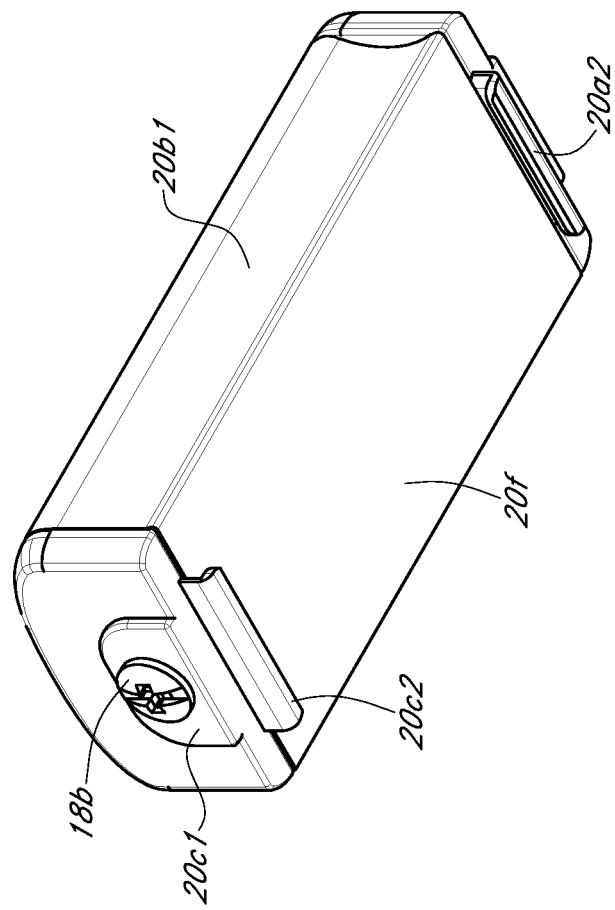
FIG. 3 is a bottom-perspective view of the handle member of FIG. 2.

Turning to FIG. 3, depicted therein is a bottom-perspective view of bar member 20. Depicted implementation of bar member 20 is shown to include clip portion 20a2, clip portion 20c2, and elongated bottom portion 20f. As shown, elongated side portion 20b, and elongated side portion 20d extend between elongated top portion 20e and elongated bottom portion 20f. As shown, clip portion 20a2 and clip portion 20c2 extend away from elongated bottom portion 20f.

Figure 4:
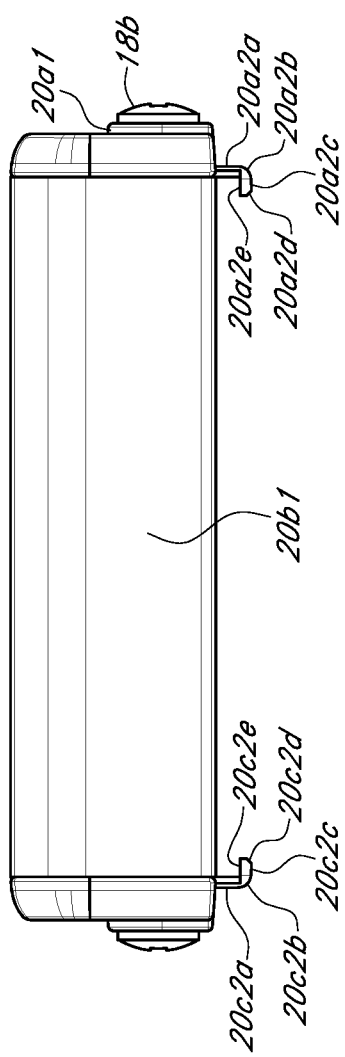
FIG. 4 is a side-elevational view of the handle member of FIG. 2.

Turning to FIG. 4, depicted therein is a side-elevational view of bar member 20. Depicted implementation of bar member 20 is shown to include raised portion 20a1, and clip portion 20a2 includes leg portion 20a2a, corner 20a2b, lower surface 20a2c, and tapered portion 20a2d, and inner portion 20a2e that are shown to be in an L-shape. Depicted implementation of clip portion 20c2 of bar member 20 is shown to include leg portion 20c2a, corner 20c2b, lower surface 20c2c, tapered portion 20c2d, and inner portion 20c2e.

Figure 5:
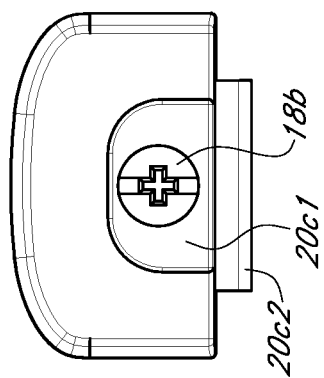
FIG. 5 is an end-elevational view of the handle member of FIG. 2.

Turning to FIG. 5, depicted therein is an end-elevational view of bar member 20.

Figure 6:
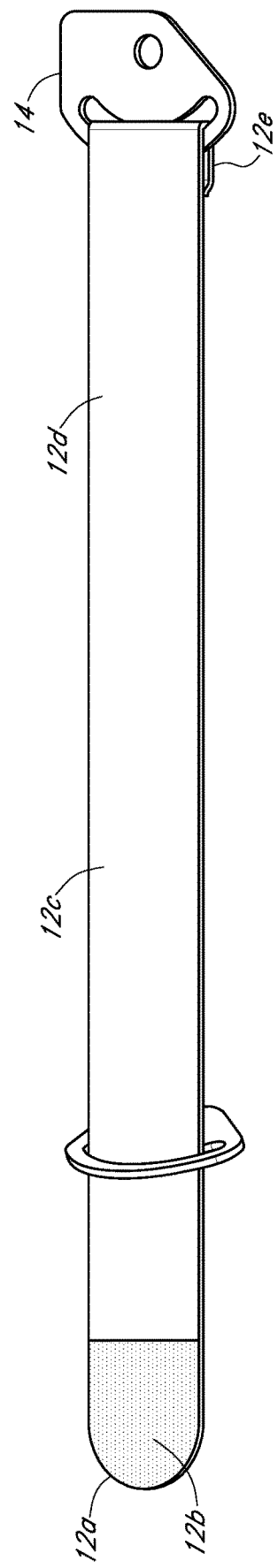
FIG. 6 is a perspective view of a portion of the strap assembly being coupled with a bracket assembly of the handle assembly of FIG. 1.

Turning to FIG. 6, depicted therein is a perspective view of a portion of elongated strap assembly 12 coupled with bracket assembly 14.

Figure 7:
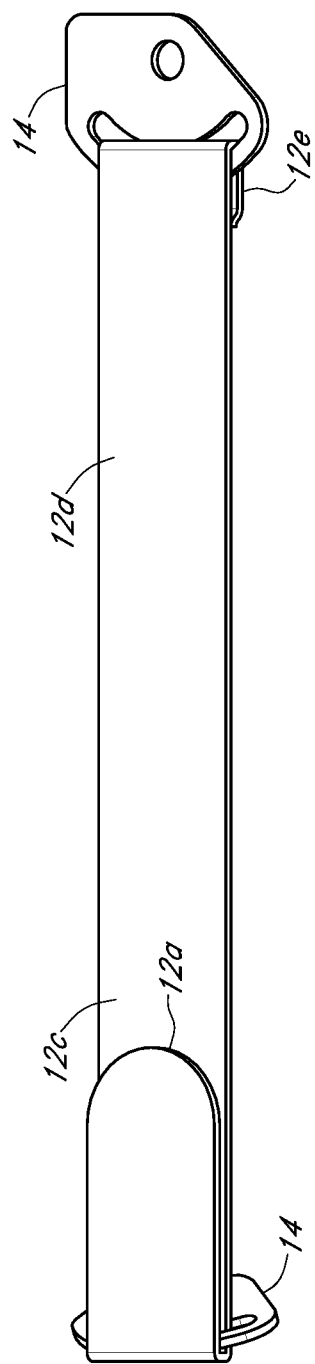
FIG. 7 is a plan view of a portion of the strap assembly of FIG. 6 coupled with the bracket assembly of FIG. 6.

Turning to FIG. 7, depicted therein is a plan view of a portion of elongated strap assembly 12 coupled with bracket assembly 14.

Figure 8:
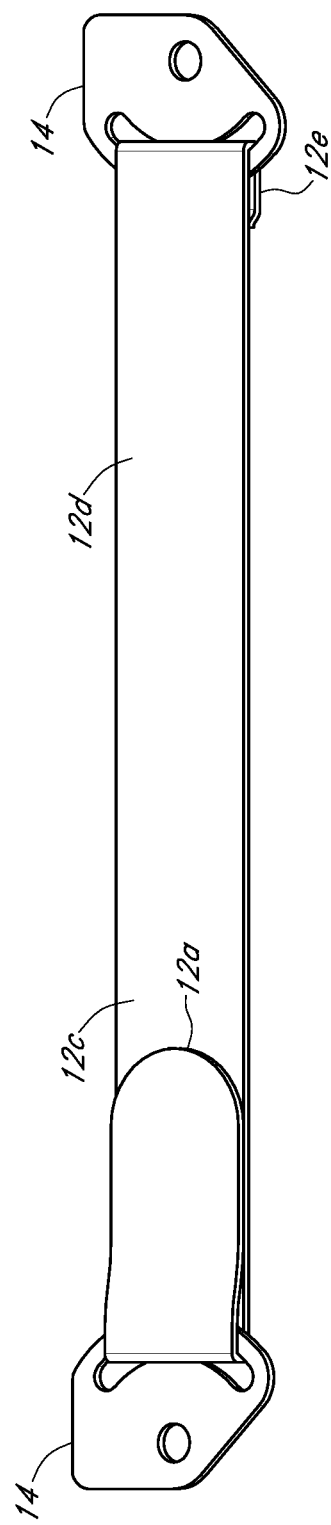
FIG. 8 is a plan view of the strap assembly coupled with the bracket assembly of FIG. 6.

Turning to FIG. 8, depicted therein is a plan view of elongated strap assembly 12 coupled with bracket assembly 14.

Figure 9:
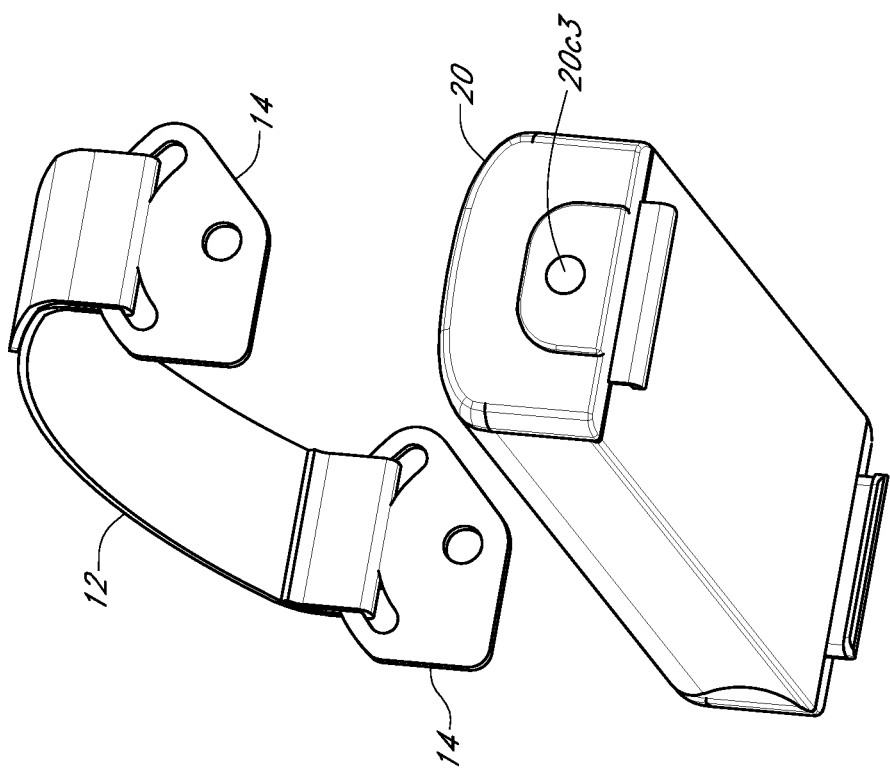
FIG. 9 is a perspective view of portions of the handle member of FIG. 2 and the strap assembly coupled with the bracket assembly of FIG. 6.

Turning to FIG. 9, depicted therein is a perspective view of portions of bar member 20 and elongated strap assembly 12 coupled with bracket assembly 14. Depicted implementation of bar member 20 is shown to include aperture 20c3.

Figure 10:
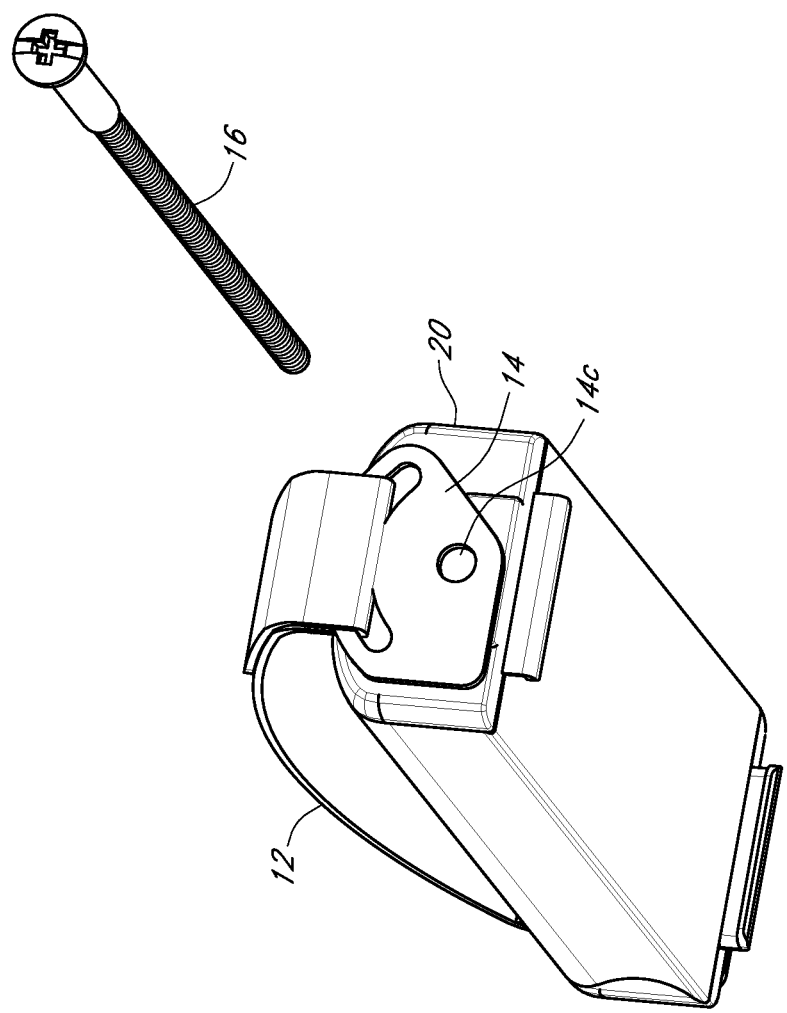
FIG. 10 is a perspective view of portions of the handle member of FIG. 2, the strap assembly coupled with the bracket assembly of FIG. 6, and a pin member of FIG. 1.

Turning to FIG. 10, depicted therein is a perspective view of portions of bar member 20, elongated strap assembly 12 coupled with bracket assembly 14, and pin member 16.

Figure 11:
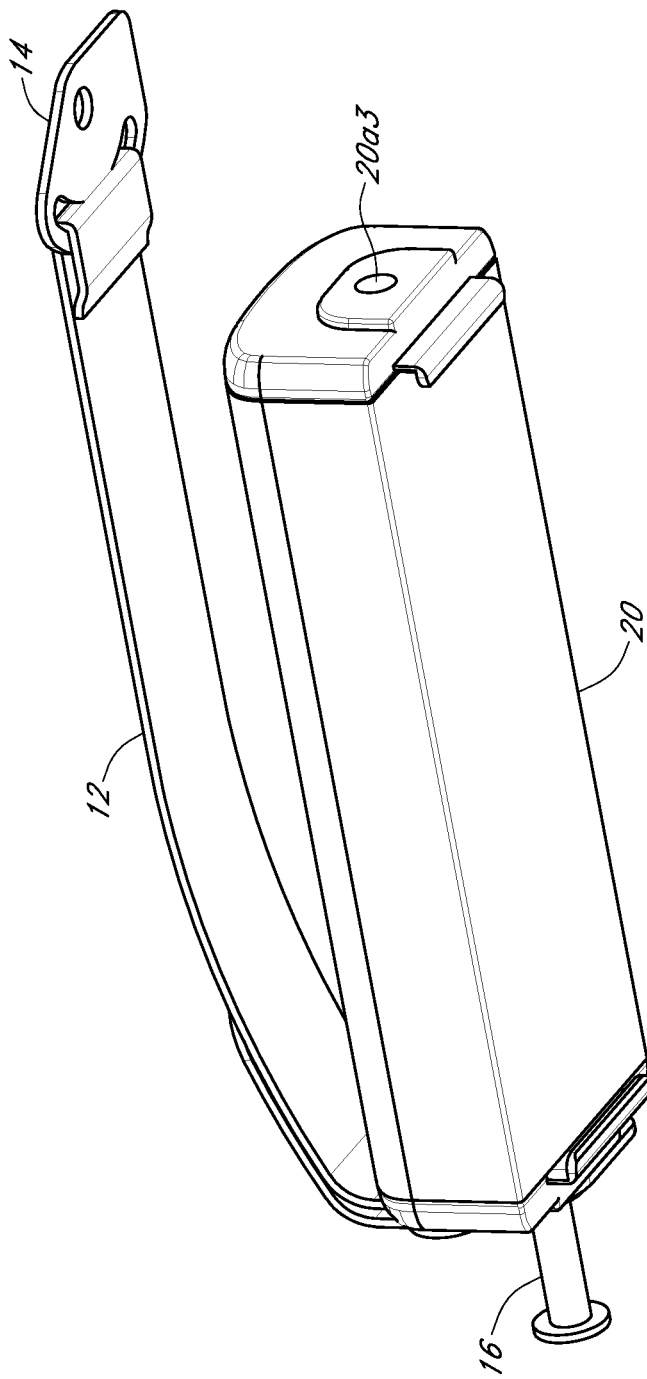
FIG. 11 is a perspective view of portions of the handle member of FIG. 2, the strap assembly coupled with the bracket assembly of FIG. 6, and the pin member of FIG. 1.

Turning to FIG. 11, depicted therein is a perspective view of portions of bar member 20, elongated strap assembly 12 coupled with bracket assembly 14, and pin member 16. Depicted implementation of bar member 20 is shown to include aperture 20a3.

Figure 12:
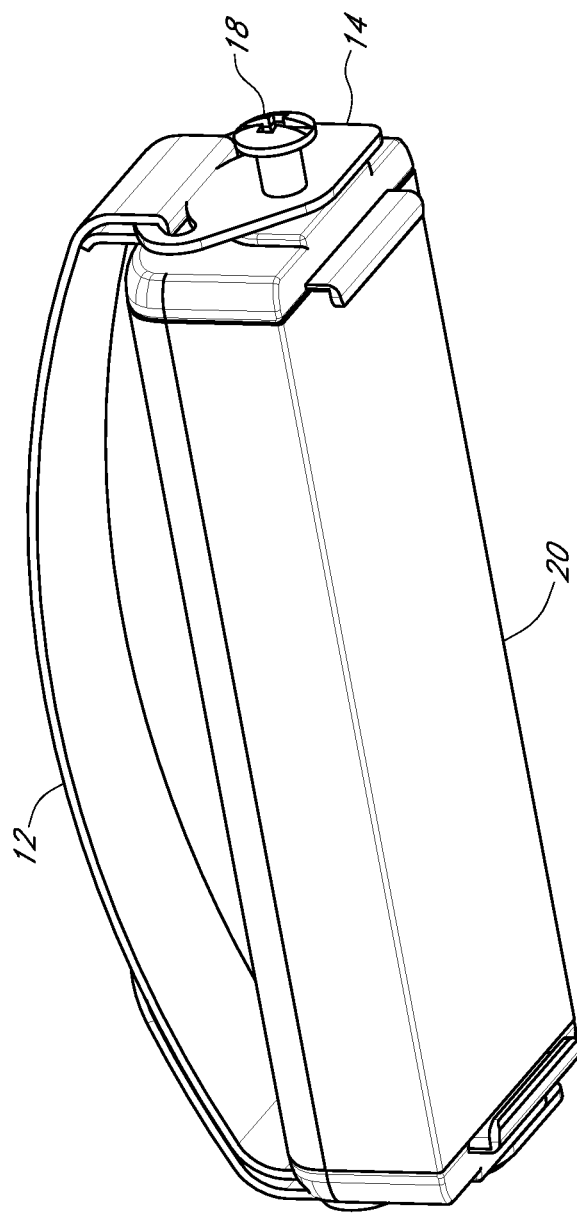
FIG. 12 is a side-perspective view of portions of the handle member of FIG. 2, the strap assembly coupled with the bracket assembly of FIG. 6, and the pin member of FIG. 1.

Turning to FIG. 12, depicted therein is a side-perspective view of portions of bar member 20, elongated strap assembly 12 coupled with bracket assembly 14, and pin member 16.

Figure 13:
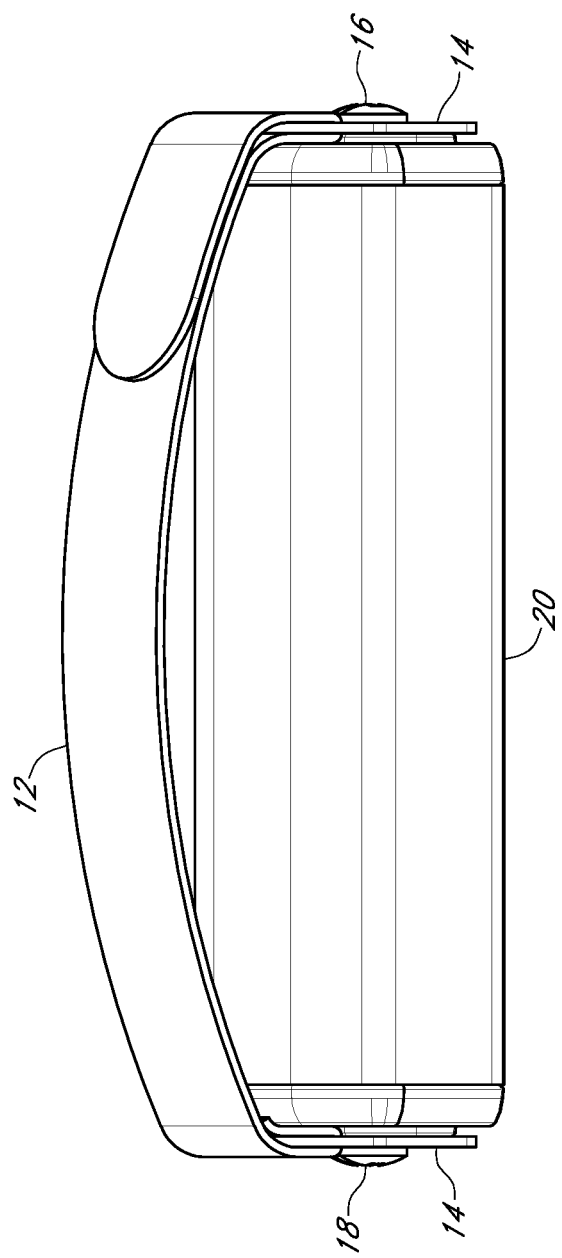
FIG. 13 is a top-perspective view of portions of the handle member of FIG. 2, the strap assembly coupled with the bracket assembly of FIG. 6, and the pin member of FIG. 1.

Turning to FIG. 13, depicted therein is a top-perspective view of portions of bar member 20, elongated strap assembly 12 coupled with bracket assembly 14, and pin member 16.

Figure 14:
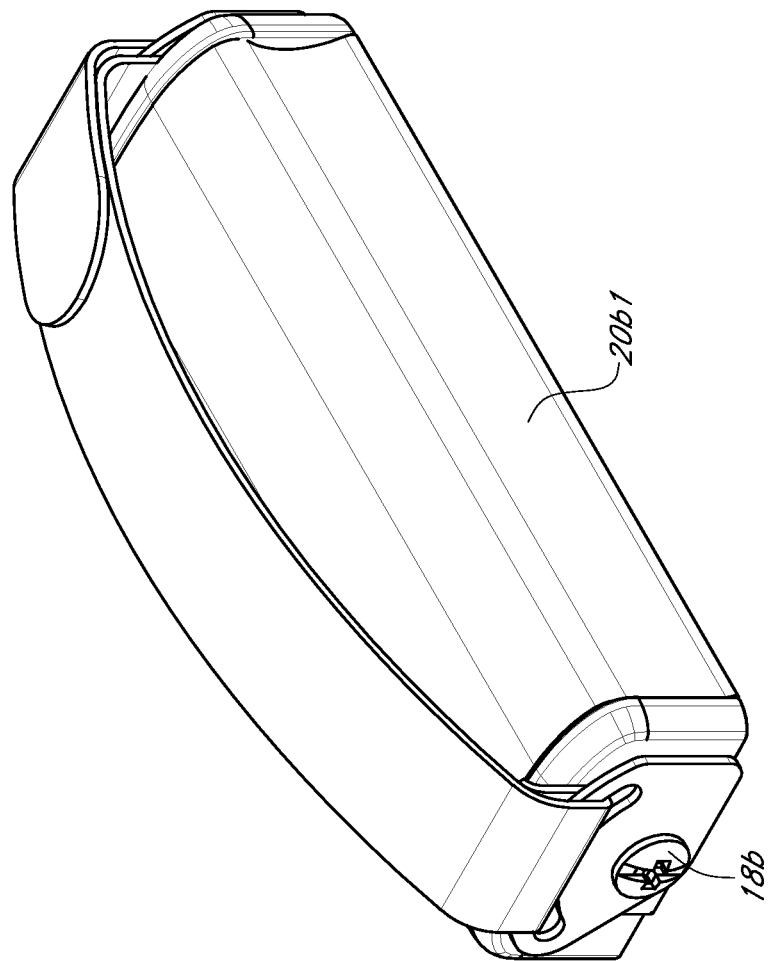
FIG. 14 is a top-perspective view of the handle assembly of FIG. 1.

Turning to FIG. 14, depicted therein is a top-perspective view of handle assembly 10.

Figure 15:
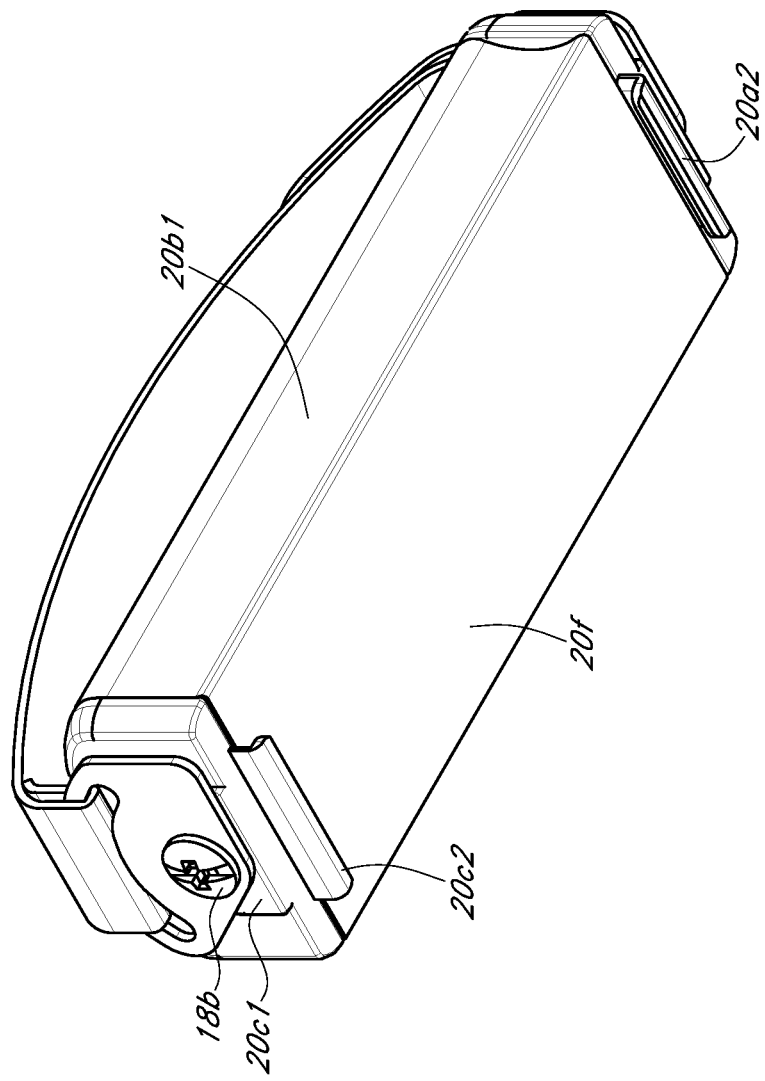
FIG. 15 is a bottom-perspective view of the handle assembly of FIG. 1.

Turning to FIG. 15, depicted therein is a bottom-perspective view of handle assembly 10.

Figure 16:
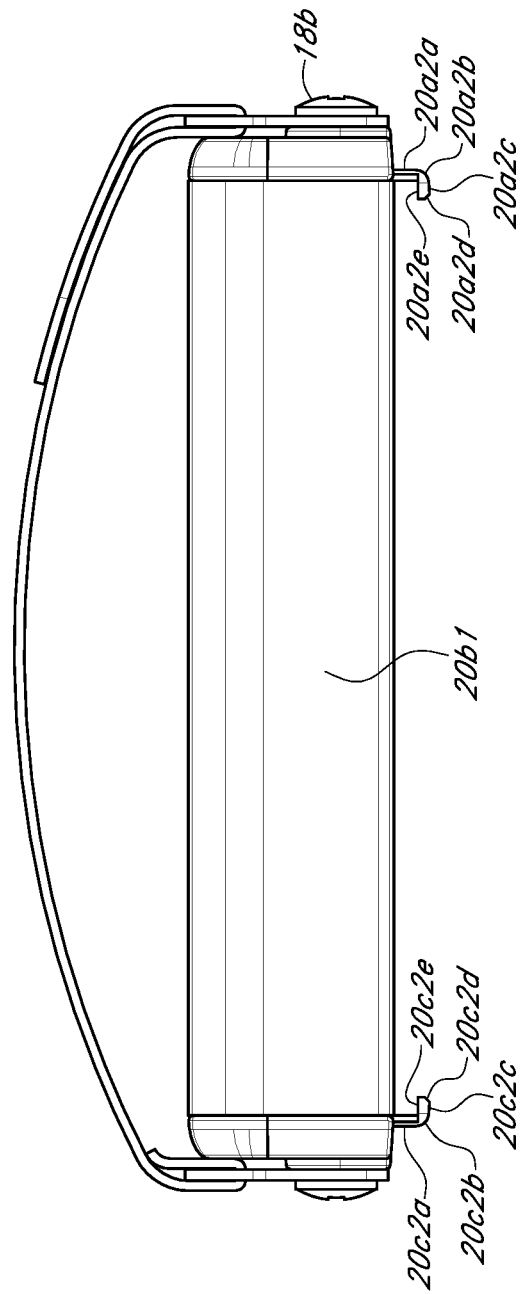
FIG. 16 is a side-elevational view of the handle assembly of FIG. 1.

Turning to FIG. 16, depicted therein is a side-elevational view of handle assembly 10.

Figure 17:
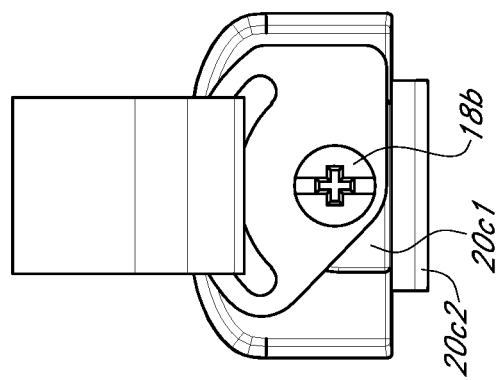
FIG. 17 is a end-elevational view of the handle assembly of FIG. 1.

Turning to FIG. 17, depicted therein is a end-elevational view of handle assembly 10.

Figure 18:
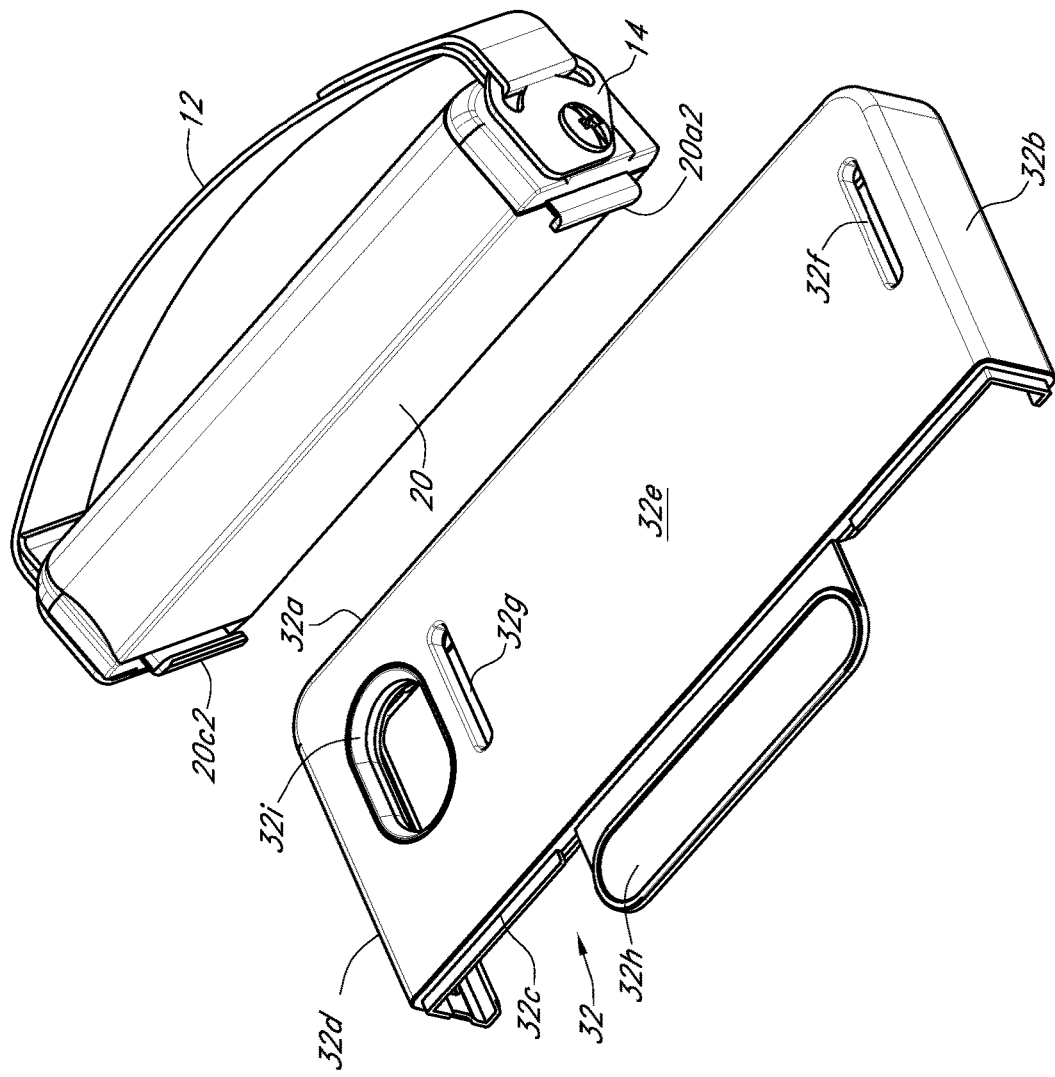
FIG. 18 is a perspective view of a cap assembly and the handle assembly of FIG. 1.

Turning to FIG. 18, depicted therein is a perspective view of cap assembly 32 and handle assembly 10. Depicted implementation of cap assembly 32 is shown to include side wall 32a, side wall 32b, side edge 32c, side wall 32d, base 32e, elongated aperture 32f (shaped, sized, and positioned to couple with clip portion 20c2), elongated aperture 32g (shaped, sized, and positioned to couple with clip portion 20a2), tab member 32h, and lens portion 32i. As depicted, tab member 32h extends away from side edge 32c and extends away from side wall 32a as well.

Figure 19:
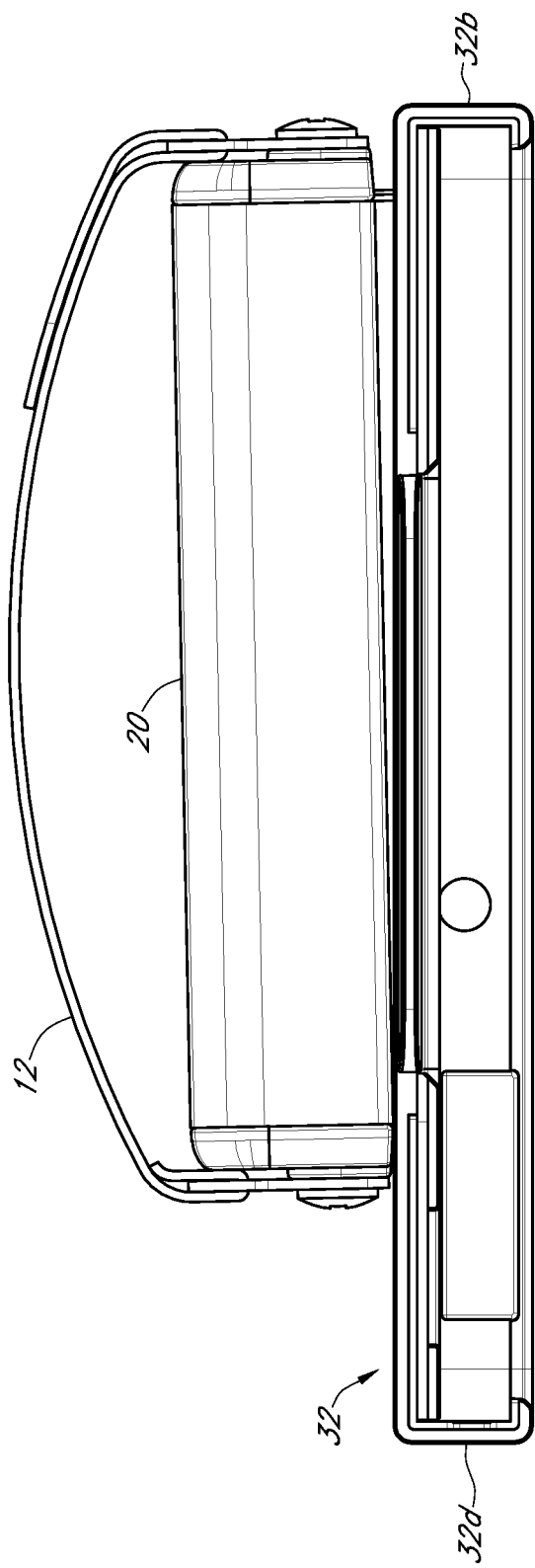
FIG. 19 is a perspective view of the cap assembly of FIG. 18 and the handle assembly of FIG. 1.

Turning to FIG. 19, depicted therein is a perspective view of cap assembly 32 and the handle assembly of FIG. 1.

Figure 20:
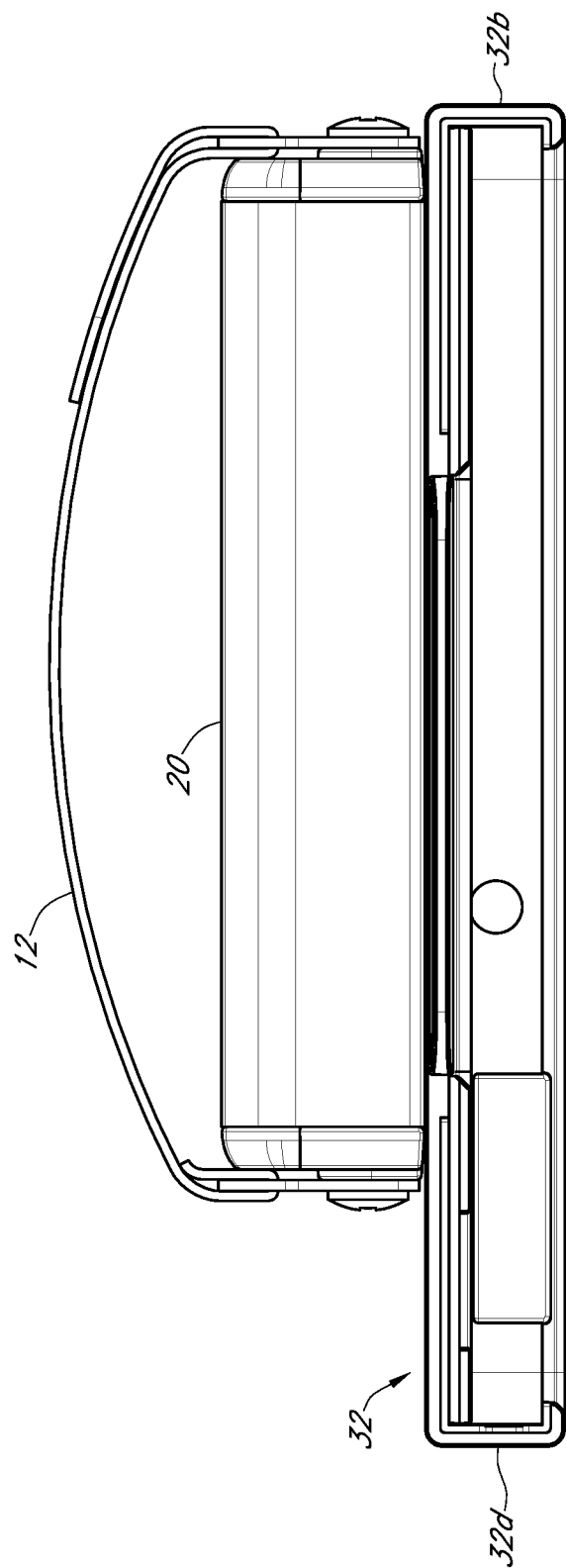
FIG. 20 is a perspective view of the cap assembly of FIG. 18 and the handle assembly of FIG. 1 coupled together.

Turning to FIG. 20, depicted therein is a perspective view of bar member 20 and the handle assembly 10 coupled together. In implementations, wherein elongated top portion 20 is positioned at least one half inch from the cap assembly 32 when bar member 20 is coupled with the device case assembly.

Figure 21:
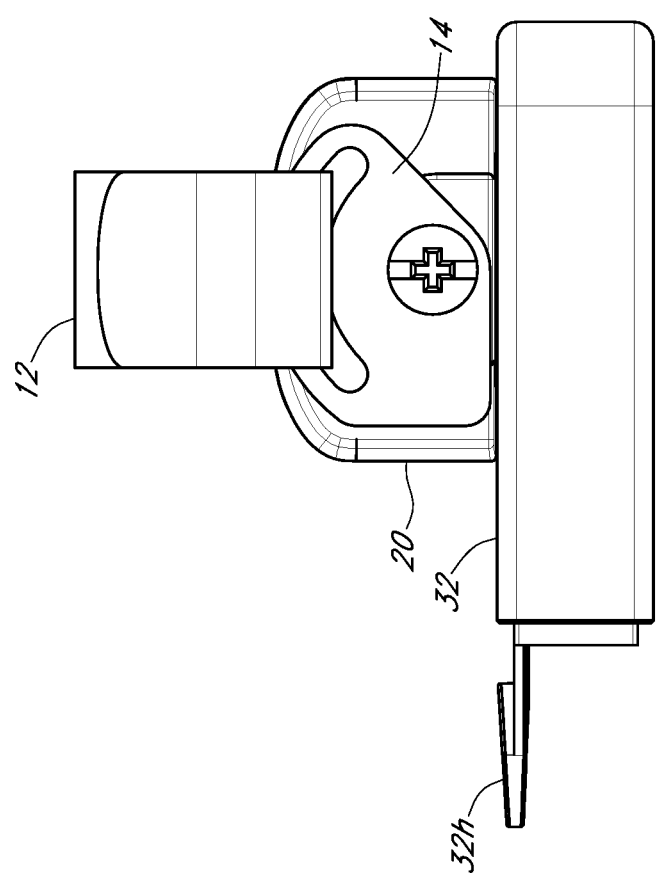
FIG. 21 is an end view of the cap assembly of FIG. 18 and the handle assembly of FIG. 1 coupled together.

Turning to FIG. 21, depicted therein is an end view of cap assembly 32 and handle assembly 10.

Figure 22:
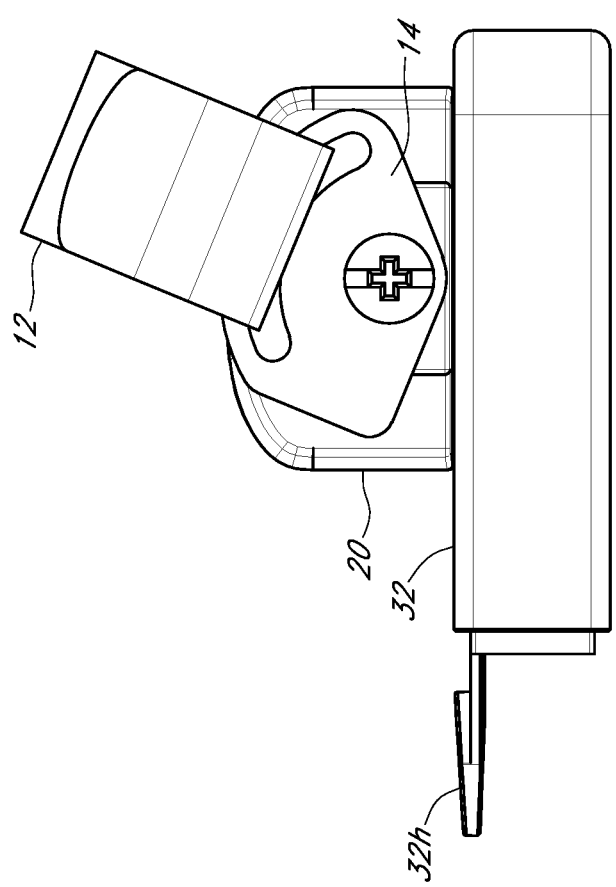
FIG. 22 is an end view of the cap assembly of FIG. 18 and the handle assembly of FIG. 1 coupled together.

Turning to FIG. 22, depicted therein is an end view of cap assembly 32 and handle assembly 10 coupled together.

Figure 23:
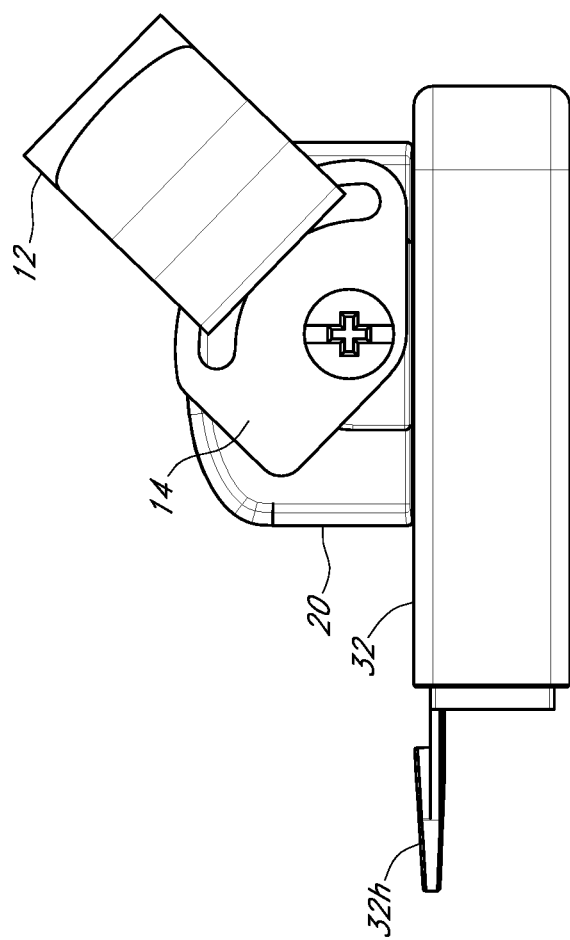
FIG. 23 is an end view of the cap assembly of FIG. 18 and the handle assembly of FIG. 1 coupled together.

Turning to FIG. 23, depicted therein is an end view of cap assembly 32 and handle assembly 10 coupled together.

Figure 24:
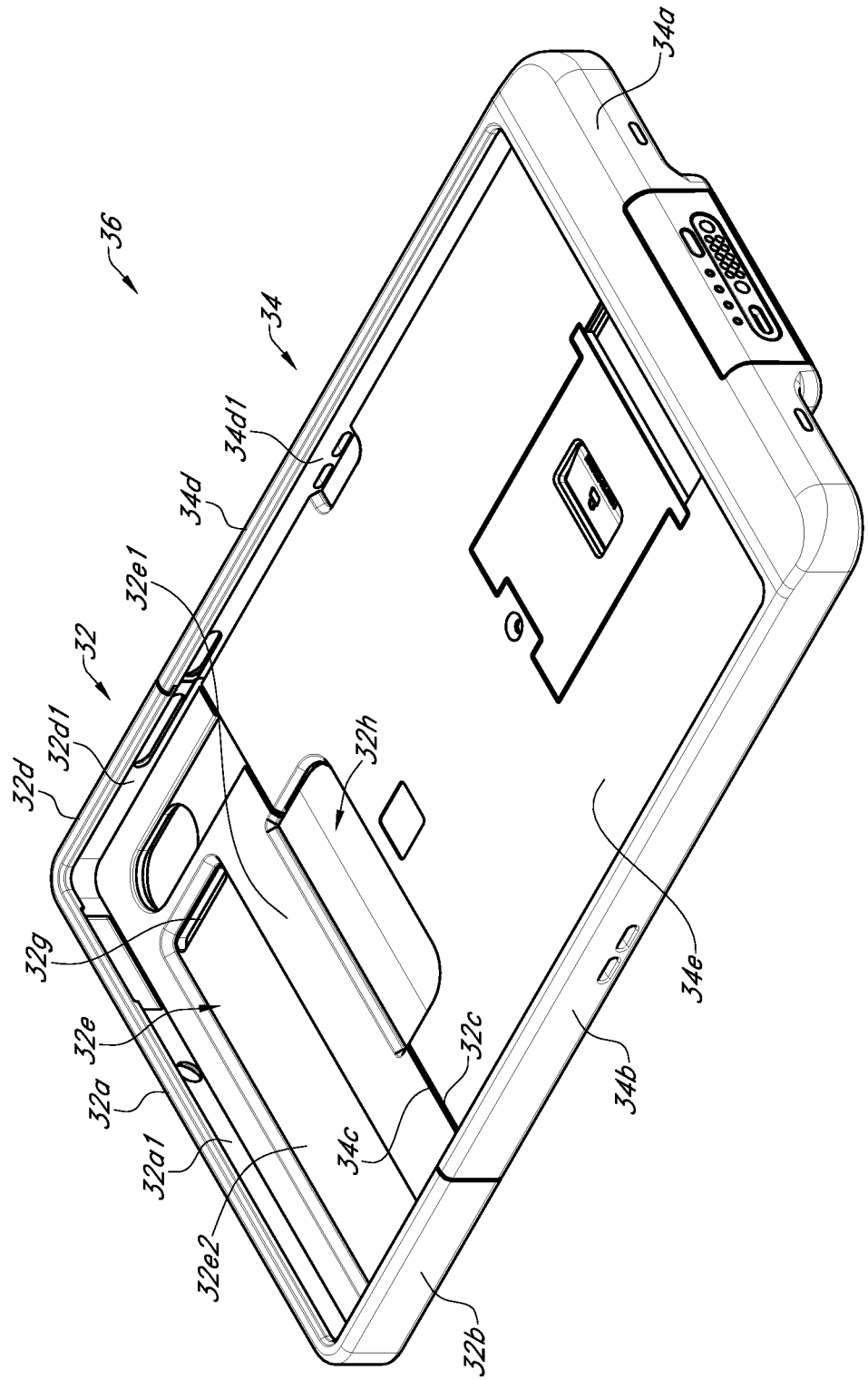
FIG. 24 is a rear-top-perspective view of the cap assembly of FIG. 18 and a main assembly coupled together to form a case assembly.

Turning to FIG. 24, depicted therein is a rear top perspective view of cap assembly 32 and main assembly 34 coupled together to form device case assembly 30.

Depicted implementation of cap assembly 32 is shown to include elongated groove 32d1, raised portion 32e1, and recessed portion 32e2. As depicted, side wall 32b and side wall 32d extend perpendicular with respect to side wall 32a. As depicted, side edge 32c extends parallel with respect to side wall 32a. As depicted, side edge 32c is spaced from side wall 32a along side wall 32b and side wall 32d.

Depicted implementation of main assembly 34 is shown to include side wall 34a, side wall 34b, side edge 34c, side wall 34d, groove 34d1, and base 34e. As depicted, side wall 34b and side wall 34d extend perpendicular with respect to side wall 34a. As depicted, side edge 34c extends parallel with respect to side wall 34a. As depicted, when cap assembly 32, and cap assembly 32, are coupled together, side wall 32a, side wall 32b, side wall 32d, and base 32e of cap assembly 32, and side wall 34a, side wall 34b, side wall 32d, and base 34e of main assembly 34 form an interior area to couple with portable electronic device 100 (shown in FIG. 30).

Figure 25:
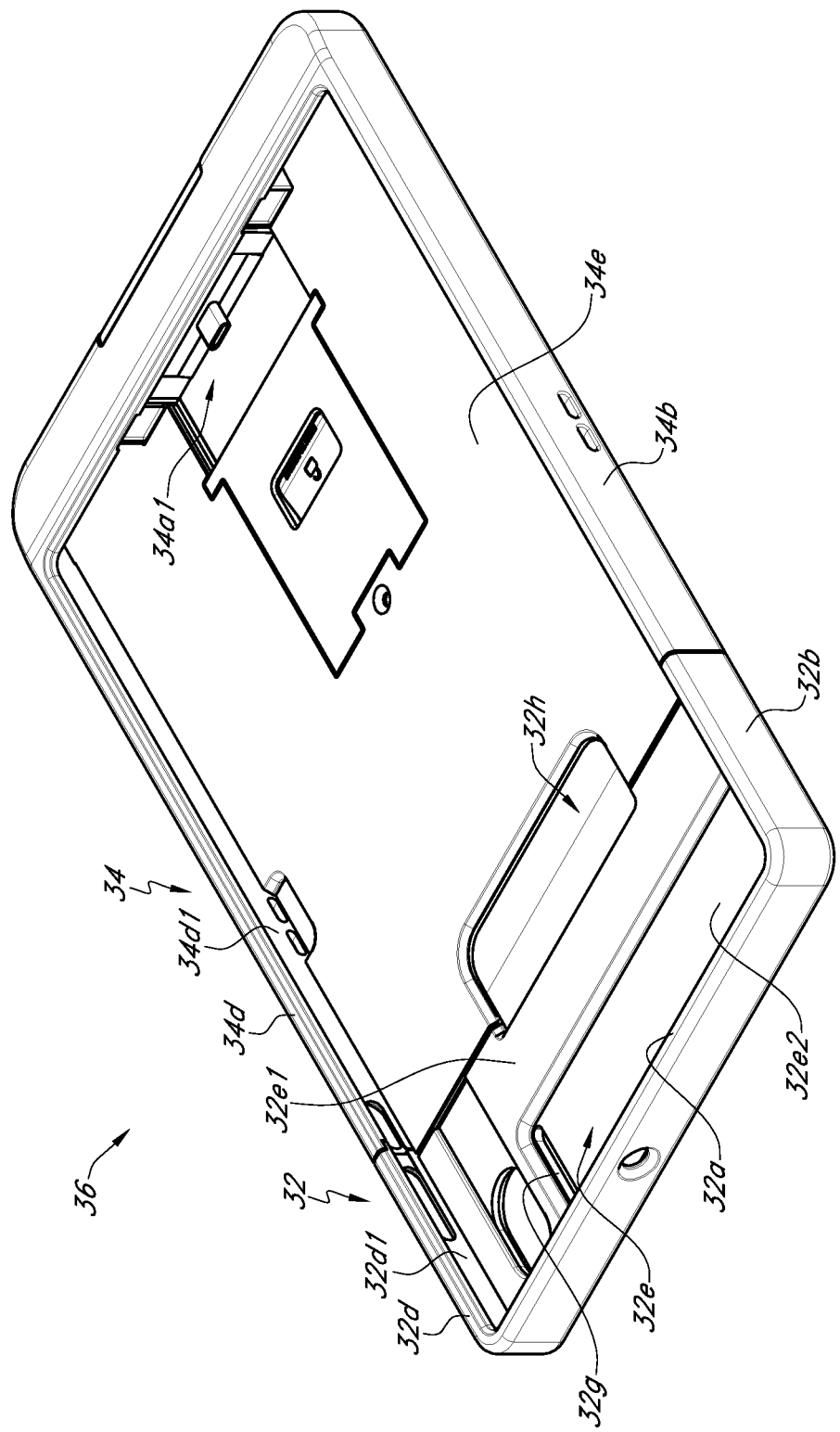
FIG. 25 is a front-top-perspective view of the case assembly of FIG. 24.

Turning to FIG. 25, depicted therein is a front-top-perspective view of device case assembly 30. Depicted implementation of main assembly 34 is shown to include portable electric interface 34a1.

Figure 26:
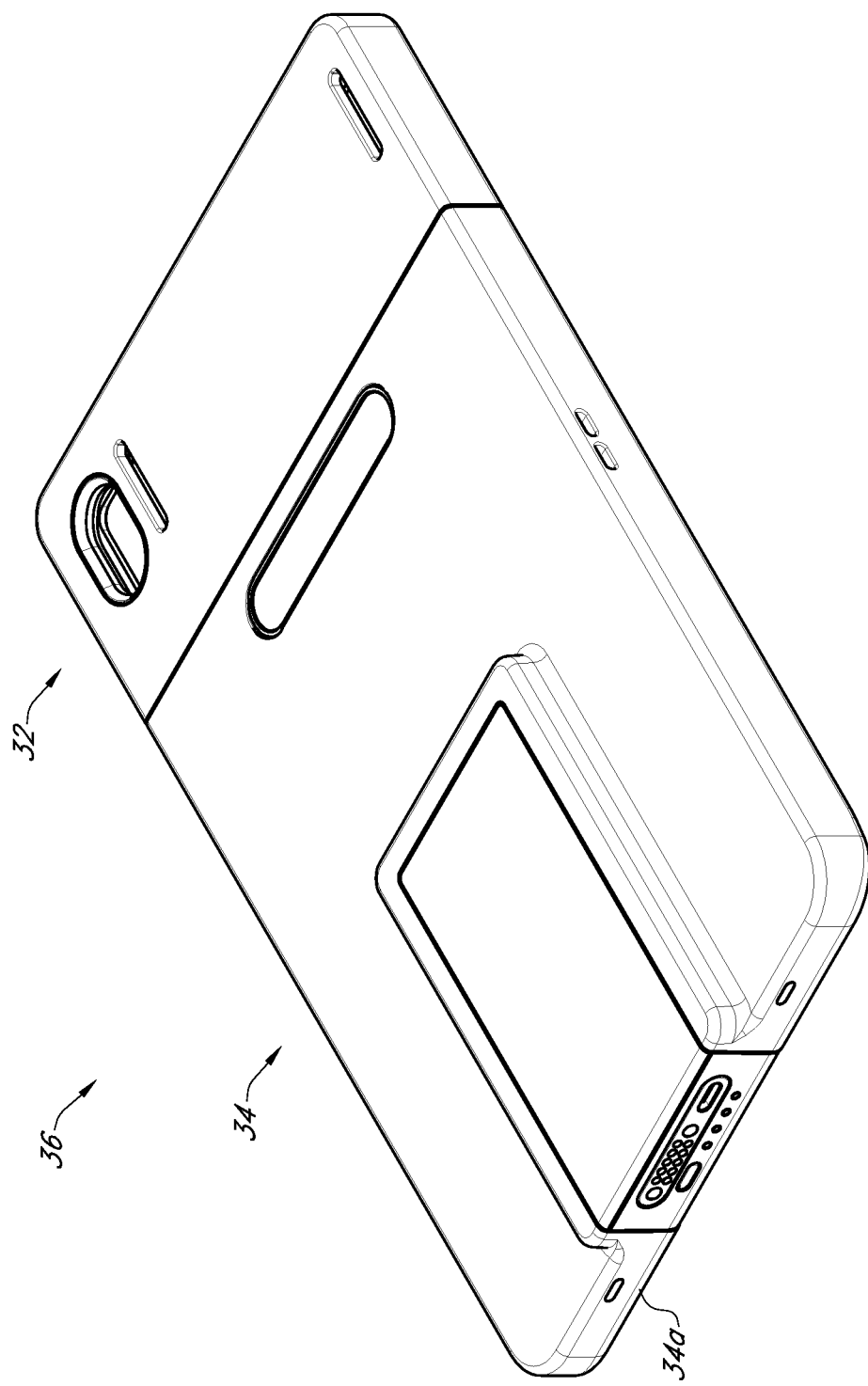
FIG. 26 is a rear-bottom-perspective view of the case assembly of FIG. 24.

Turning to FIG. 26, depicted therein is a rear-bottom-perspective view of device case assembly 30.

Figure 27:
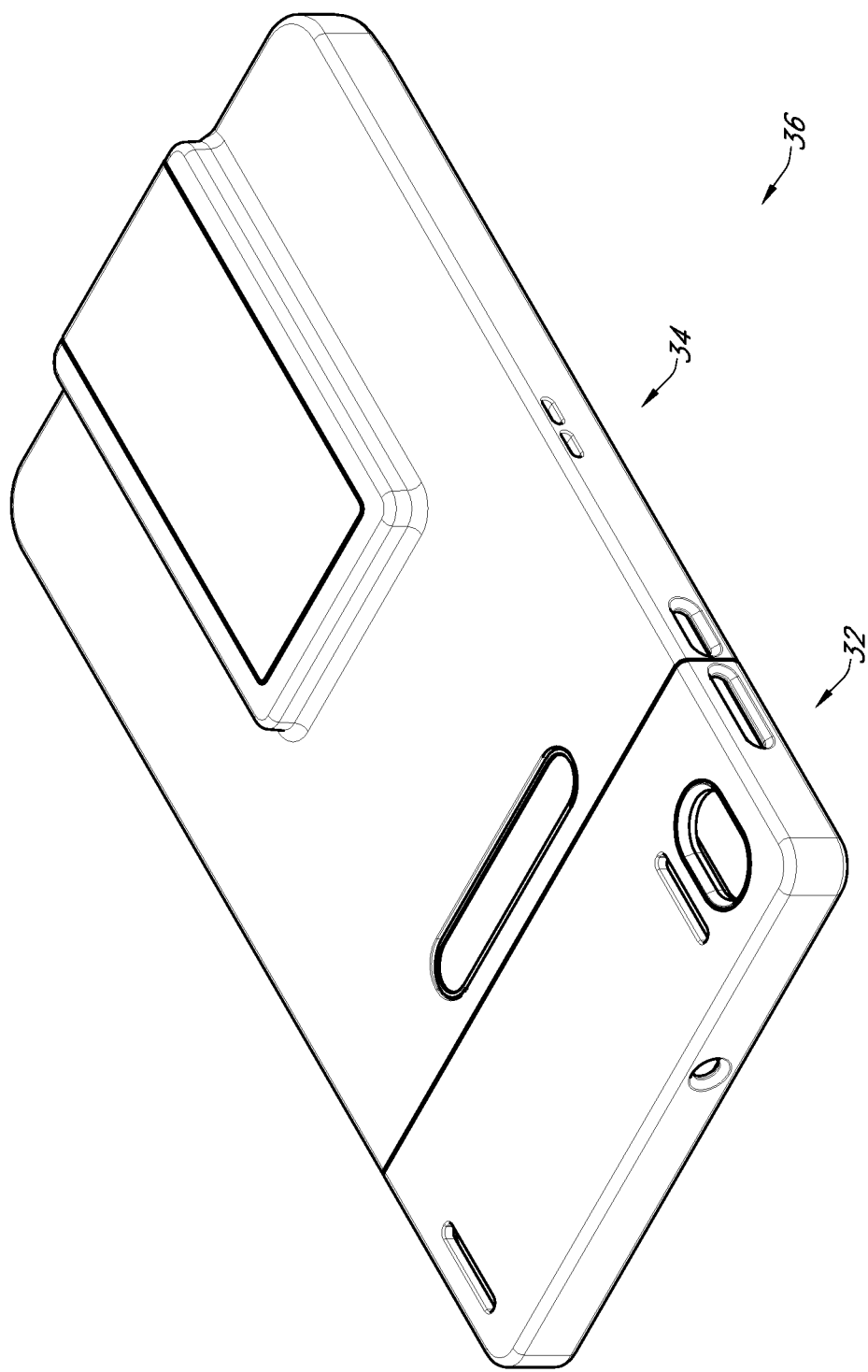
FIG. 27 is a front-bottom-perspective view of the case assembly of FIG. 24.

Turning to FIG. 27, depicted therein is a front-bottom-perspective view of device case assembly 30.

Figure 28:
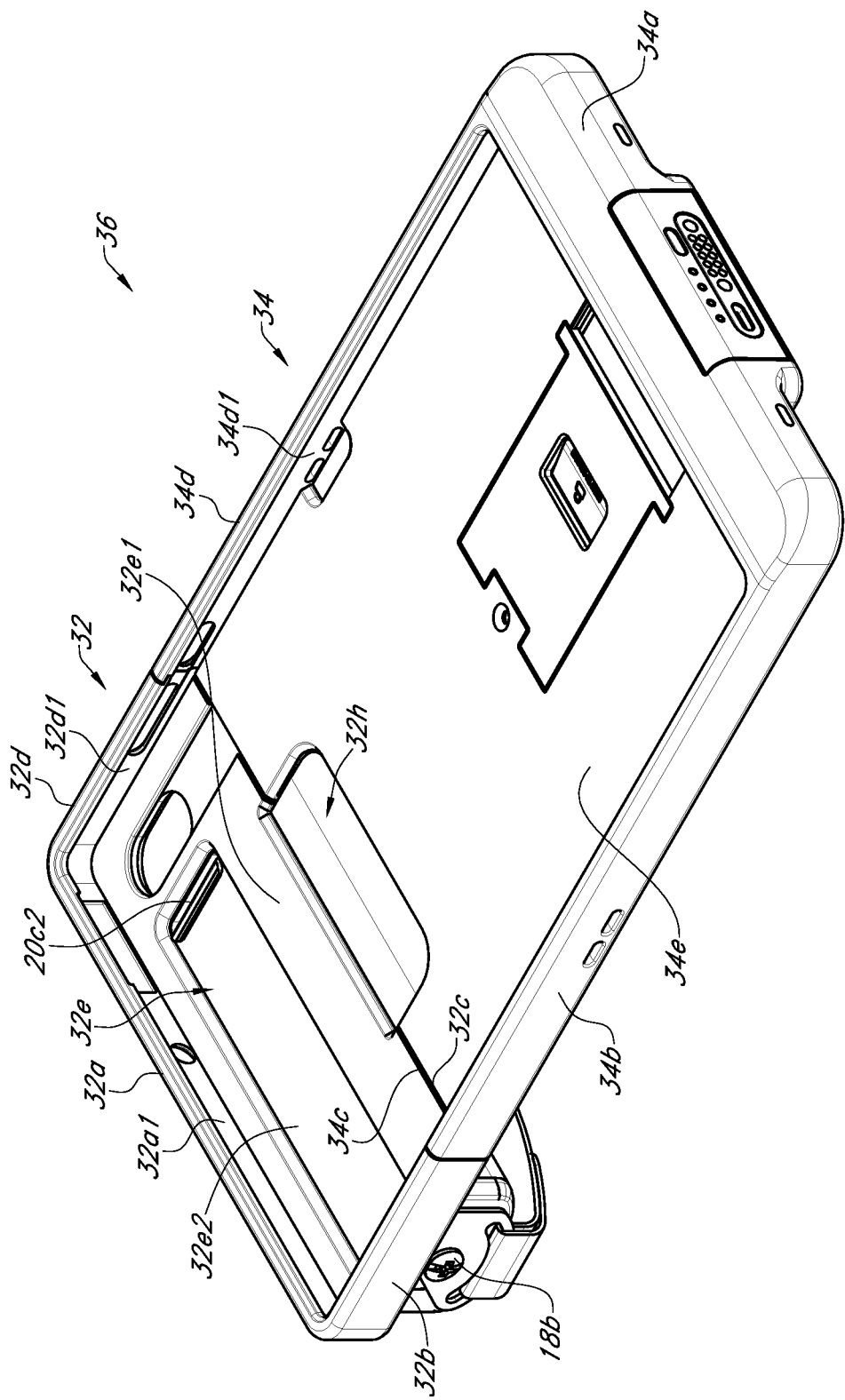
FIG. 28 is a rear-top-perspective view of the case assembly of FIG. 24 coupled with the handle assembly of FIG. 1.

Turning to FIG. 28, depicted therein is a rear-top-perspective view of device case assembly 30 coupled with handle assembly 10.

Figure 29:
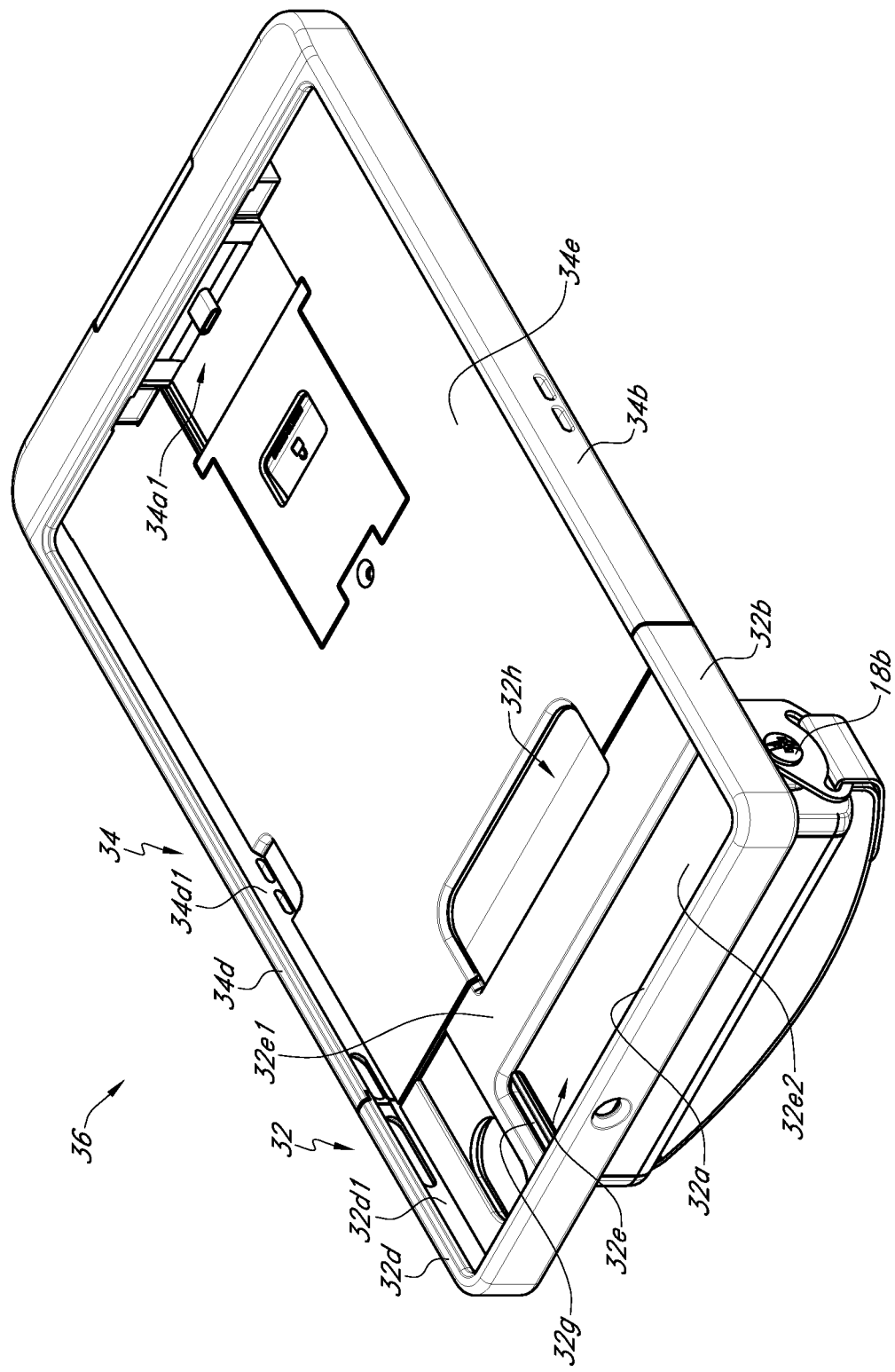
FIG. 29 is a front-top-perspective view of the case assembly of FIG. 24 coupled with the handle assembly of FIG. 1.

Turning to FIG. 29, depicted therein is a front-top-perspective view of device case assembly 30 coupled with device case assembly 30.

Figure 30:
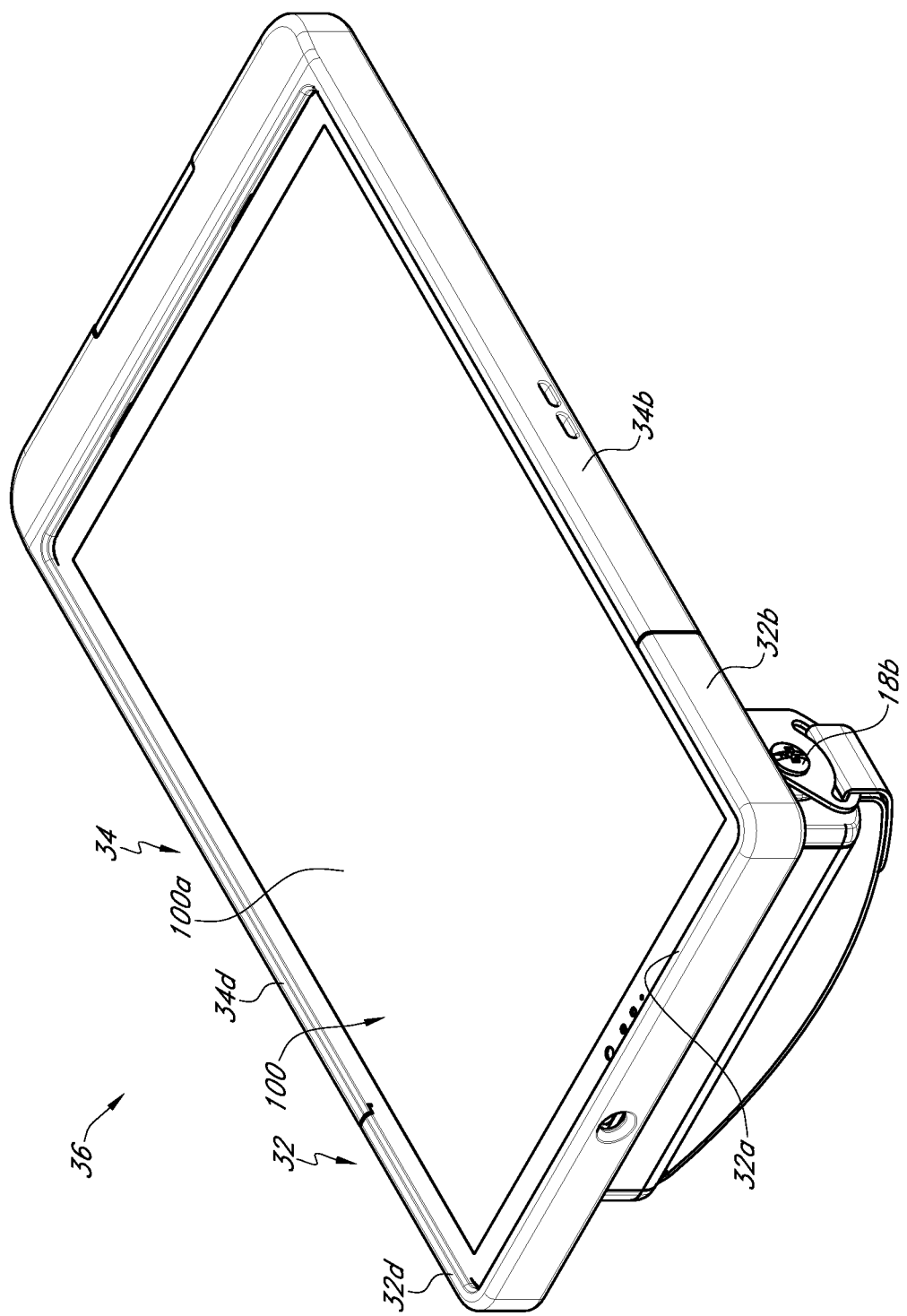
FIG. 30 is a front-top-perspective view of the case assembly of FIG. 24 coupled with the handle assembly of FIG. 1 and coupled with an electronic device.

Turning to FIG. 30, depicted therein is a front-top-perspective view of device case assembly 30 coupled with handle assembly 10 and coupled with portable electronic device 100. Depicted implementation of portable electronic device 100 is shown to include display 100a.

Figure 31:
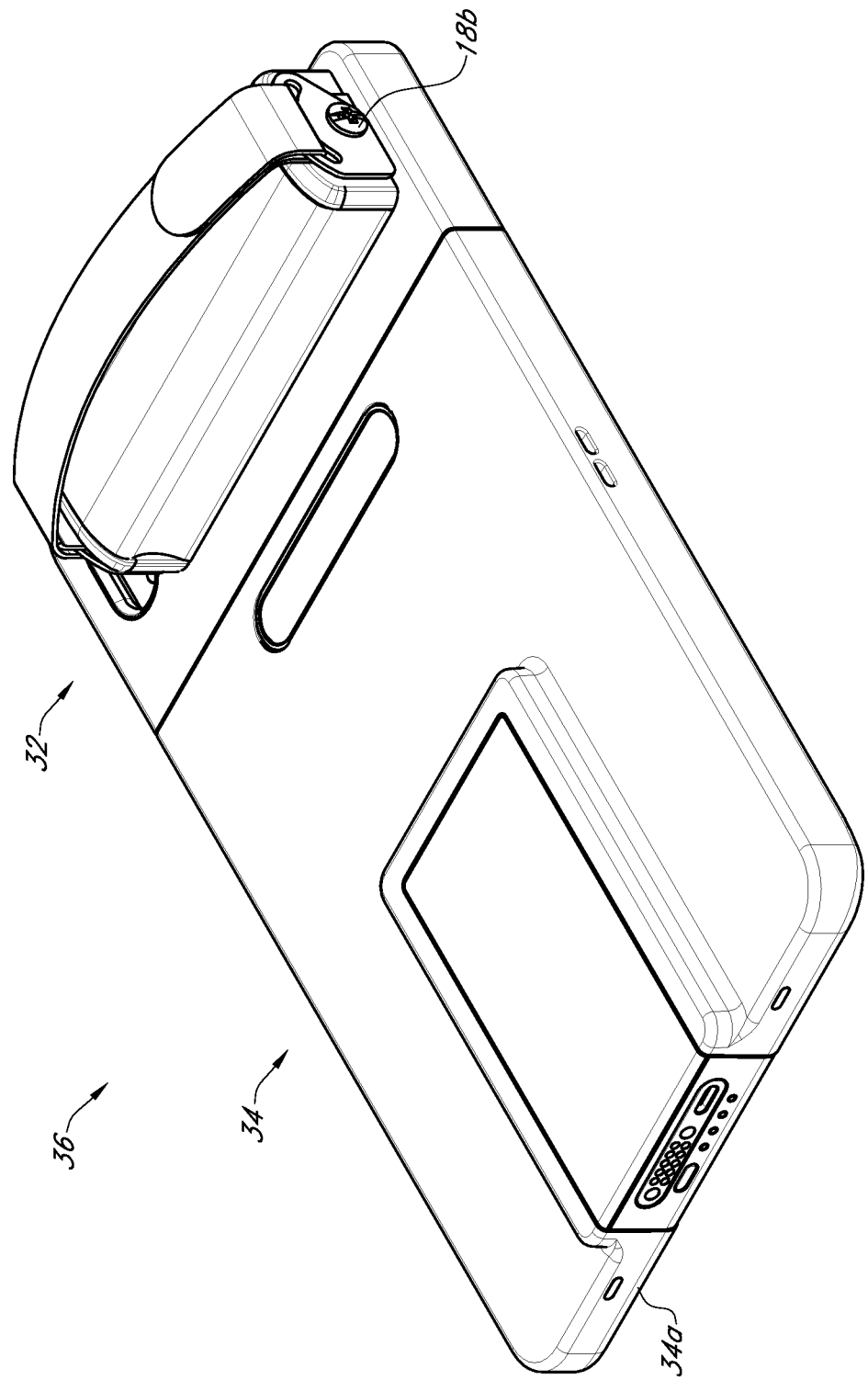
FIG. 31 is a rear-bottom-perspective view of the case assembly of FIG. 24 coupled with the handle assembly of FIG. 1.

Turning to FIG. 31, depicted therein is a rear-bottom-perspective view of device case assembly 30 with handle assembly 10.

Figure 32:
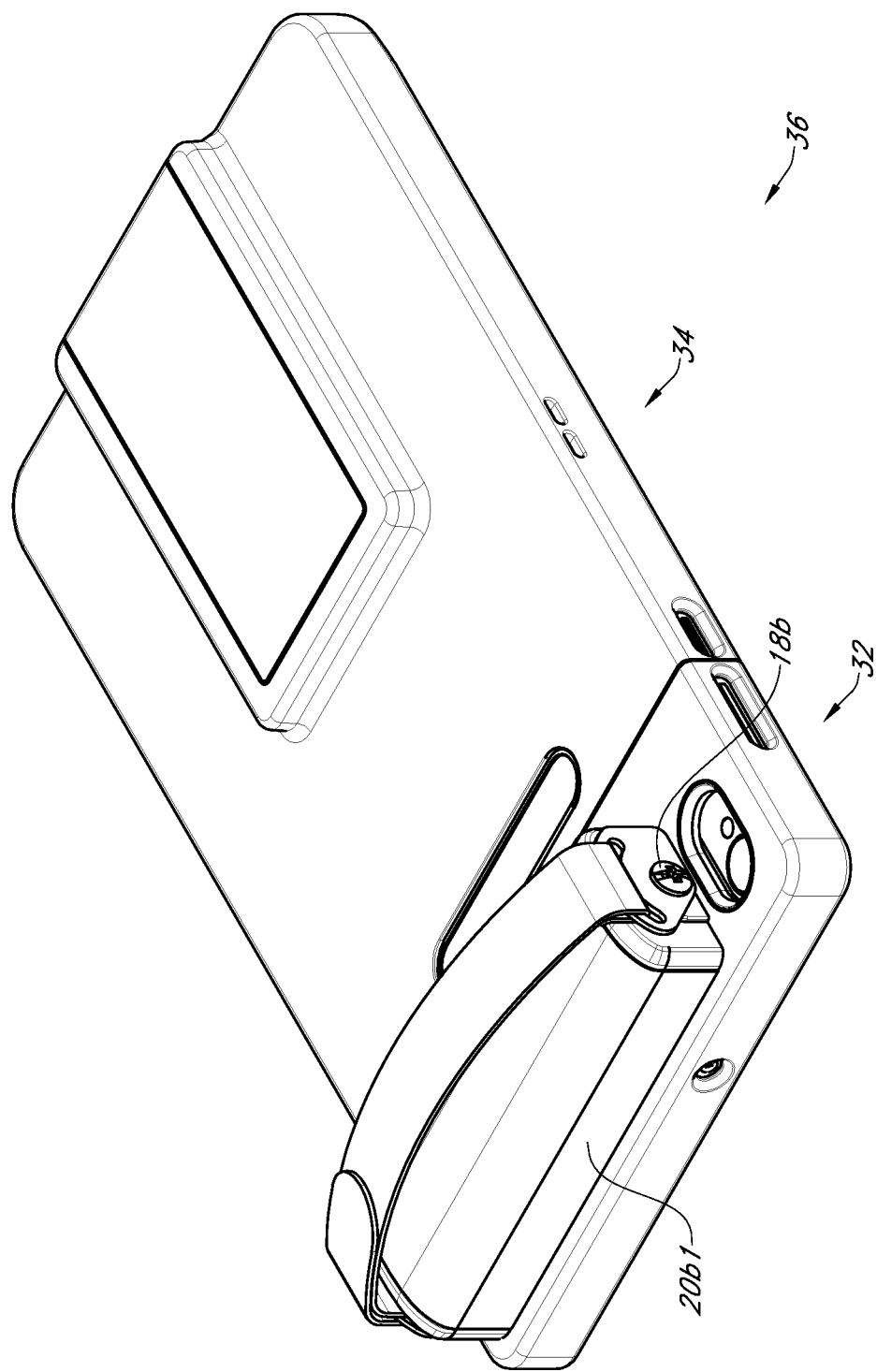
FIG. 32 is a front-bottom-perspective view of the case assembly of FIG. 24 coupled with the handle assembly of FIG. 1.

Turning to FIG. 32, depicted therein is a front-bottom-perspective view of device case assembly 30 coupled with handle assembly 10.

Figure 33:
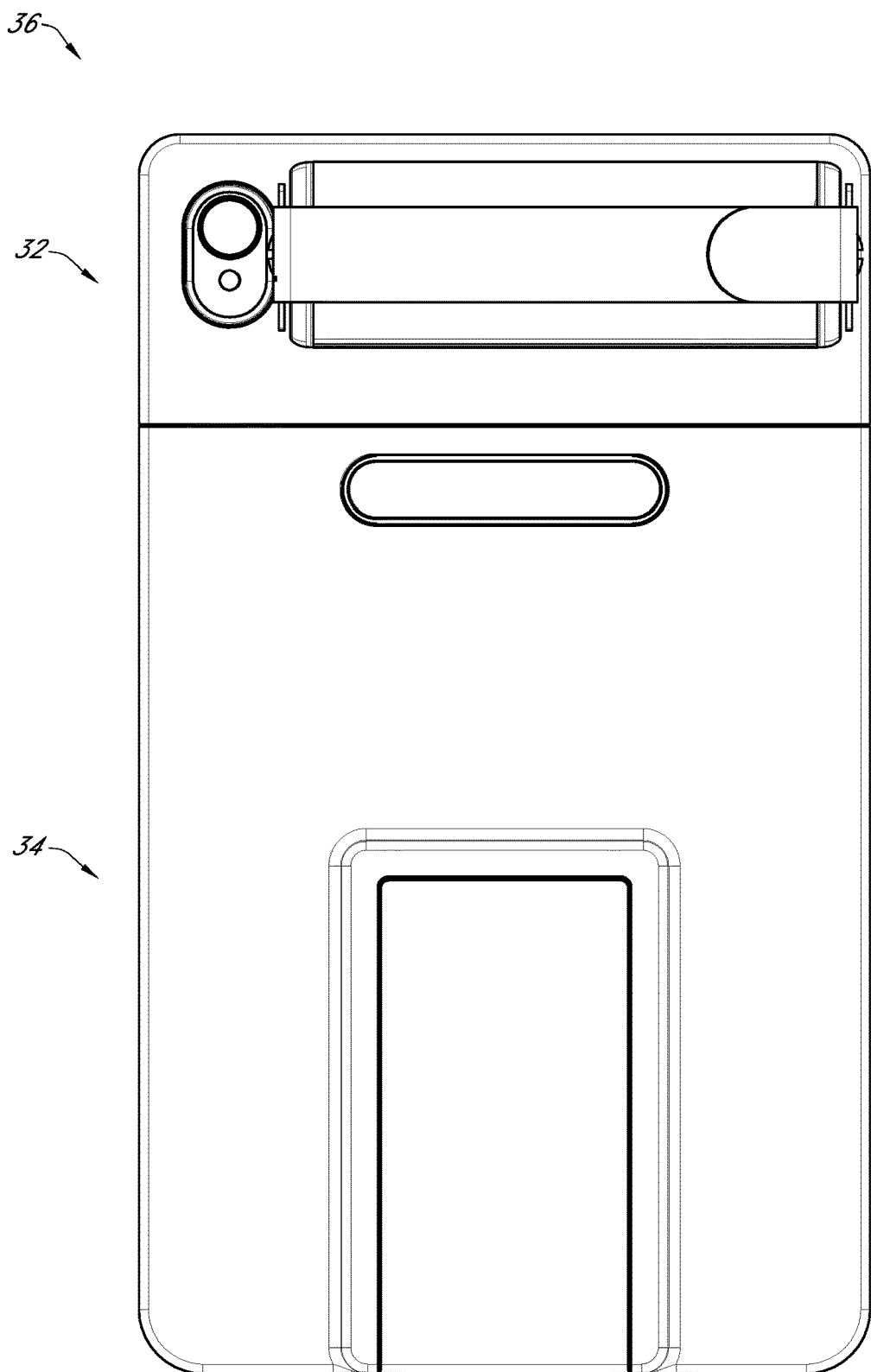
FIG. 33 is a bottom-plan-view of the case assembly of FIG. 24 coupled with the handle assembly of FIG. 1.

Turning to FIG. 33, depicted therein is a bottom-plan-view of device case assembly 30 coupled with handle assembly 10.

Figure 34:
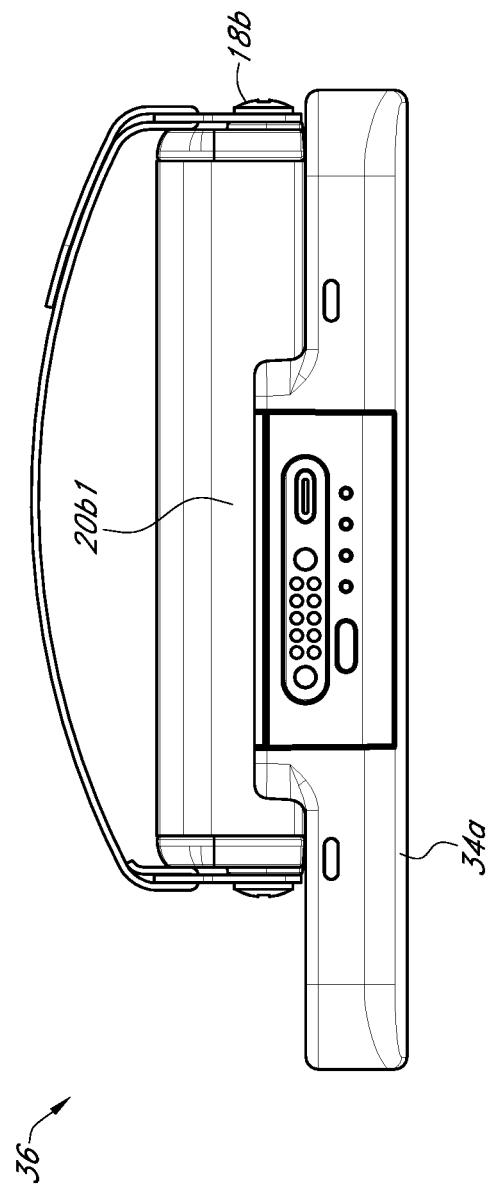
FIG. 34 is a rear-elevational view of the case assembly of FIG. 24 coupled with the handle assembly of FIG. 1.

Turning to FIG. 34, depicted therein is a rear-elevational view of device case assembly 30 coupled with handle assembly 10.

Figure 35:
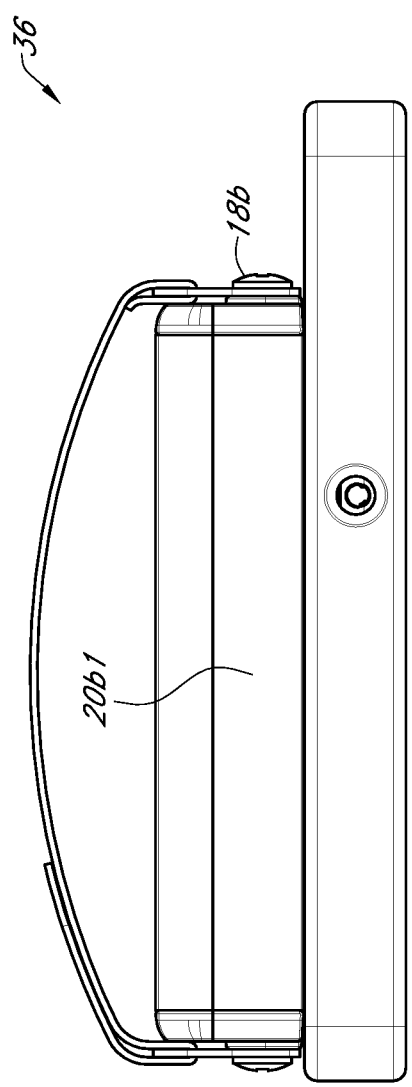
FIG. 35 is a front-elevational view of the case assembly of FIG. 24 coupled with the handle assembly of FIG. 1.

Turning to FIG. 35, depicted therein is a front-elevational view of device case assembly 30 coupled with handle assembly 10.

Figure 36:
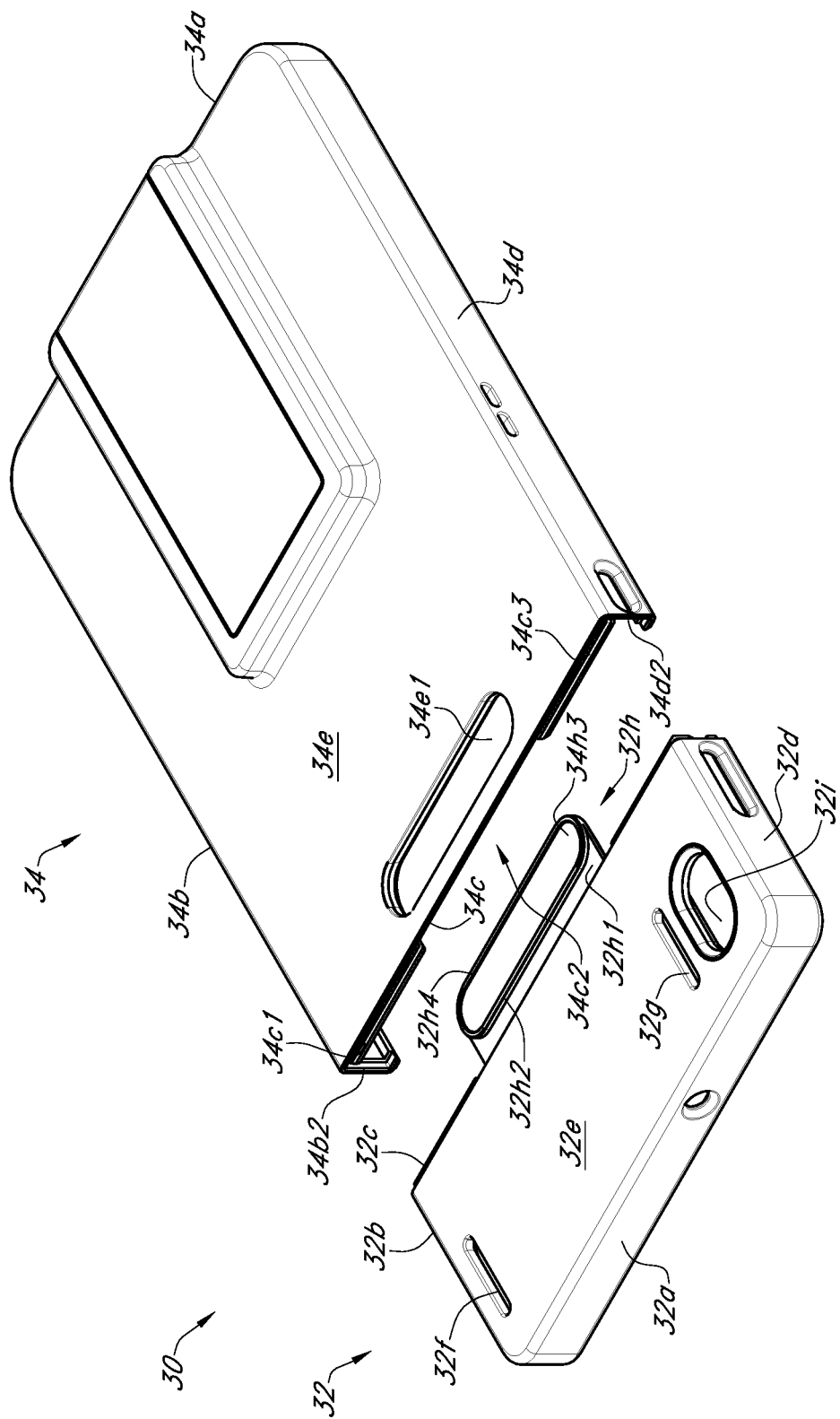
FIG. 36 is a partial-exploded-front-bottom-perspective view of the case assembly of FIG. 24.

Turning to FIG. 36, depicted therein is a partial-exploded-front-bottom-perspective view of device case assembly 30. Depicted implementation of tab member 32h of cap assembly 32 is shown to include recess 32h1, and a raised and tapered portion to include back edge 32h2, middle 32h3, and front edge 32h4, which are decreasingly less raised, respectively, with respect to recess 32h1 as also further shown in FIG. 52. As also depicted in FIG. 36, recess 32h1 is positioned closer to side edge 32c than back edge 32h2, middle 32h3, and front edge 32h4 are positioned to side edge 32c.

Depicted implementation of main assembly 34 is shown to include groove 34b2, groove 34c1, gap 34c2, groove 34c3, groove 34d2, and elongated aperture 34e1. As depicted, elongated aperture 34e1 is sized, shaped and positioned to receive tab member 32h (e.g., back edge 32h2, middle 32h3, and front edge 32h4) when cap assembly 32 and main assembly 34 are coupled together.

Figure 37:
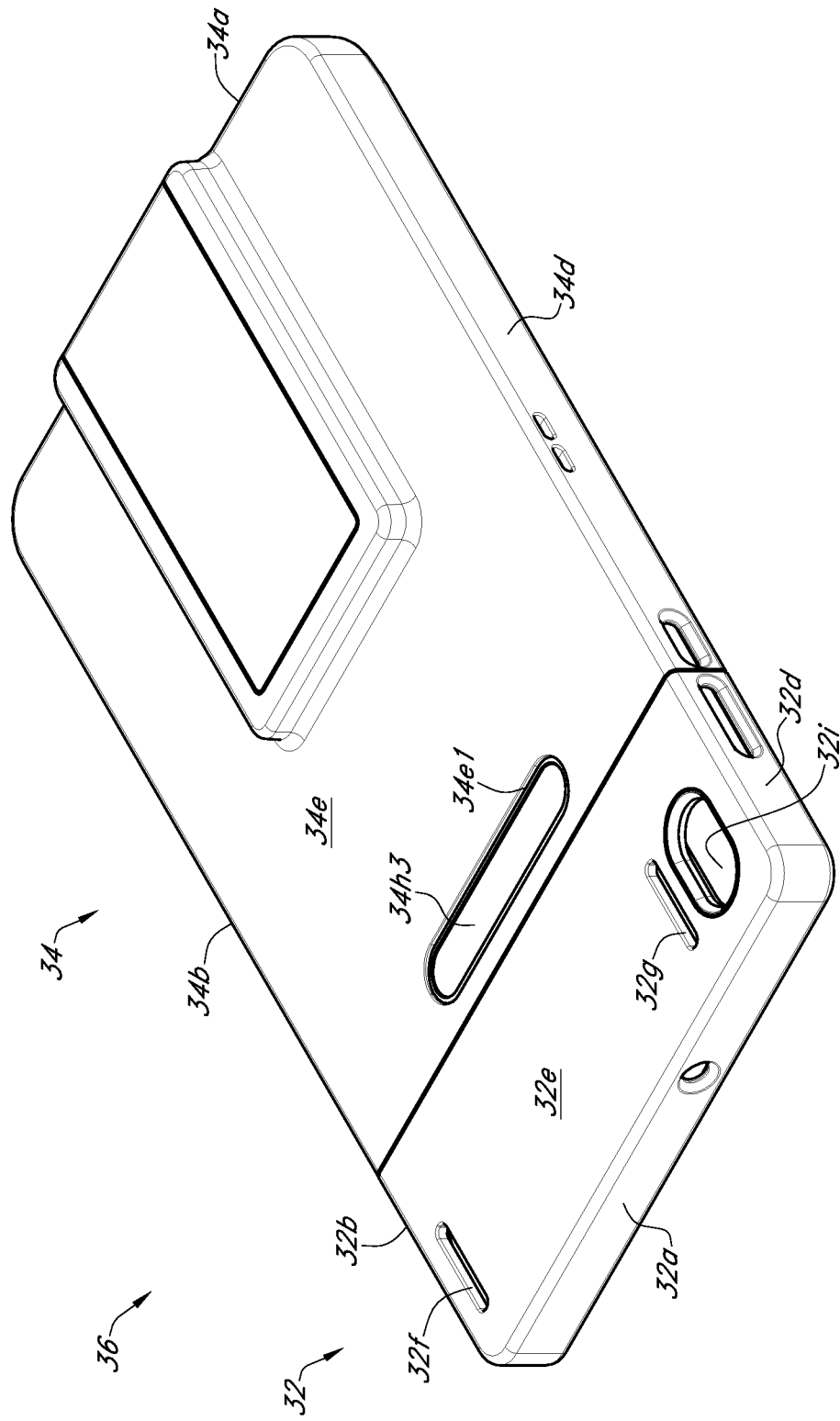
FIG. 37 is a front-bottom-perspective view of the case assembly of FIG. 24.

Turning to FIG. 37, depicted therein is a front-bottom-perspective view of device case assembly 30.

Figure 38:
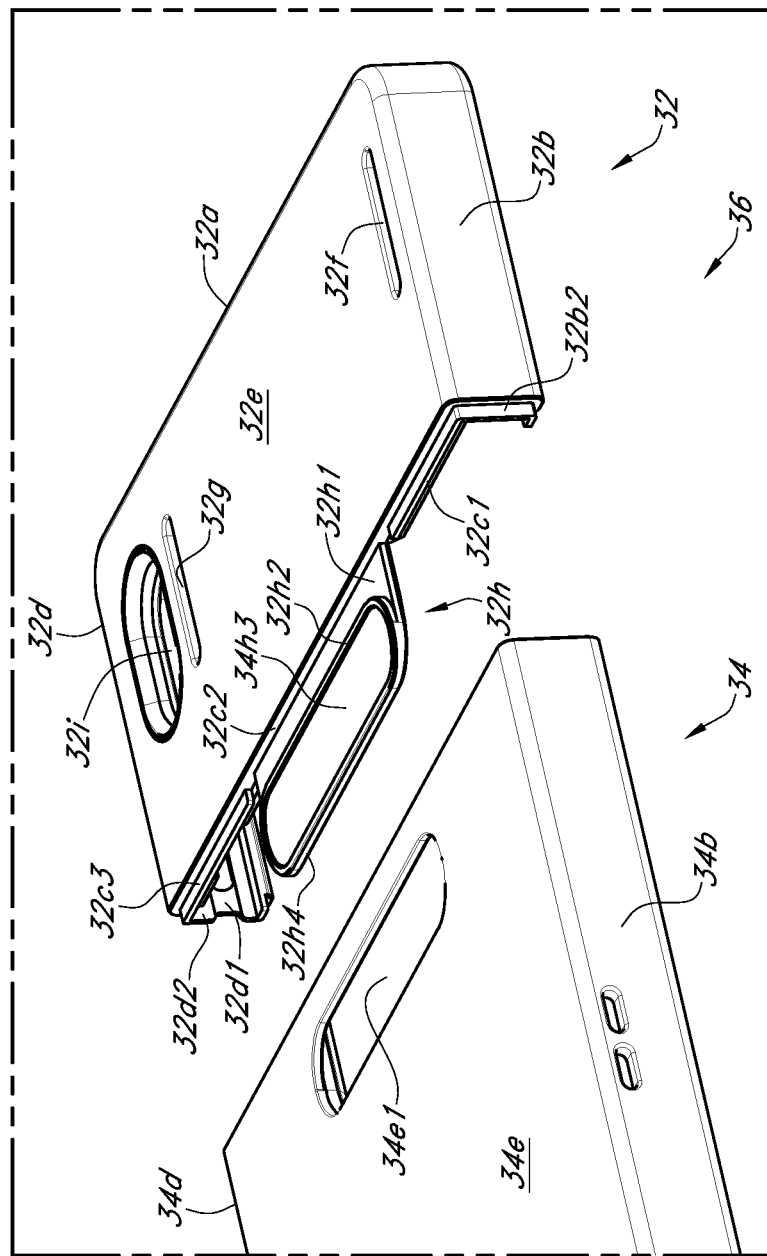
FIG. 38 is a partial-exploded-bottom-perspective view of a portion of the case assembly of FIG. 24.

Turning to FIG. 38, depicted therein is a partial-exploded-bottom-perspective view of a portion of device case assembly 30. Depicted implementation of cap assembly 32 is shown to include protrusion 32b2, protrusion 32c1, gap 32c2, protrusion 32c3, and protrusion 32d2 with protrusion 32b2, protrusion 32c1, protrusion 32c3, and protrusion 32d2 for coupling with groove 34b2, groove 34c1, groove 34c3, and groove 34d2, respectively when cap assembly 32 is coupled with main assembly 34.

Depicted implementation of main assembly 34 is shown to include groove 34b2, groove 34c1, gap 34c2, groove 34c3, groove 34d2, and elongated aperture 34e1. As depicted, elongated aperture 34e1 is sized, shaped and positioned to receive tab member 32h (e.g., back edge 32h2, middle 32h3, and front edge 32h4) when cap assembly 32 and main assembly 34 are coupled together.

Figure 39:
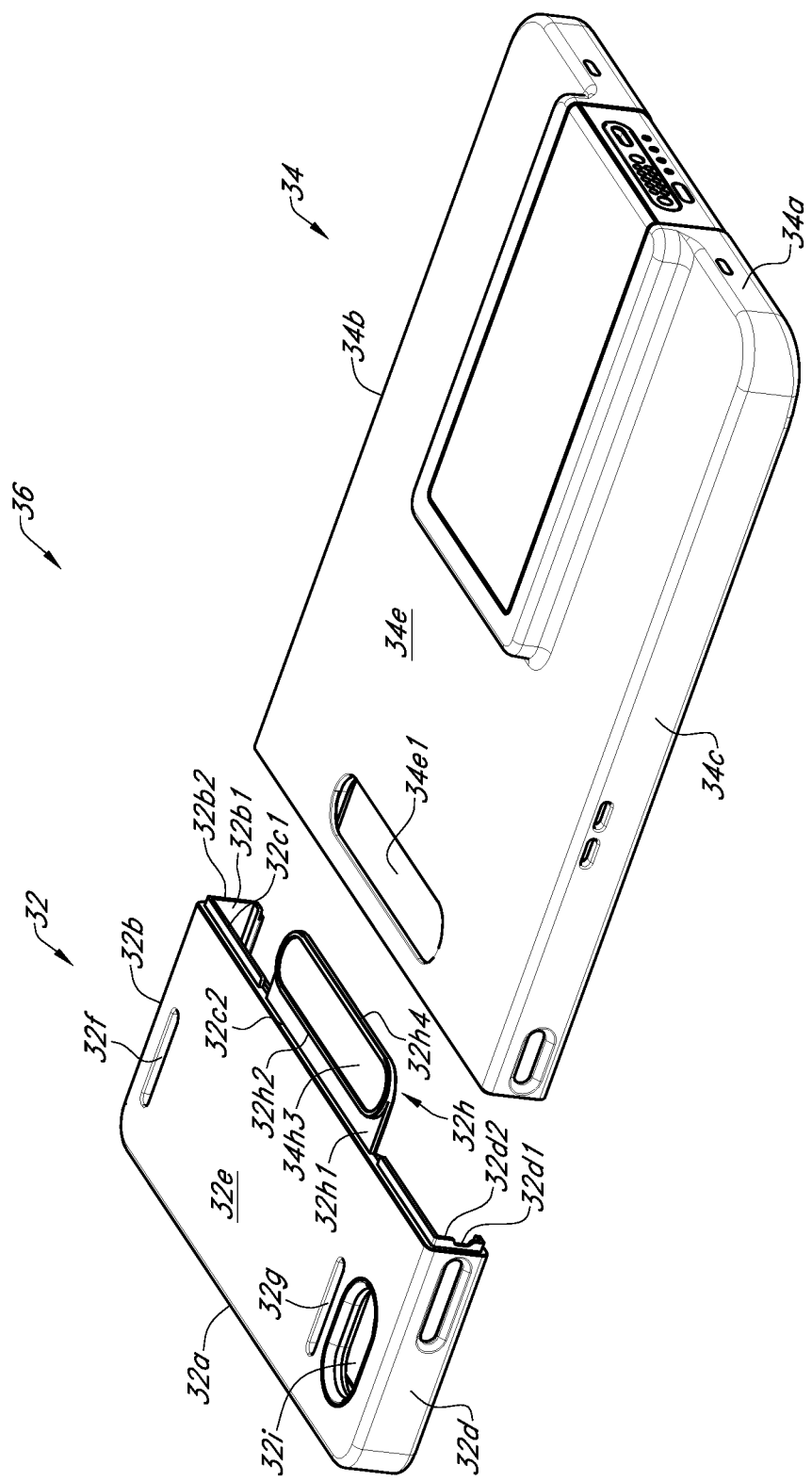
FIG. 39 is a partial-exploded-rear-bottom-perspective view of the case assembly of FIG. 24.

Turning to FIG. 39, depicted therein is a partial-exploded-rear-bottom-perspective view of device case assembly 30. Depicted implementation of cap assembly 32 is shown to include elongated groove 32b1.

Figure 40:
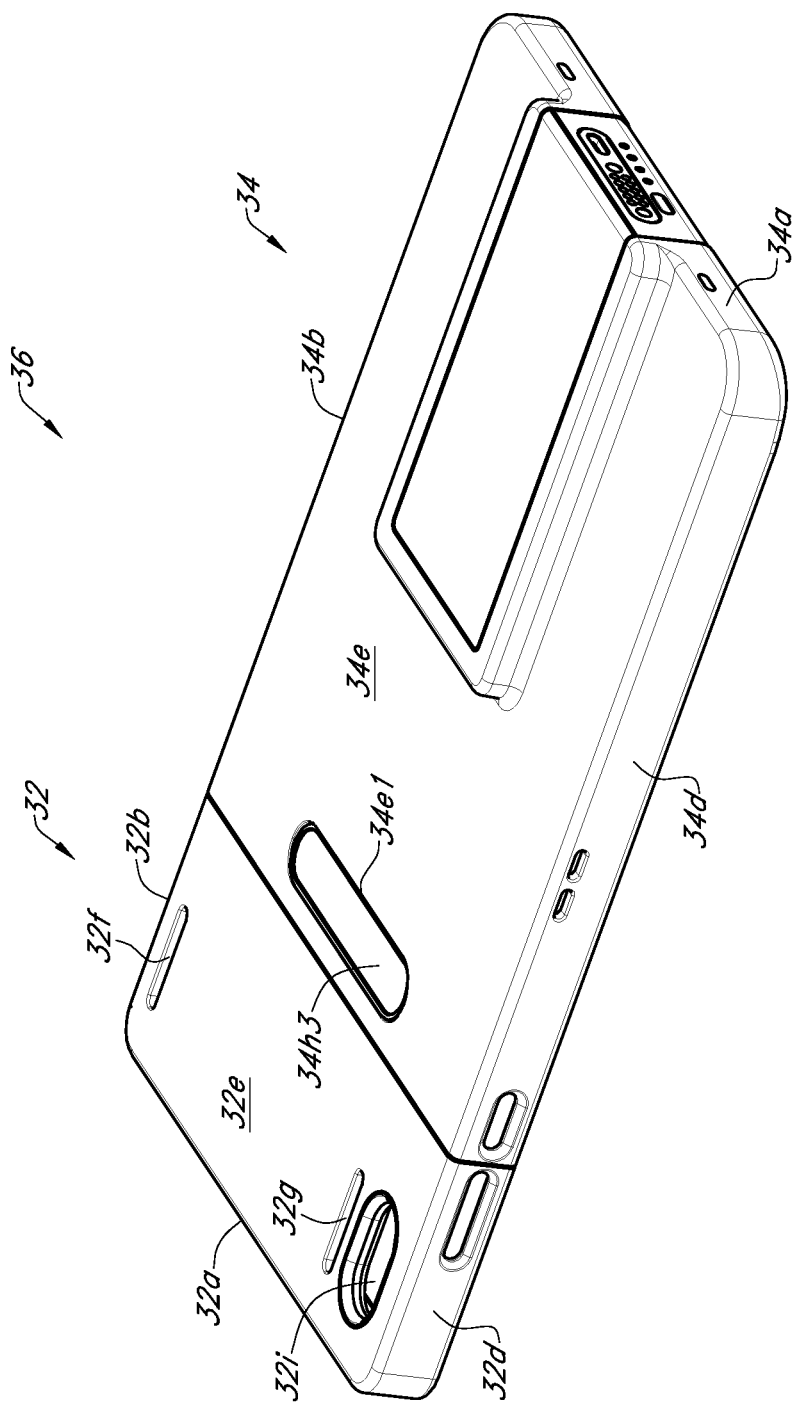
FIG. 40 is a rear-bottom-perspective view of the case assembly of FIG. 24.

Turning to FIG. 40, depicted therein is a rear-bottom-perspective view of device case assembly 30.

Figure 41:
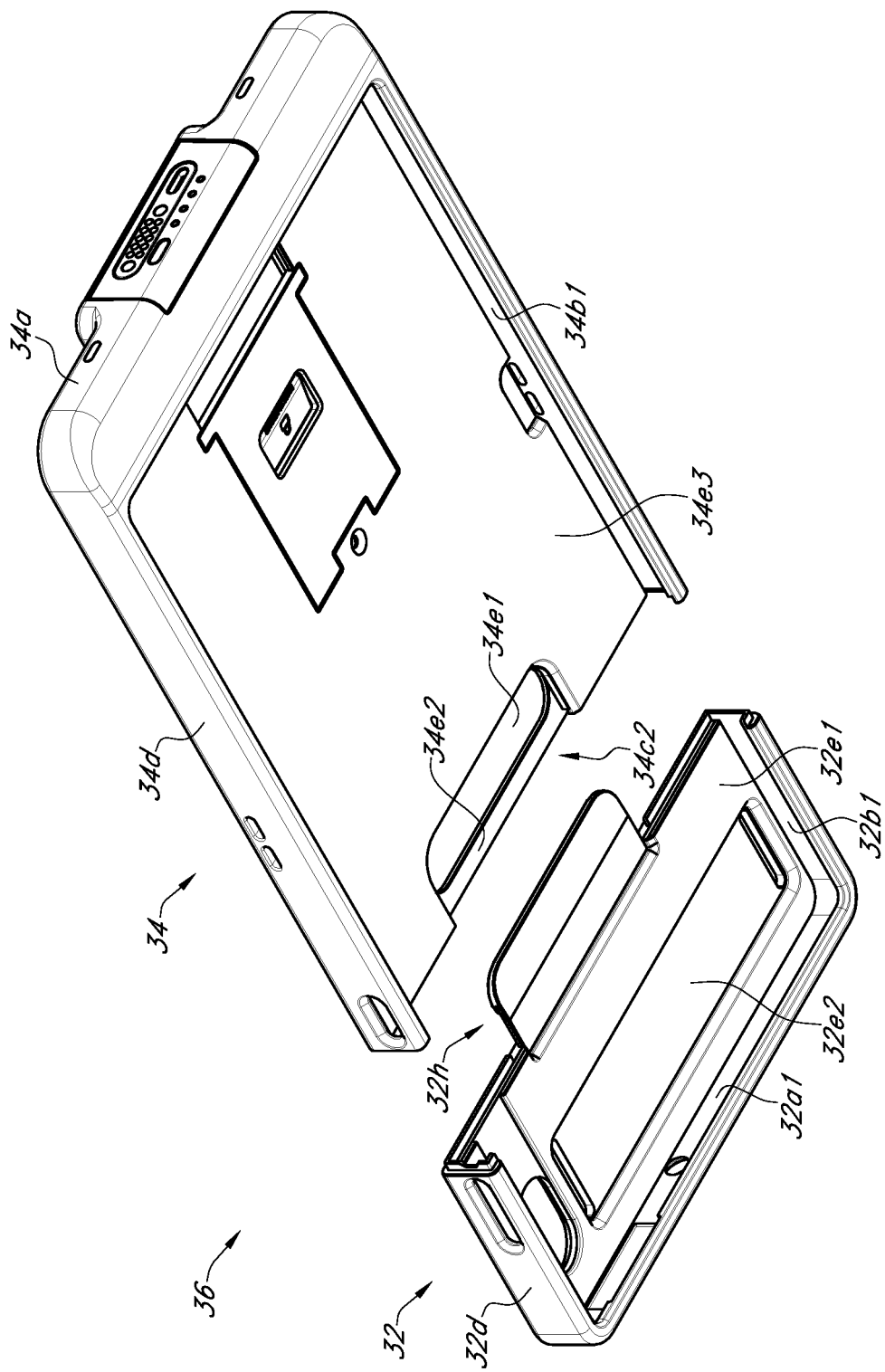
FIG. 41 is a partial-exploded-rear-top-perspective view of a portion of the case assembly of FIG. 24.

Turning to FIG. 41, depicted therein is a partial-exploded-rear-top-perspective view of a portion of device case assembly 30. Depicted implementation of main assembly 34 is shown to include elongated groove 34b1, recessed portion 34e2, and raised portion 34e3.

Figure 42:
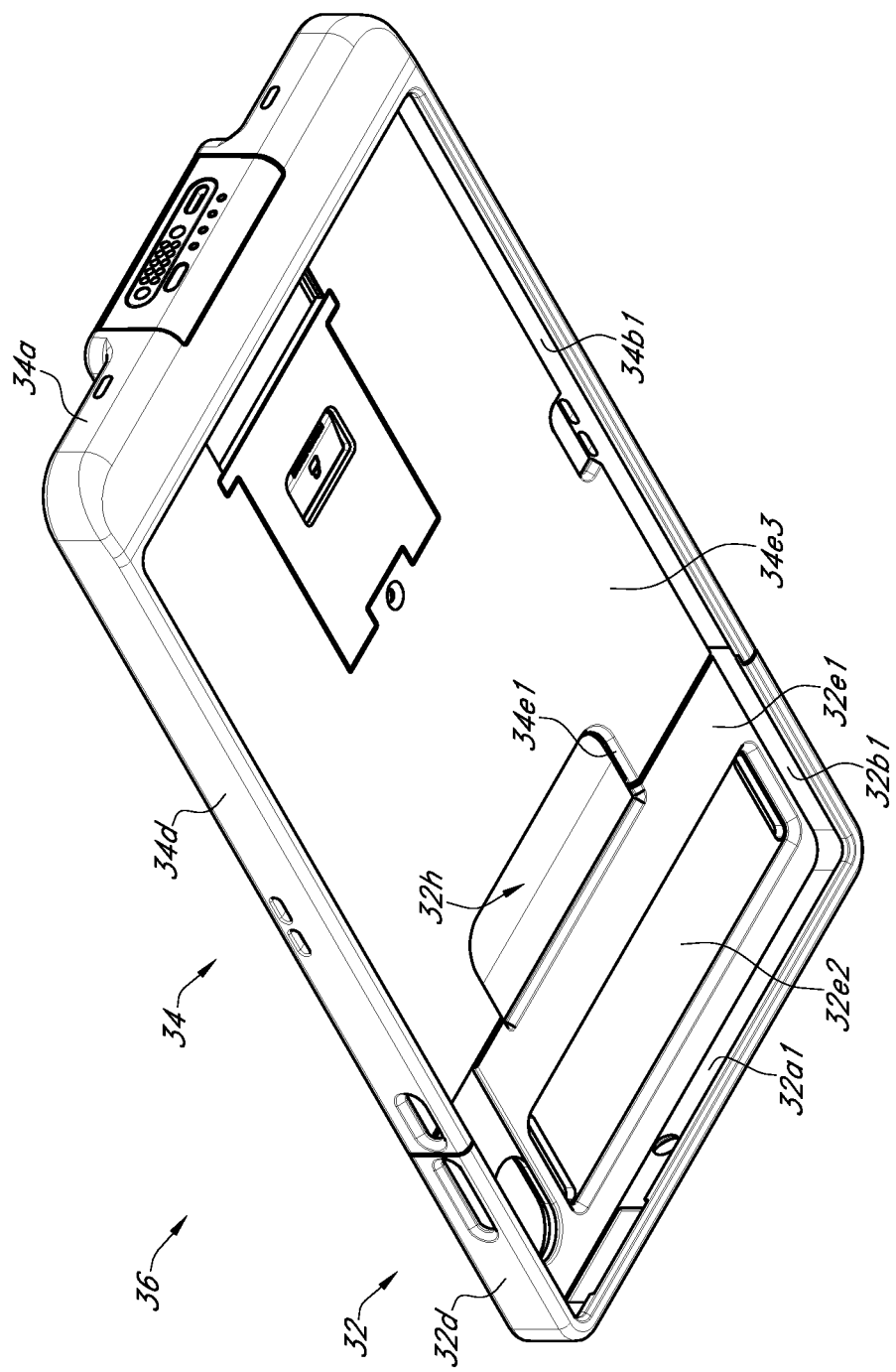
FIG. 42 is a rear-top-perspective view of the case assembly of FIG. 24.

Turning to FIG. 42, depicted therein is a rear-top-perspective view of device case assembly 30.

Figure 43:
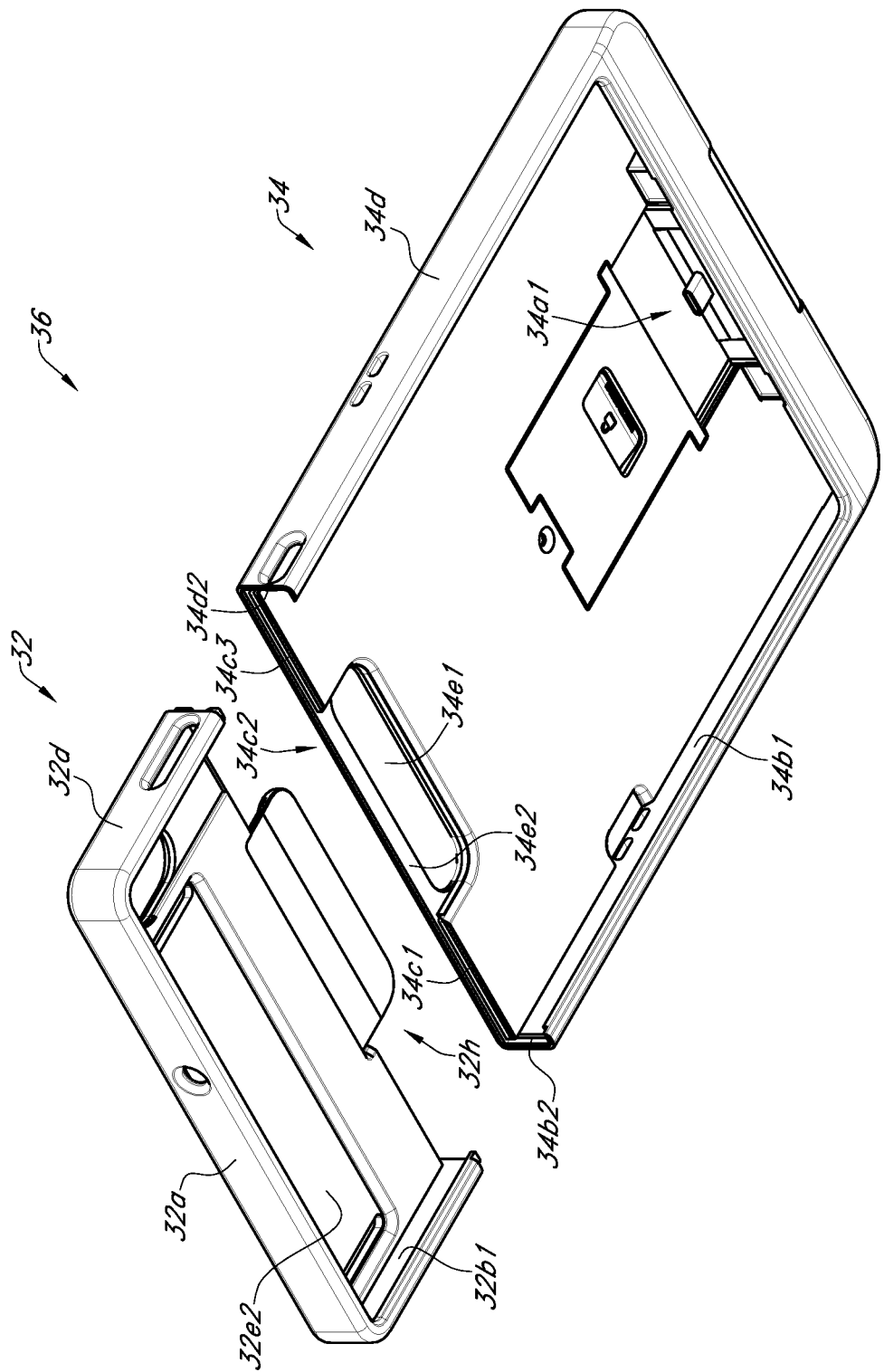
FIG. 43 is a partial-exploded-front-top-perspective view of the case assembly of FIG. 24.

Turning to FIG. 43, depicted therein is a partial-exploded-front-top-perspective view of device case assembly 30.

Figure 44:
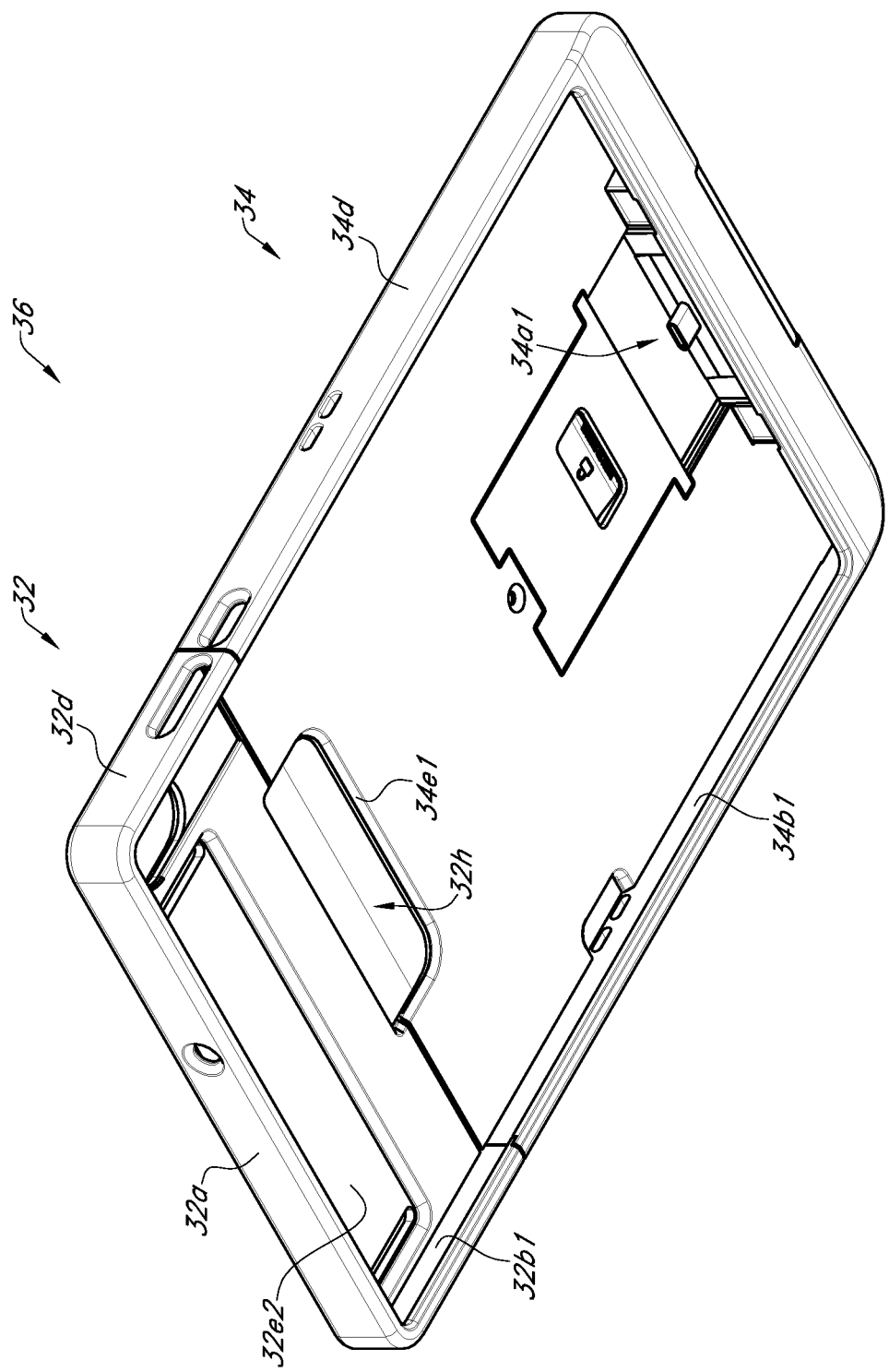
FIG. 44 is a front-top-perspective view of the case assembly of FIG. 24.

Turning to FIG. 44, depicted therein is a front-top-perspective view of device case assembly 30.

Figure 45:
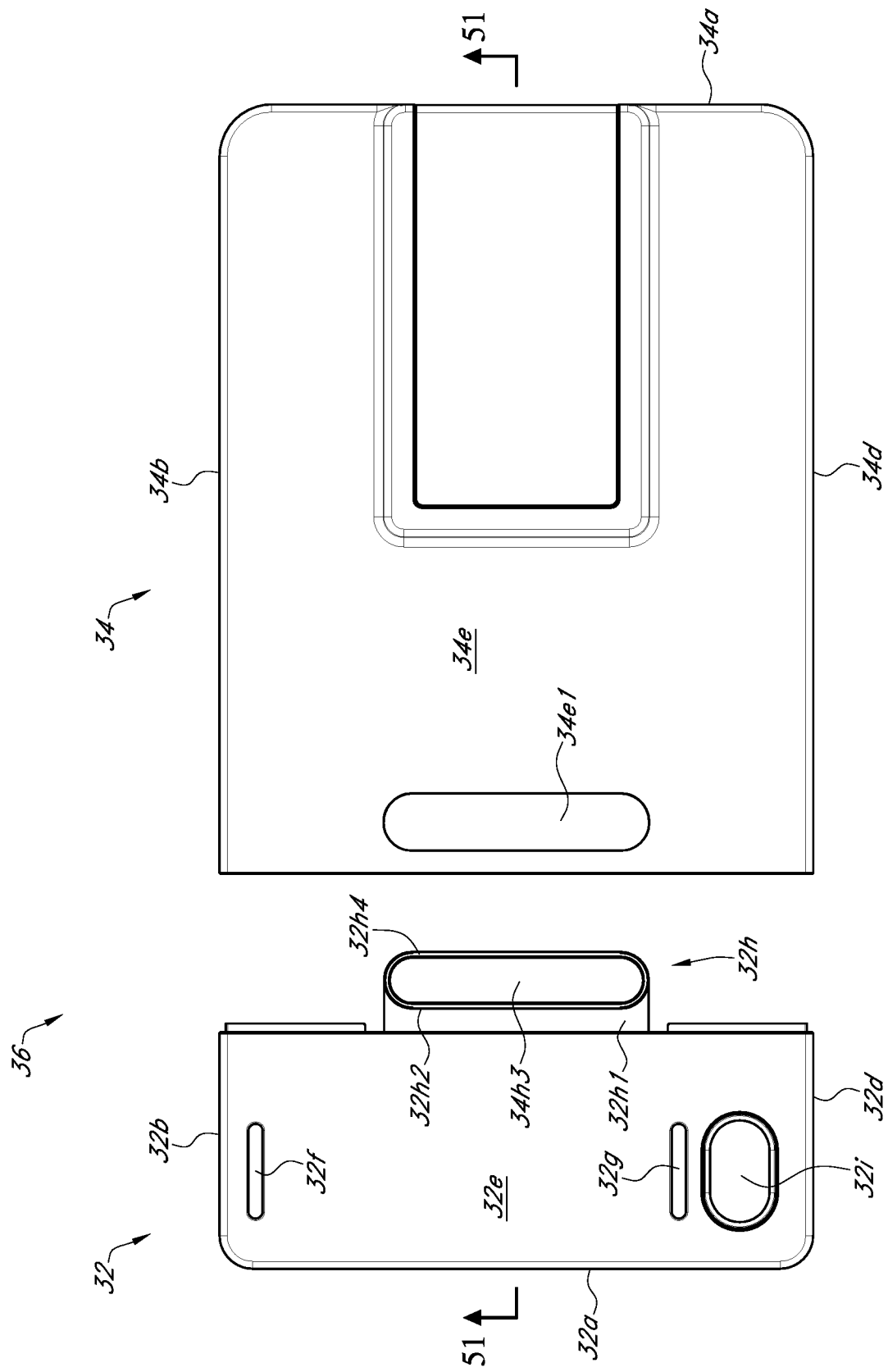
FIG. 45 is a partial-exploded-bottom-plan view of the case assembly of FIG. 24.

Turning to FIG. 45, depicted therein is a partial-exploded-bottom-plan view of device case assembly 30.

Figure 46:
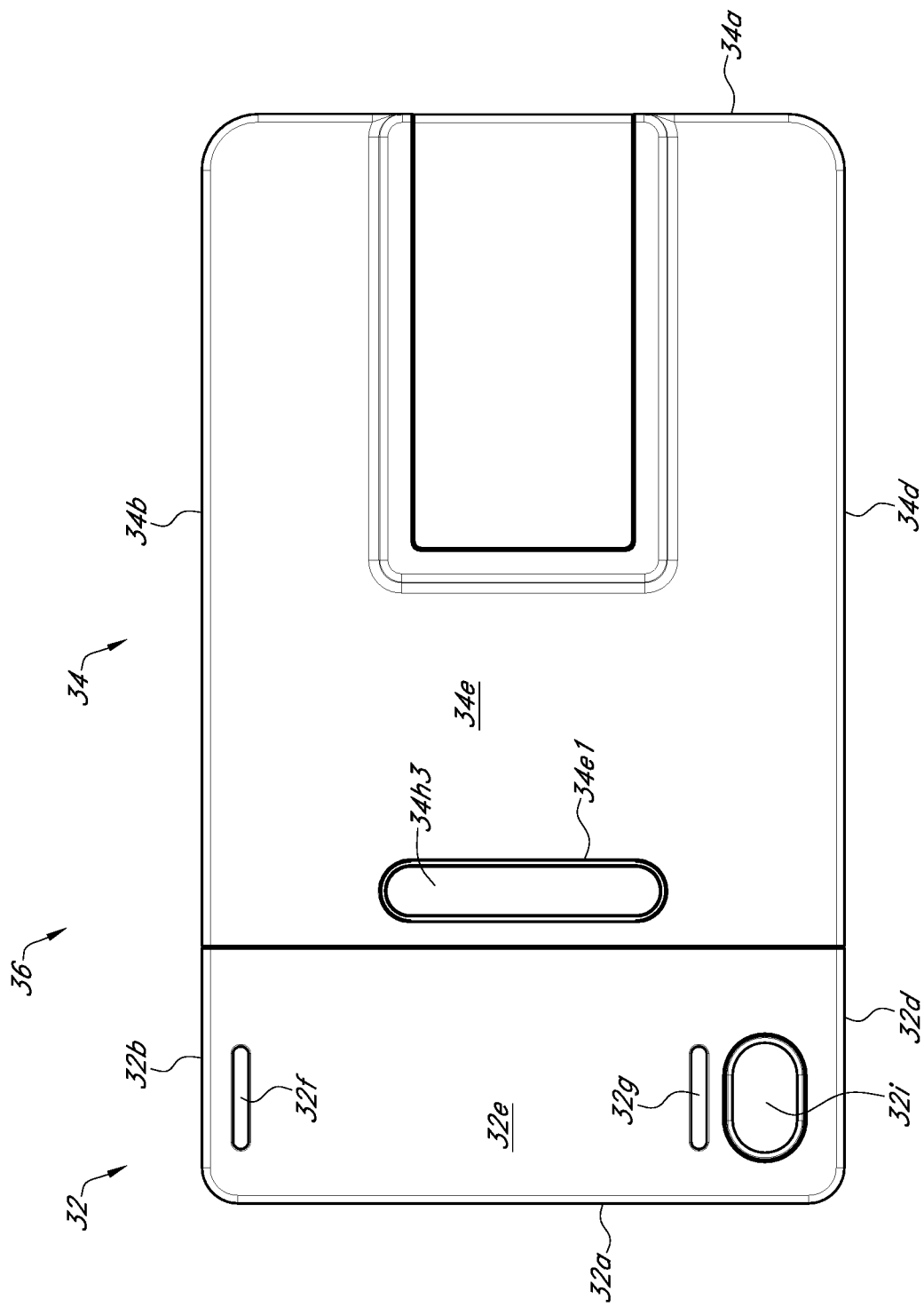
FIG. 46 is a bottom-plan view of the case assembly of FIG. 24.

Turning to FIG. 46, depicted therein is a bottom-plan view of device case assembly 30.

Figure 47:
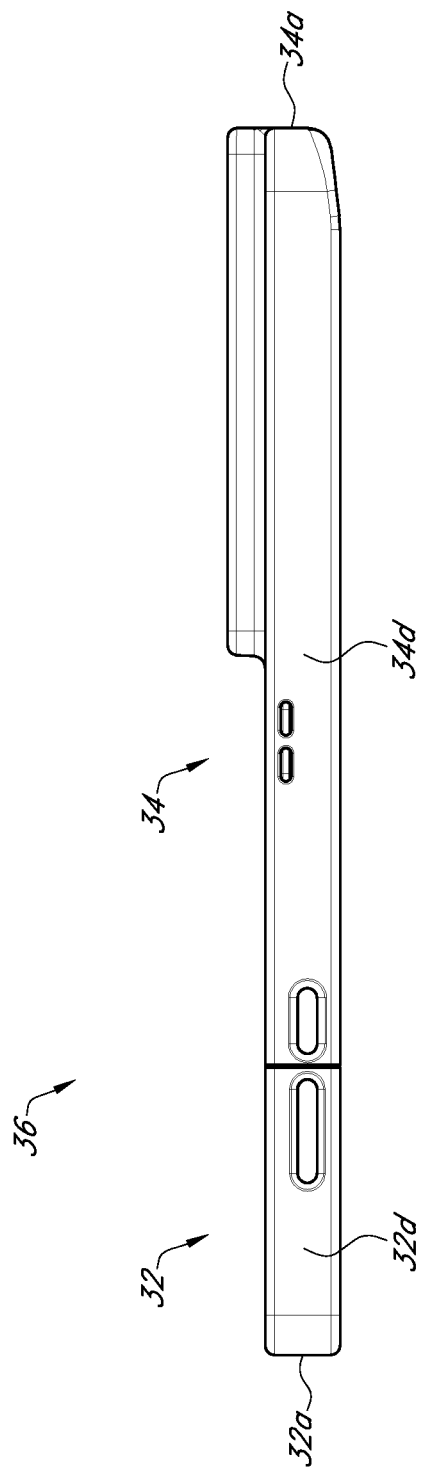
FIG. 47 is a side-elevational view of the case assembly of FIG. 24.

Turning to FIG. 47, depicted therein is a side-elevational view of device case assembly 30.

Figure 48:
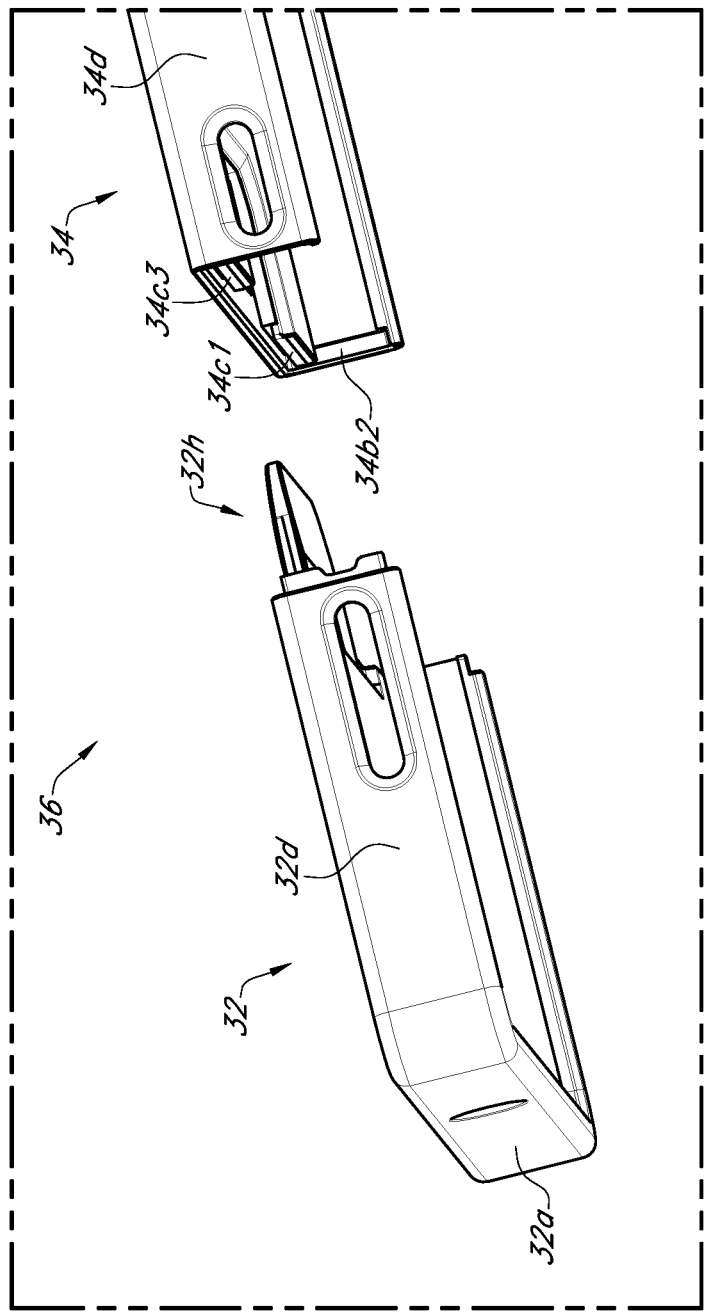
FIG. 48 is a partial-exploded-perspective view of a portion of the case assembly of FIG. 24.

Turning to FIG. 48, depicted therein is a partial-exploded-perspective view of a portion of device case assembly 30.

Figure 49:
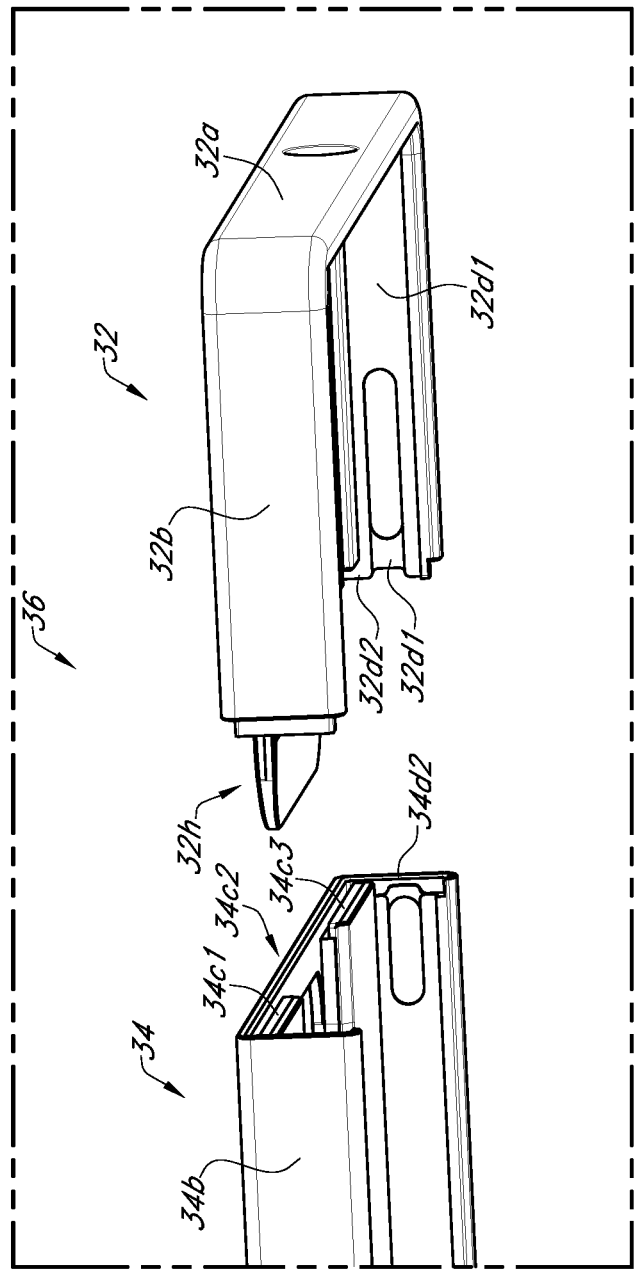
FIG. 49 is a partial-exploded-perspective view of a portion of the case assembly of FIG. 24.

Turning to FIG. 49, depicted therein is a partial-exploded-perspective view of a portion of device case assembly 30.

Turning to FIG. 50, depicted therein is a partial-exploded-side-elevational view of device case assembly 30.

Figure 51:
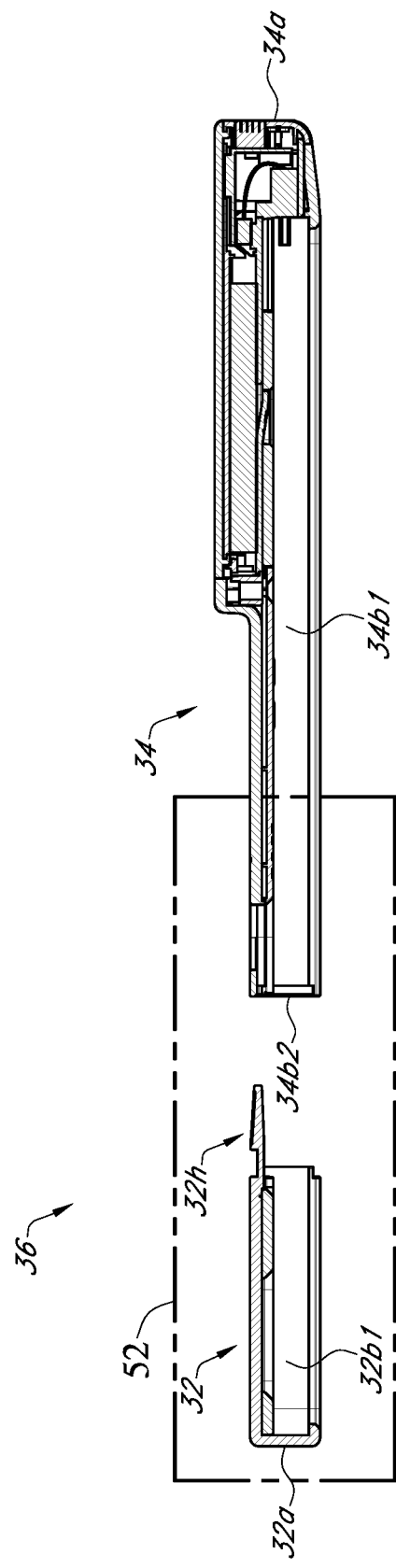
FIG. 51 is a cross-sectional-partial-exploded-side-elevational view of the case assembly of FIG. 24 taken along the 51-51 cutline of FIG. 45.

Turning to FIG. 51, depicted therein is a cross-sectional-partial-exploded-side-elevational view of device case assembly 30 taken along the 51-51 cutline of FIG. 45.

Figure 52:
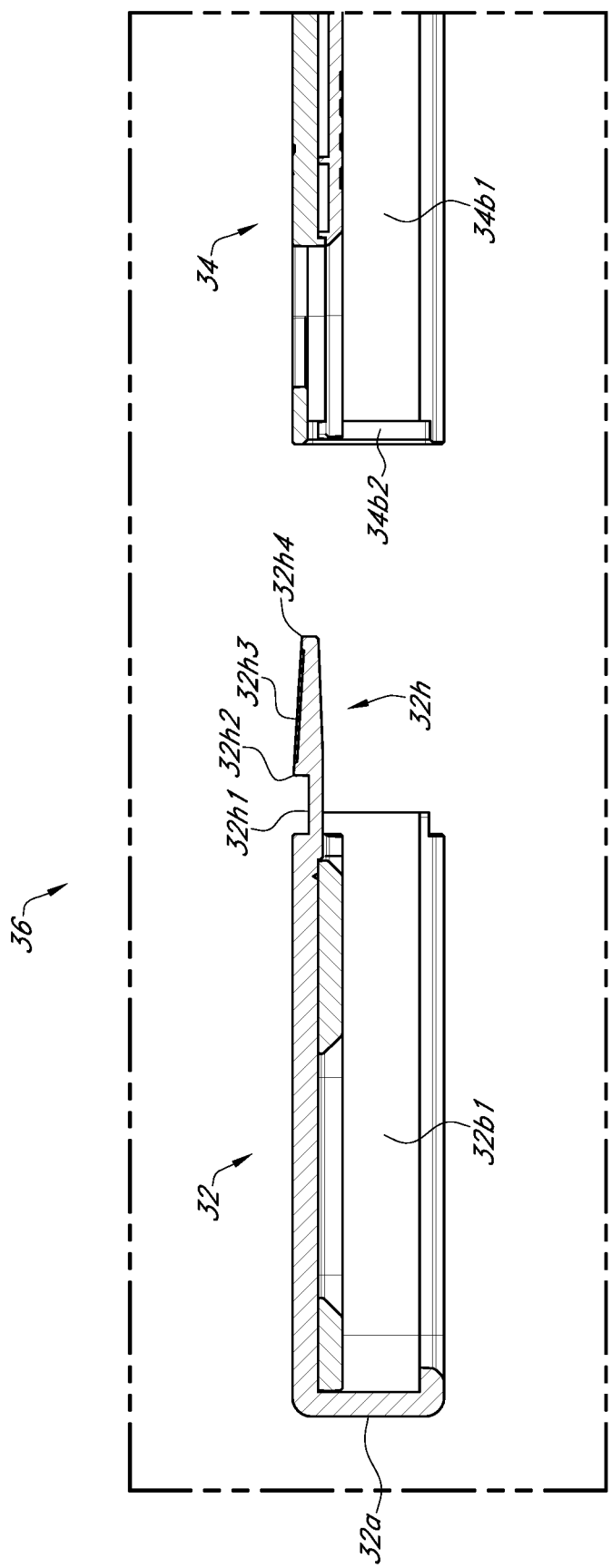
FIG. 52 is an enlarged portion identified by the "52" demarcated area of FIG. 51 of cross-sectional-partial-exploded-side-elevational view of the case assembly of FIG. 24 taken along the 51-51 cutline of FIG. 45.

Turning to FIG. 52, depicted therein is an enlarged portion identified by the "52" demarcated area of FIG. 51 of cross-sectional-partial-exploded-side-elevational view of device case assembly 30 taken along the 51-51 cutline of FIG. 45.

Figure 53:
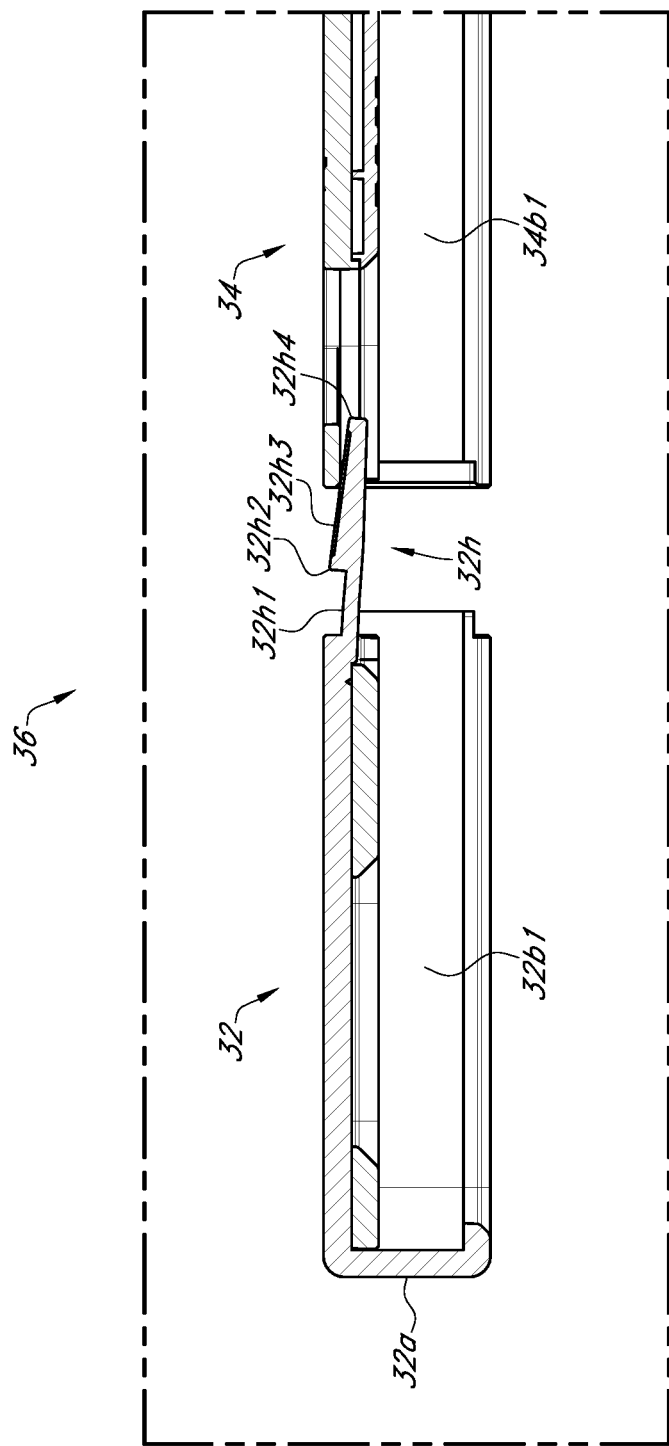
FIG. 53 is an enlarged portion of cross-sectional-partial-engaged-side-elevational view of the case assembly of FIG. 24 taken along the 51-51 cutline of FIG. 45.

Turning to FIG. 53, depicted therein is an enlarged portion of cross-sectional-partial-engaged-side-elevational view of device case assembly 30 taken along the 51-51 cutline of FIG. 45.

Figure 54:
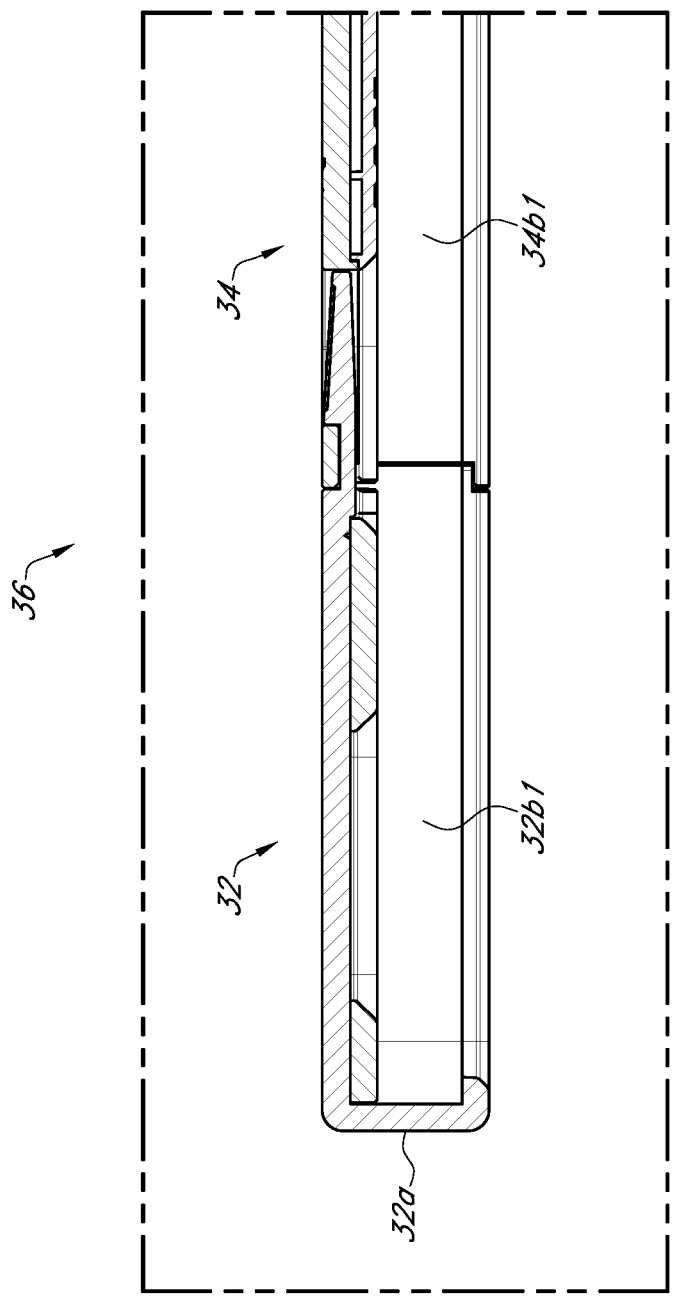
FIG. 54 is an enlarged portion of cross-sectional-engaged-side-elevational view of the case assembly of FIG. 24 taken along the 51-51 cutline of FIG. 45.

Turning to FIG. 54, depicted therein is an enlarged portion of cross-sectional-engaged-side-elevational view of device case assembly 30 taken along the 51-51 cutline of FIG. 45.

Figure 55:
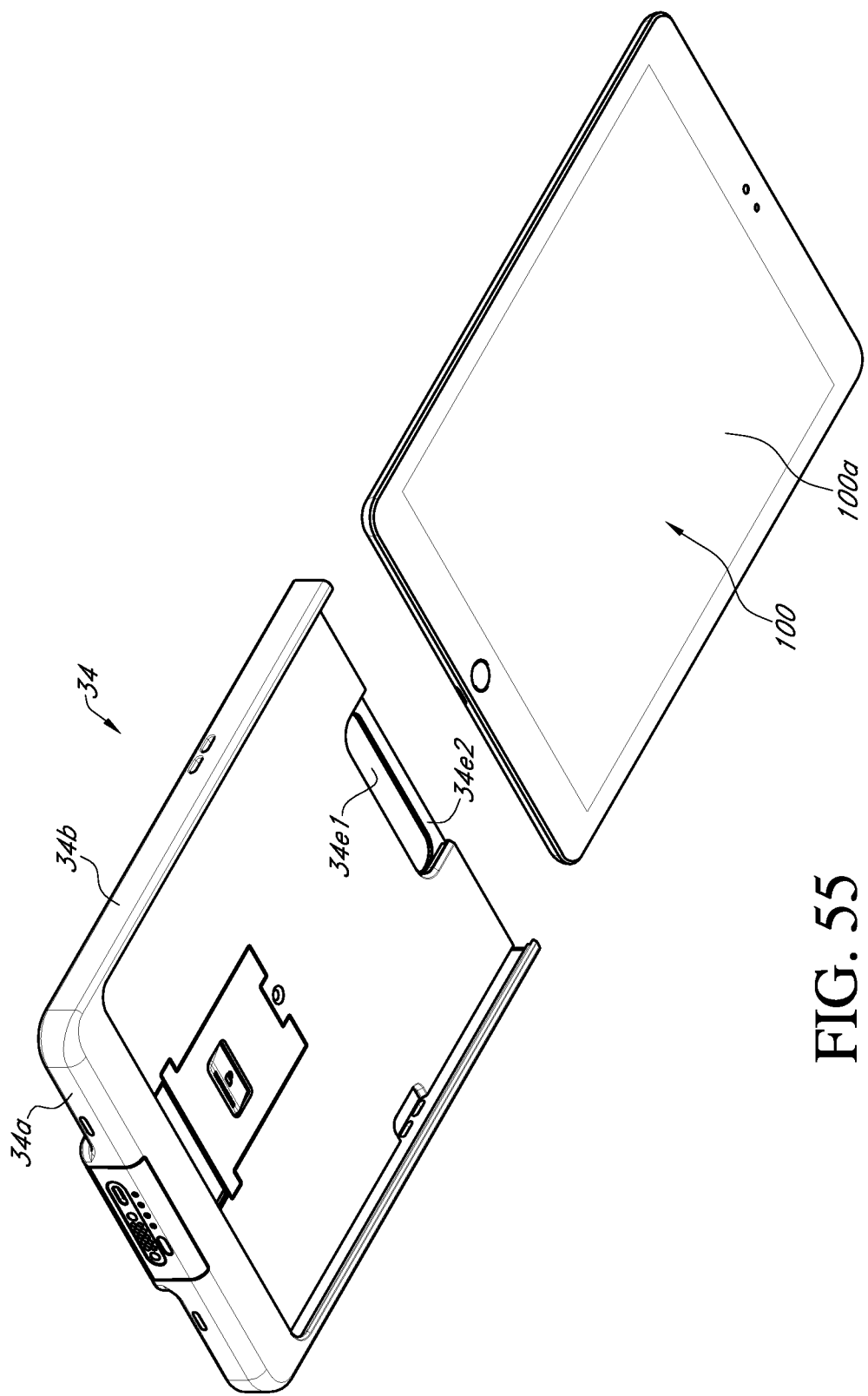
FIG. 55 is a front-rear perspective of a portion of the case assembly of FIG. 24 and the electronic device of FIG. 30.

Turning to FIG. 55, depicted therein is a front-rear perspective of a portion of device case assembly 30 and portable electronic device 100.

Figure 56:
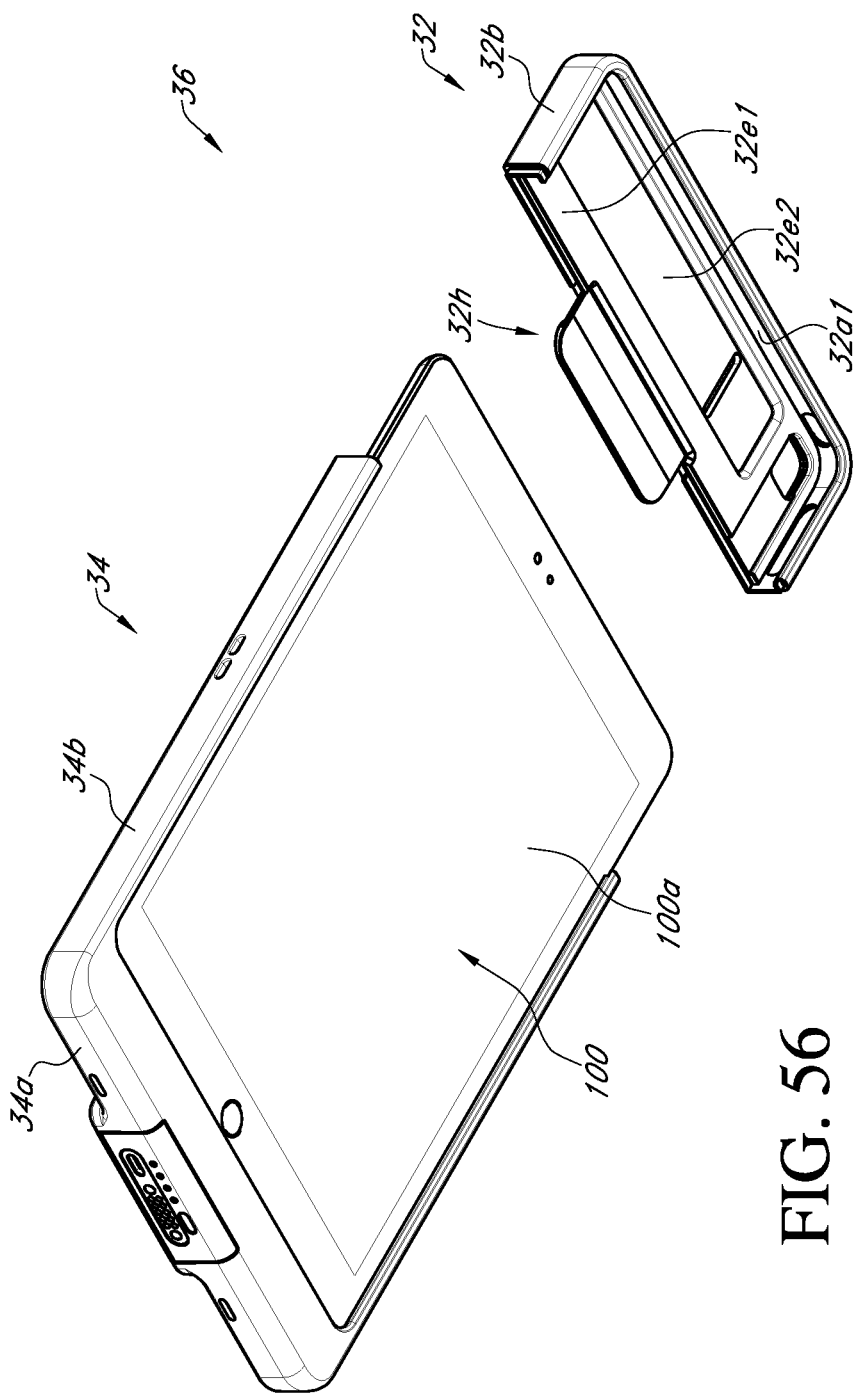
FIG. 56 is a front-rear perspective of a portion of the case assembly of FIG. 24 and the electronic device of FIG. 30.

Turning to FIG. 56, depicted therein is a front-rear perspective of a portion of device case assembly 30 and portable electronic device 100.

Figure 57:
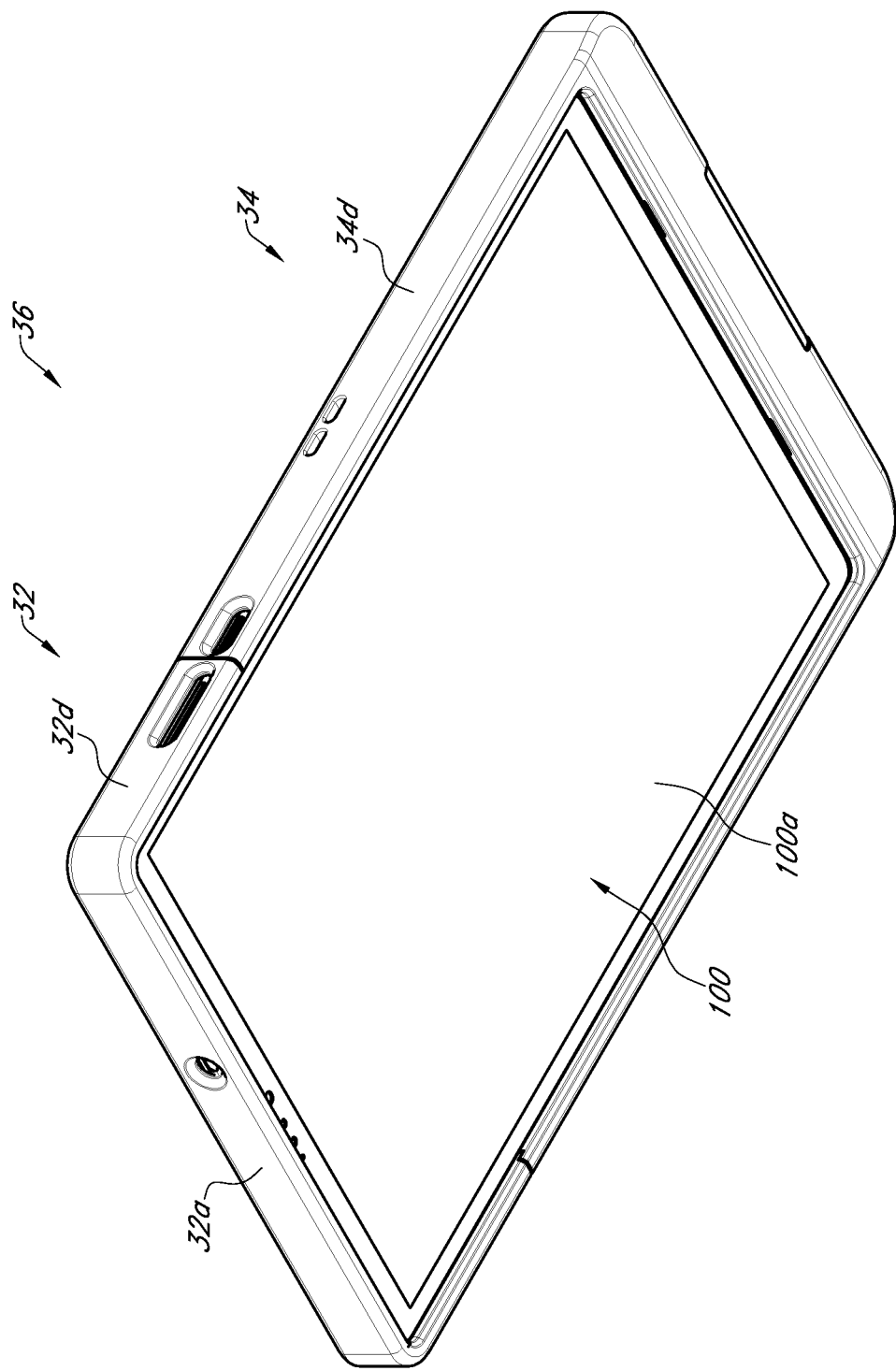
FIG. 57 is a front-rear perspective of a portion of the case assembly of FIG. 24 and the electronic device of FIG. 30.

Turning to FIG. 57, depicted therein is a front-rear perspective of a portion of device case assembly 30 and portable electronic device 100.

Figure 58:
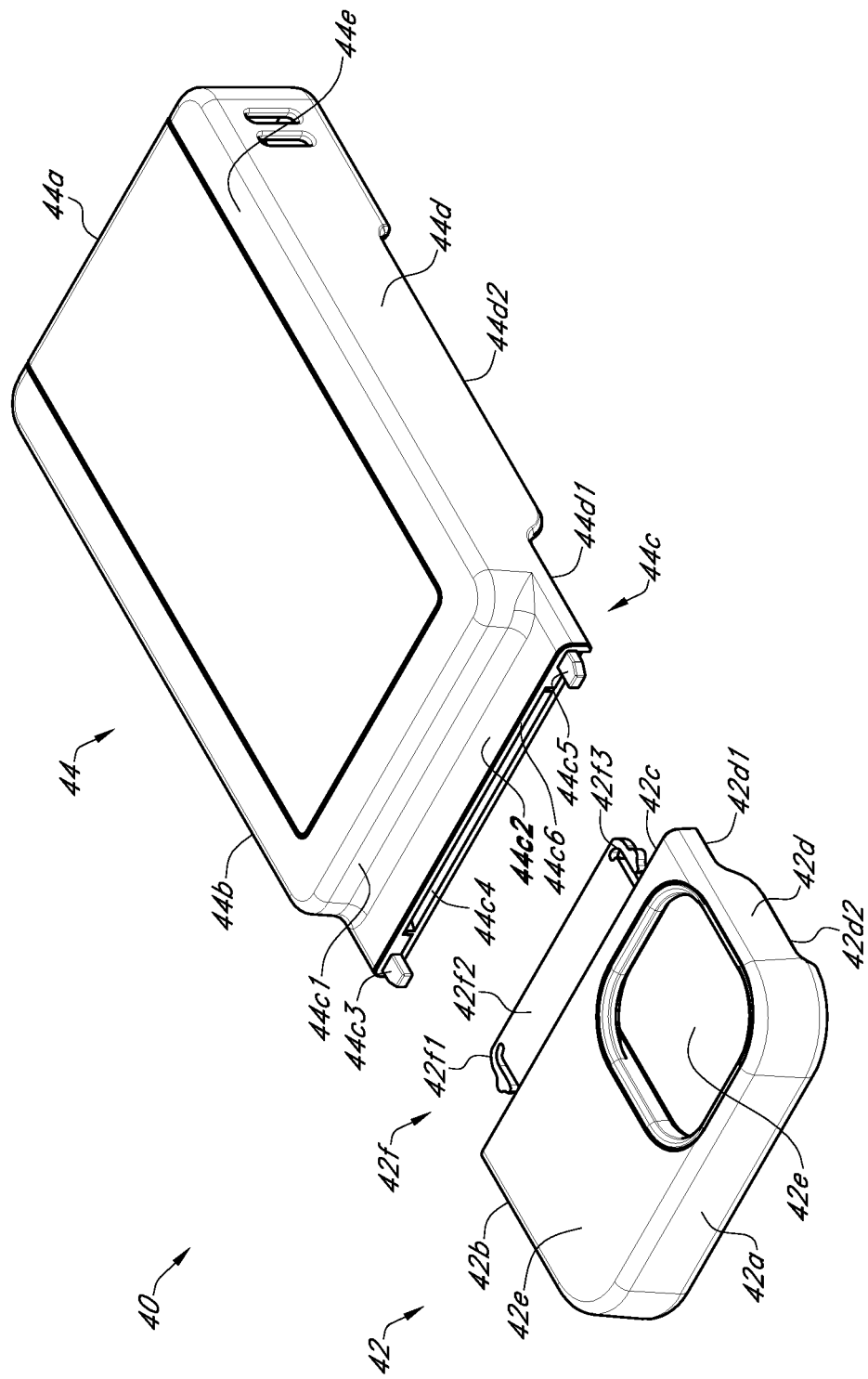
FIG. 58 is a partial-exploded-front-bottom-perspective view of a case assembly.

Turning to FIG. 58, depicted therein is a partial-exploded-front-bottom-perspective view of case assembly 40. Depicted implementation of case assembly 40 is shown to include cap assembly 42, and main assembly 44. Depicted implementation of cap assembly 42 is shown to include side wall 42a, side wall 42b, edge 42c, side wall 42d, aperture 42e, and tab member 42f. Depicted implementation of side wall 42d is shown to include recess 42d1, and recess 42d2. Depicted implementation of tab member 42f is shown to include tab body 42f2 with semi-flexible protrusion 42f1 and semi-flexible protrusion 42f3 extending therefrom. Depicted implementation of main assembly 44 is shown to include side wall 44a, side wall 44b, side assembly 44c, side wall 44d, and base 44e. Depicted implementation of side assembly 44c is shown to include side wall portion 44c1, extended portion 44c2, protrusion 44c3, aperture 44c4, protrusion 44c5, and edge 44c6. Depicted implementation of side wall 44d is shown to include recess 44d1, and recess 44d2.

Figure 59:
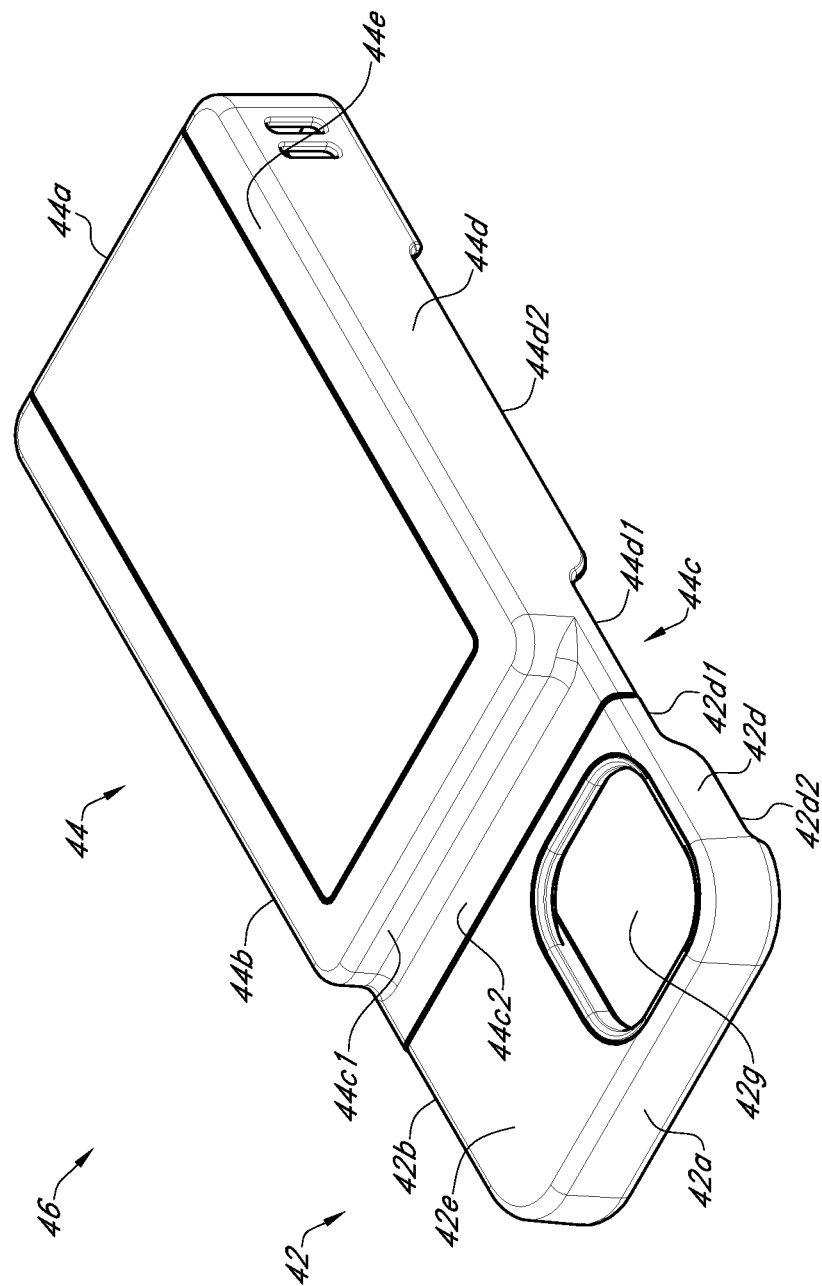
FIG. 59 is a front-bottom-perspective view of the case assembly of FIG. 58.

Turning to FIG. 59, depicted therein is a front-bottom-perspective view of case assembly 40.

Figure 60:
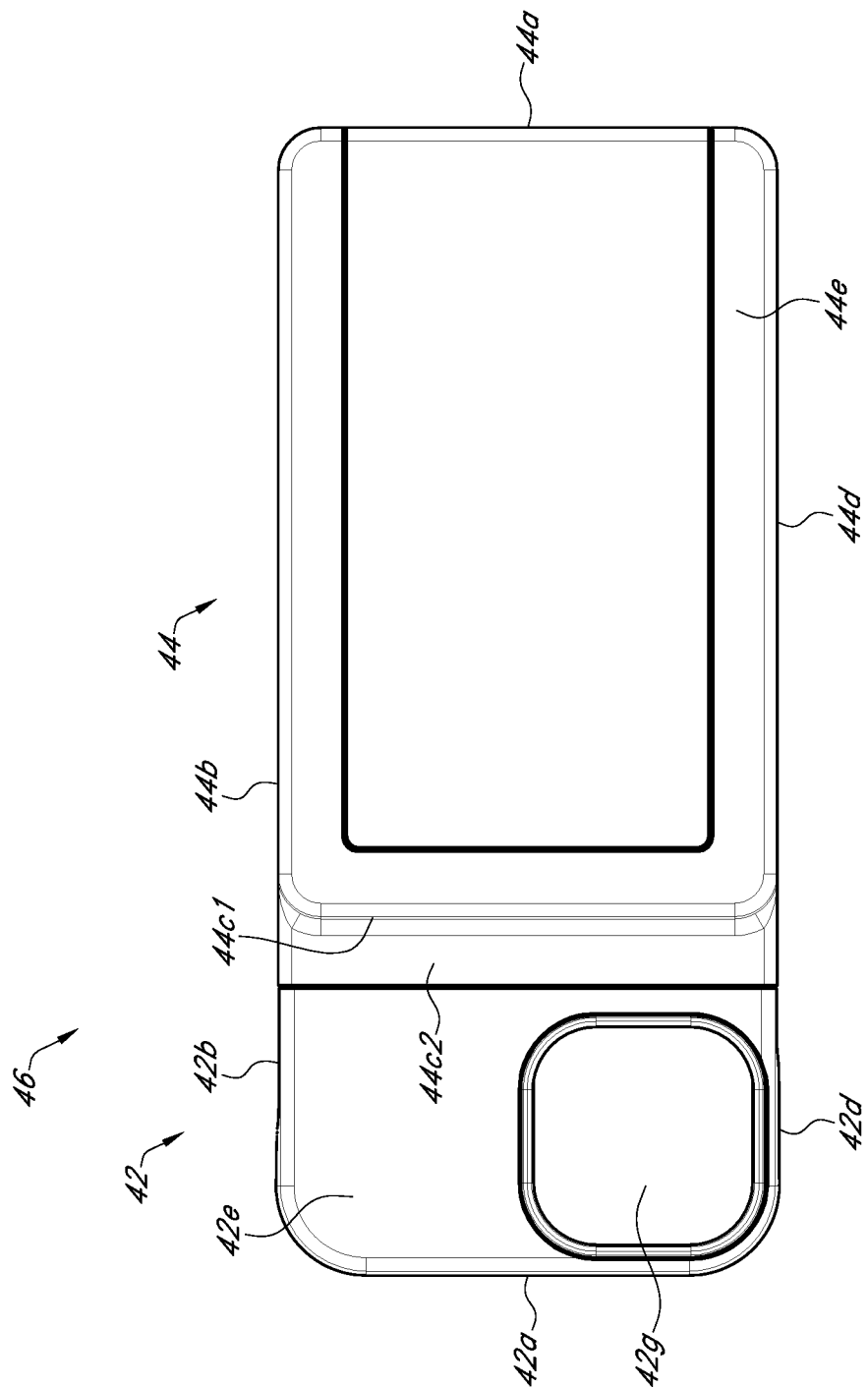
FIG. 60 is a bottom-plan view of the case assembly of FIG. 58.

Turning to FIG. 60, depicted therein is a bottom-plan view of case assembly 40.

Figure 61:
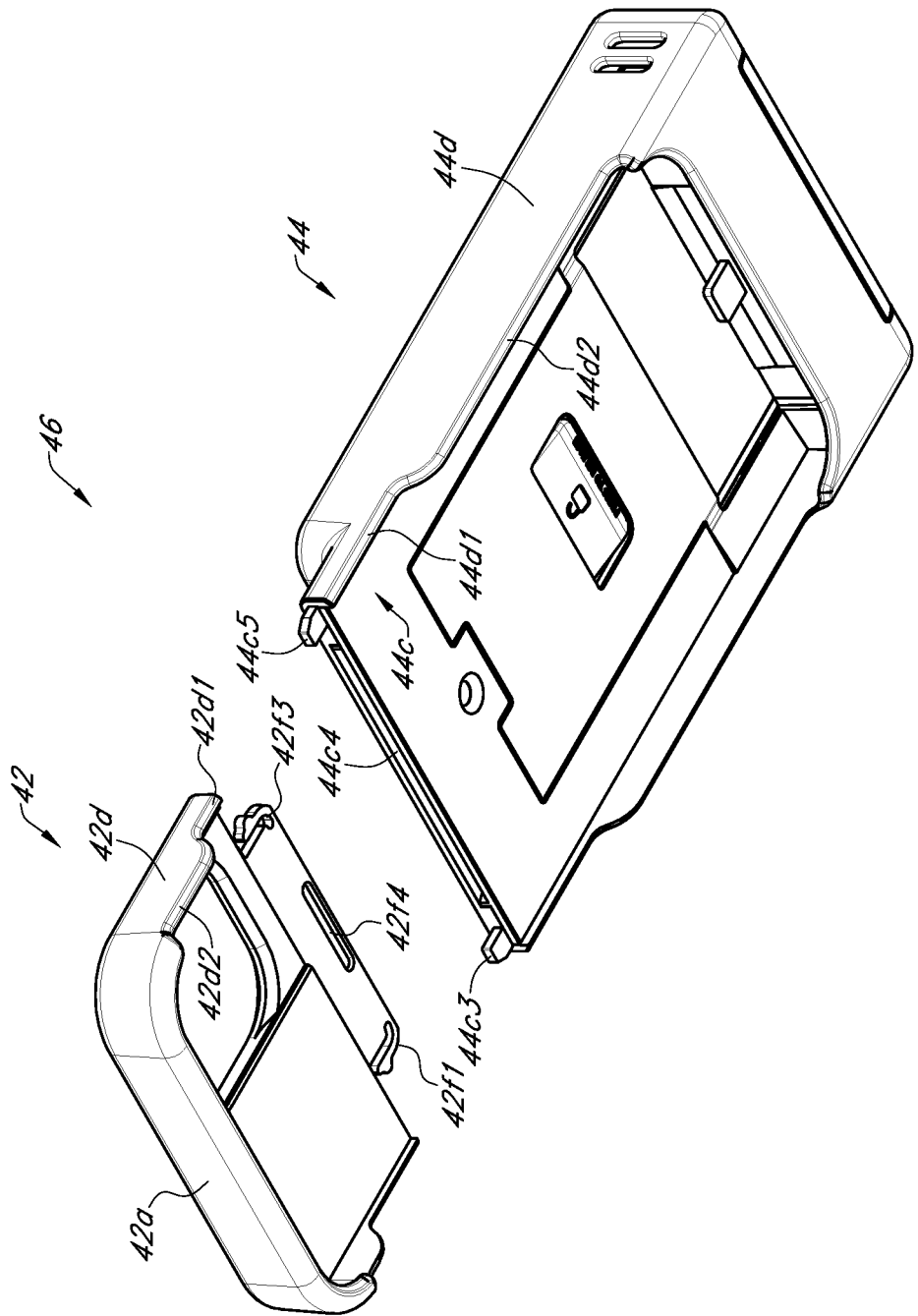
FIG. 61 is a partial-exploded-front-top-perspective view of the case assembly of FIG. 58.

Turning to FIG. 61, depicted therein is a partial-exploded-front-top-perspective view of case assembly 40. Depicted implementation of tab member 42f is shown to include recess 42f4.

Figure 62:
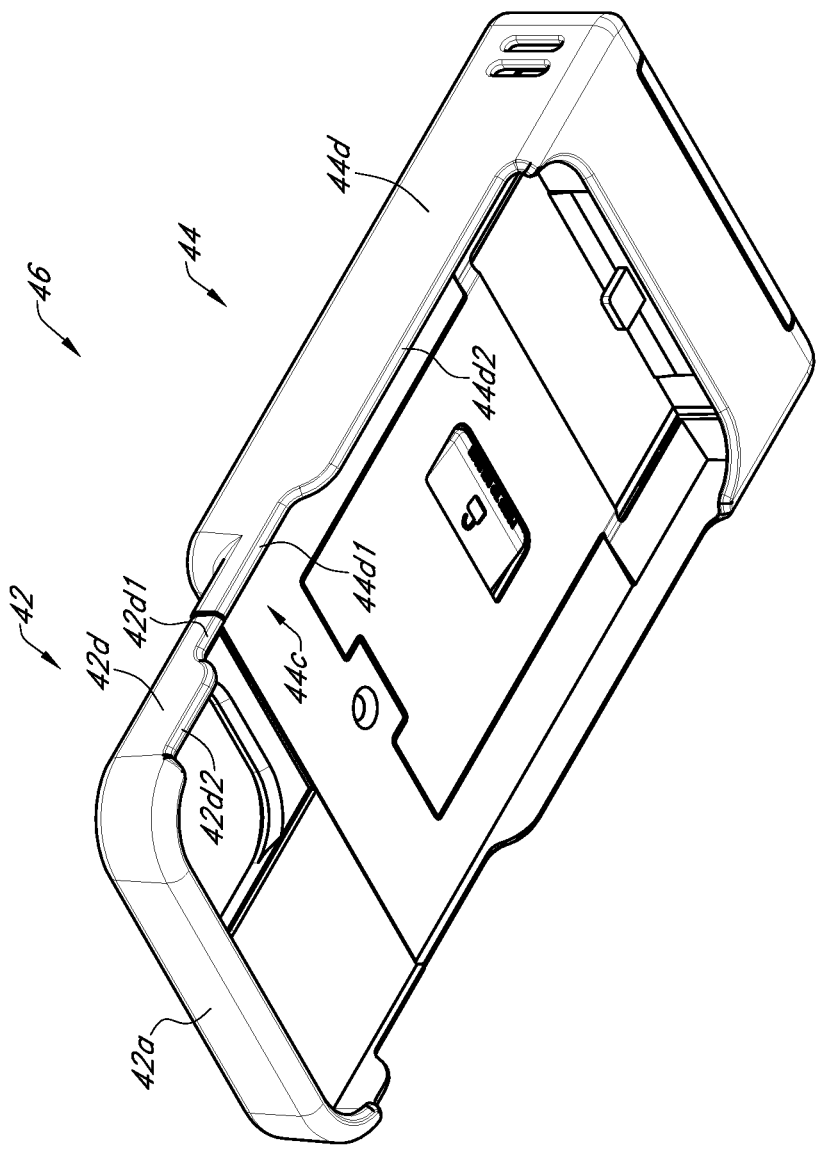
FIG. 62 is a front-top-perspective view of the case assembly of FIG. 58.

Turning to FIG. 62, depicted therein is a front-top-perspective view of case assembly 40.

Figure 63:
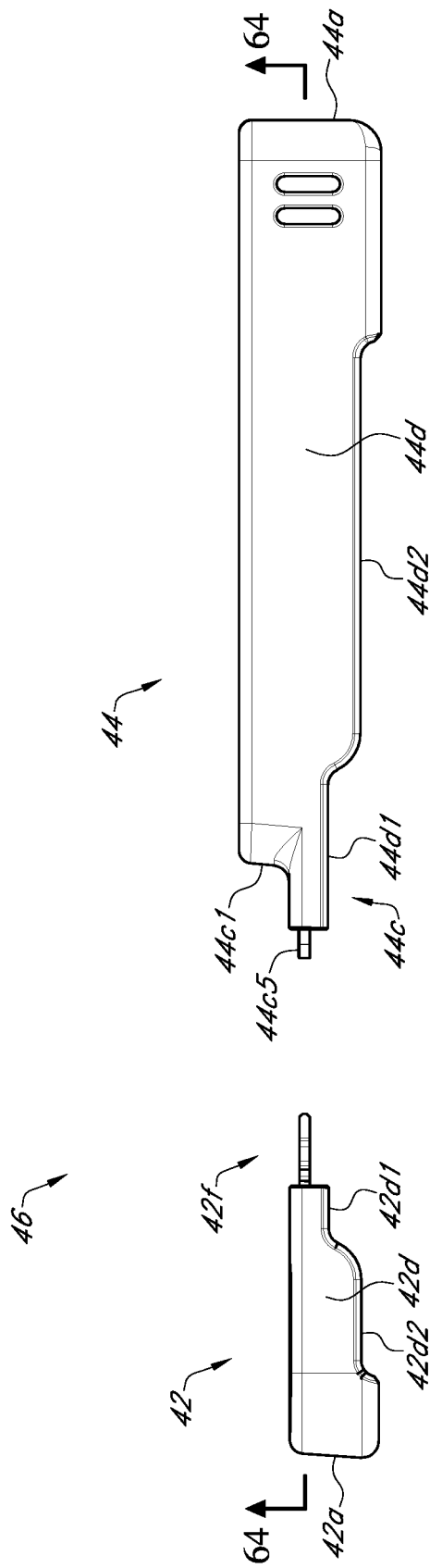
FIG. 63 is a partial-exploded-side-elevational view of the case assembly of FIG. 58.

Turning to FIG. 63, depicted therein is a partial-exploded-side-elevational view of case assembly 40.

Figure 64:
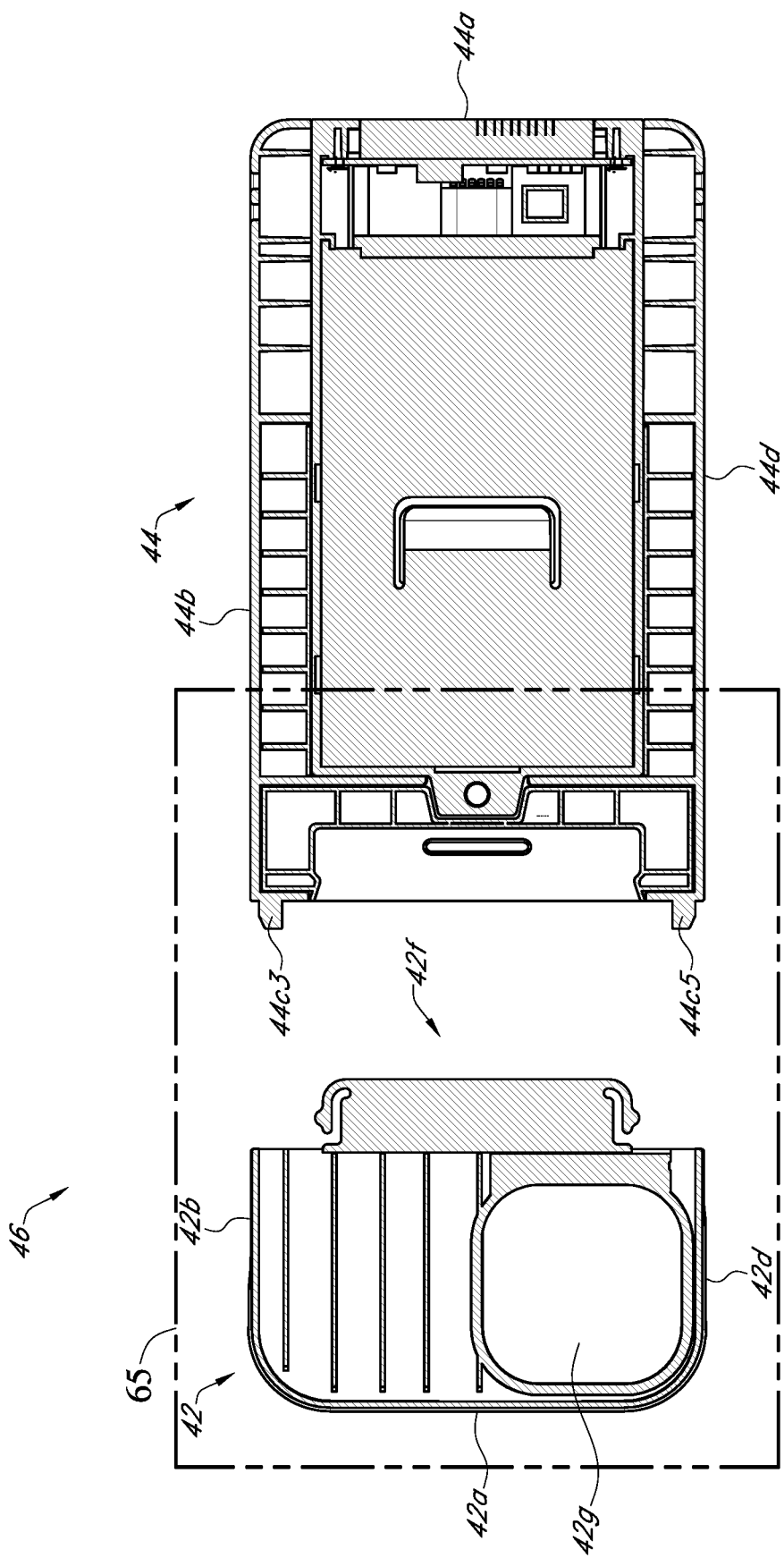
FIG. 64 is a partial-exploded-cross-sectional-bottom-plan view of the case assembly of FIG. 58 taken along the 64-64 cutline of FIG. 63.

Turning to FIG. 64, depicted therein is a partial-exploded-cross-sectional-bottom-plan view of case assembly 40 taken along the 64-64 cutline of FIG. 63.

Figure 65:
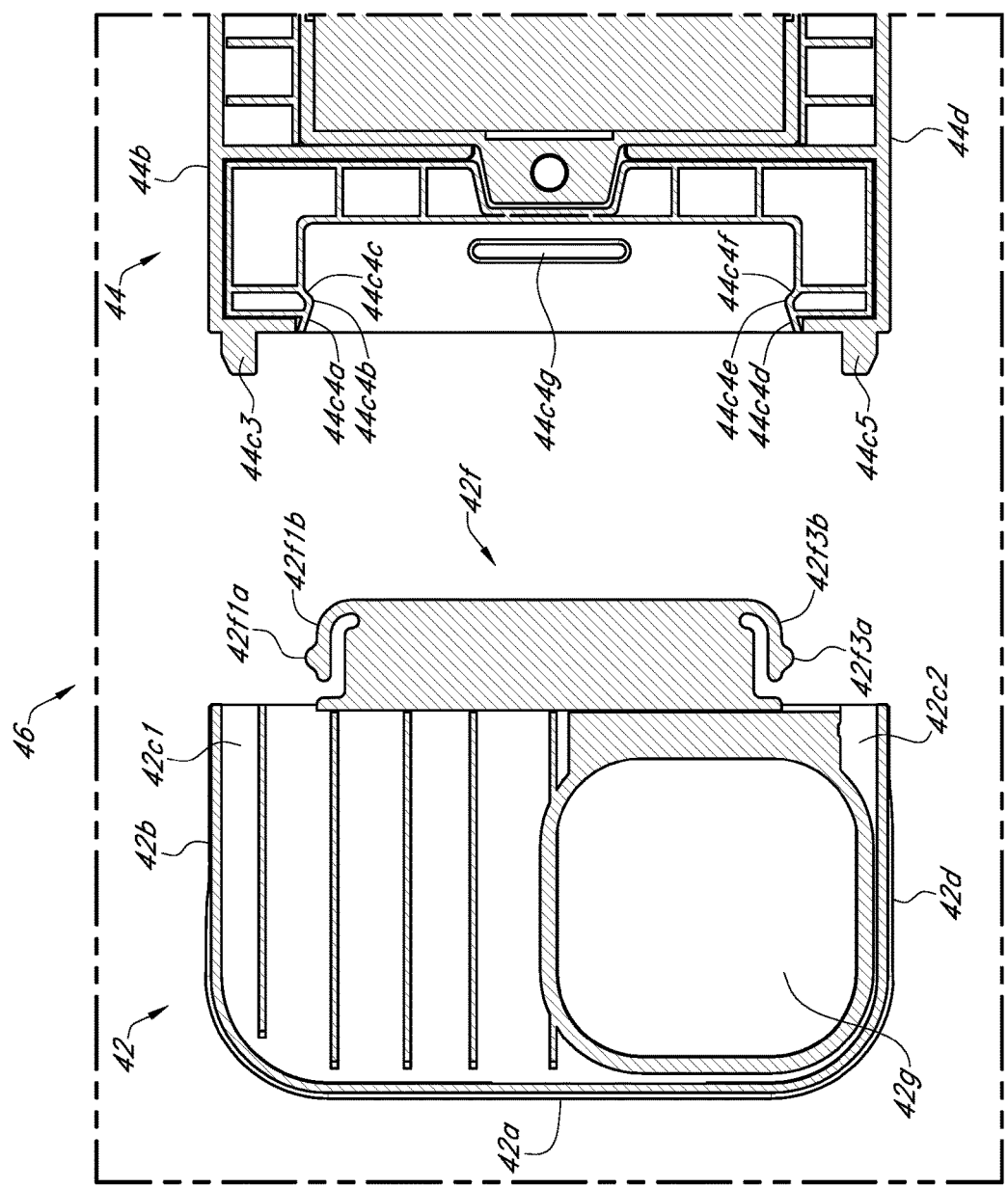
FIG. 65 is a portion of the partial-exploded-cross-sectional-bottom-plan view of the case assembly of FIG. 58 taken along the 65 dashed-line area of FIG. 64.

Turning to FIG. 65, depicted therein is a portion of the partial-exploded-cross-sectional-bottom-plan view of case assembly 40 taken along the 65 dashed-line area of FIG. 64. Depicted implementation of edge 42c is shown to include aperture 42c1, and aperture 42c2. Depicted implementation of tab member 42f is shown to include barb 42f1a, curvilinear member 42f1b, barb 42f3a, and curvilinear member 42f3b.

Depicted implementation of aperture 44c4 is shown to include front slope 44c4a, peak 44c4b, rear slope 44c4c, front slope 44c4d, peak 44c4e, rear slope 44c4f, and protrusion 44c4g. As depicted, aperture 44c4 is configured to receive semi-flexible protrusion 42f1, tab body 42f2, and semi-flexible protrusion 42f3 of tab member 42f when cap assembly 42 and main assembly 44 are coupled together.

Figure 66:
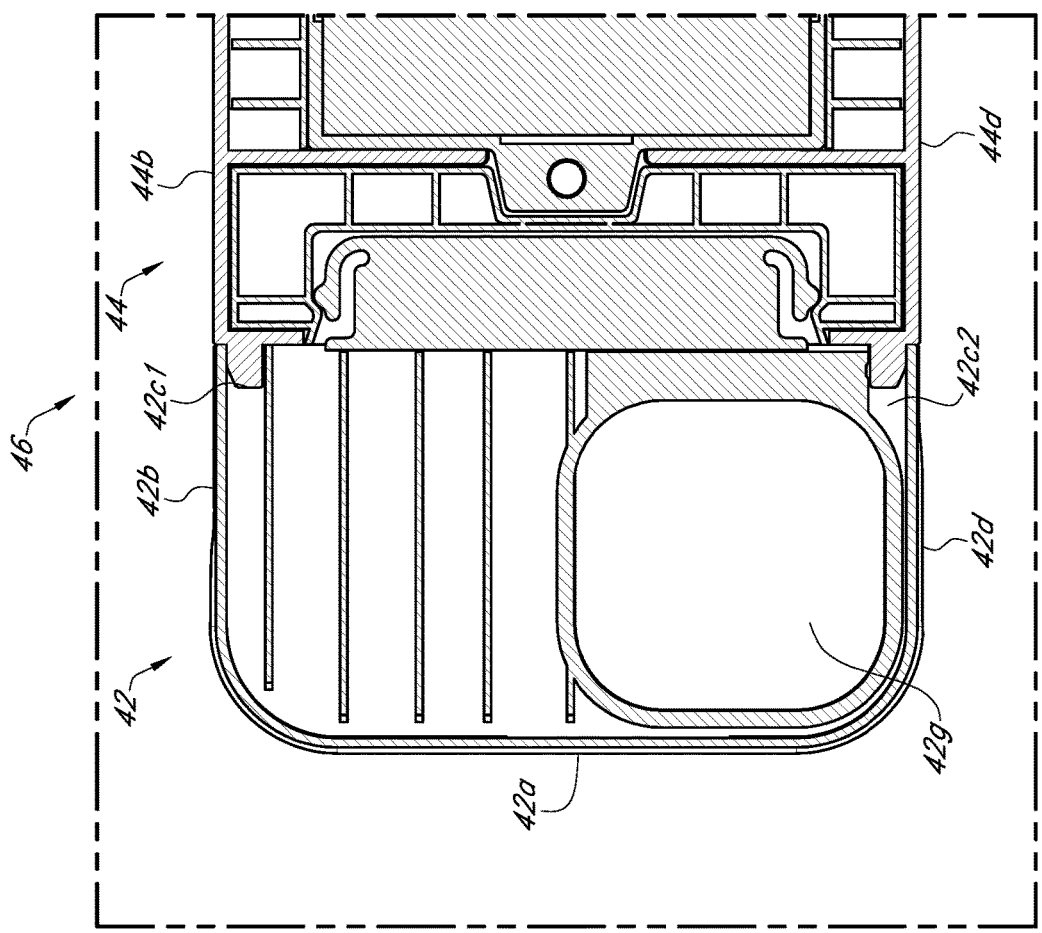
FIG. 66 is a cross-sectional-bottom-plan view of a portion of the case assembly of FIG. 58.

Turning to FIG. 66, depicted therein is a cross-sectional-bottom-plan view of a portion of case assembly 40.

Figure 67:
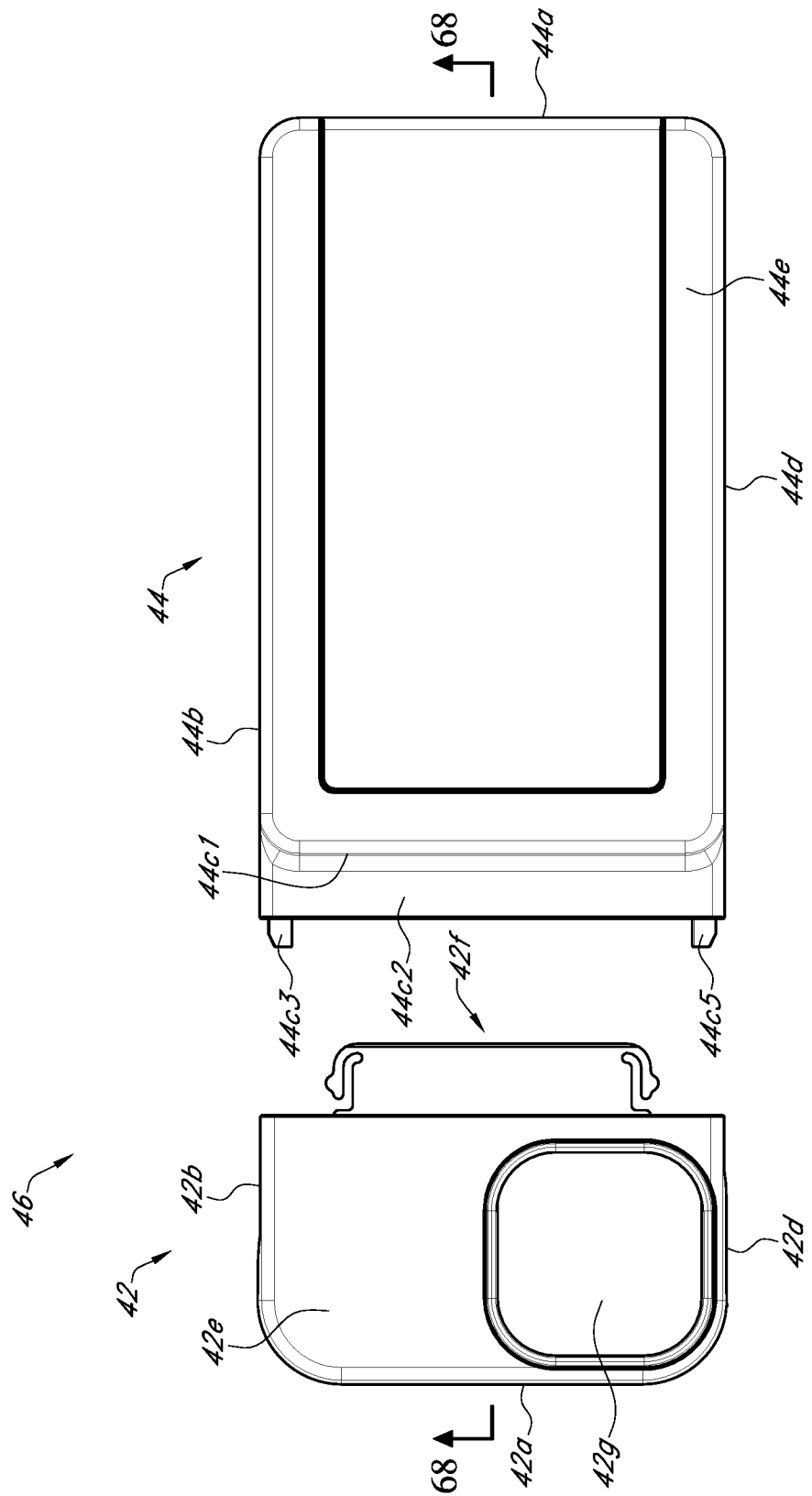
FIG. 67 is a portion of a bottom-plan view of the case assembly of FIG. 58 of FIG. 64.

Turning to FIG. 67, depicted therein is a portion of a bottom-plan view of case assembly 40.

Figure 68:
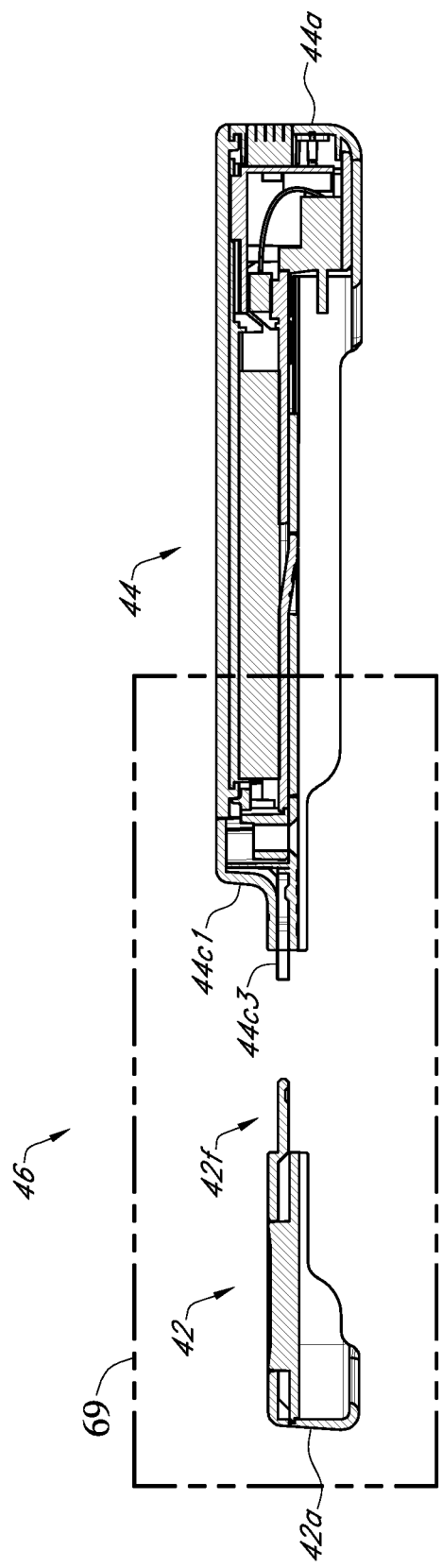
FIG. 68 is a partial-exploded-cross-sectional-side-elevational view of the case assembly of FIG. 58 taken along the 68-68 cutline of FIG. 67.

Turning to FIG. 68, depicted therein is a partial-exploded-cross-sectional-side-elevational view of case assembly 40 taken along the 68-68 cutline of FIG. 67.

Figure 69:
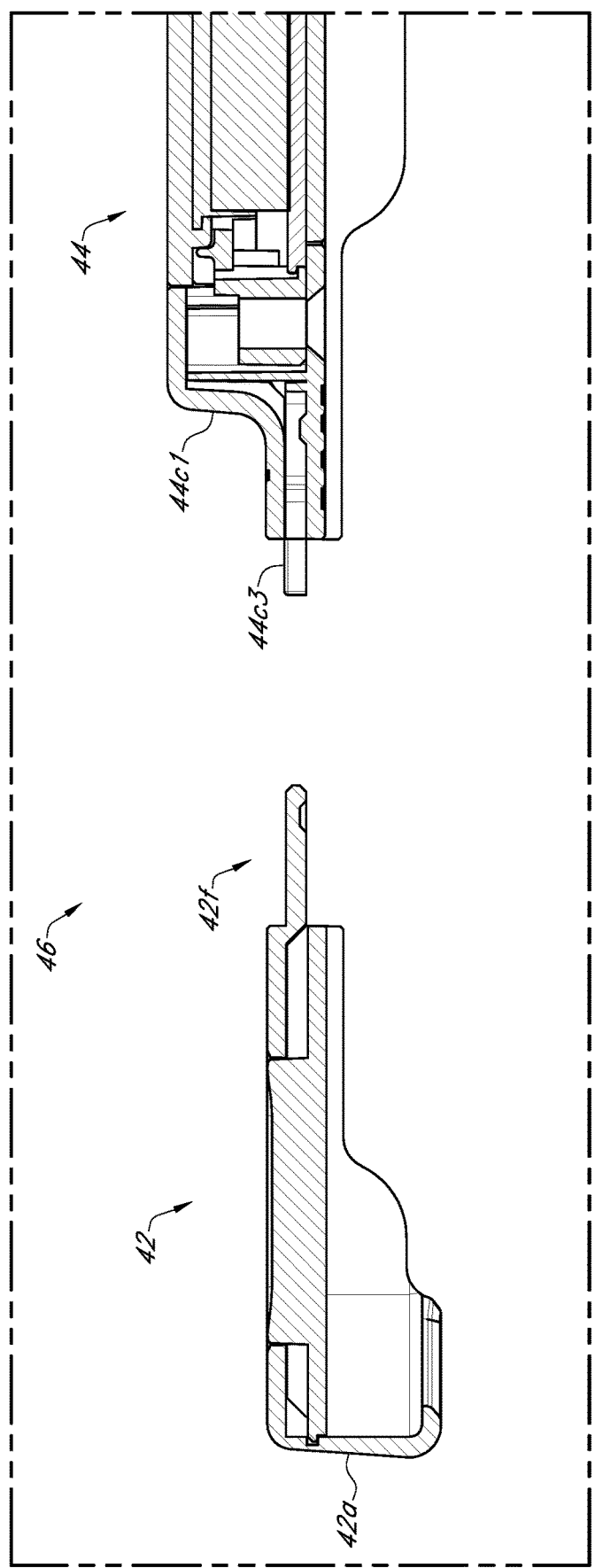
FIG. 69 is a portion of the partial-exploded-cross-sectional-side-elevational view of the case assembly of FIG. 58 taken along the 69 dashed-line area of FIG. 68.

Turning to FIG. 69, depicted therein is a portion of the partial-exploded-cross-sectional-side-elevational view of case assembly 40 taken along the 69 dashed-line area of FIG. 68.

Figure 70:
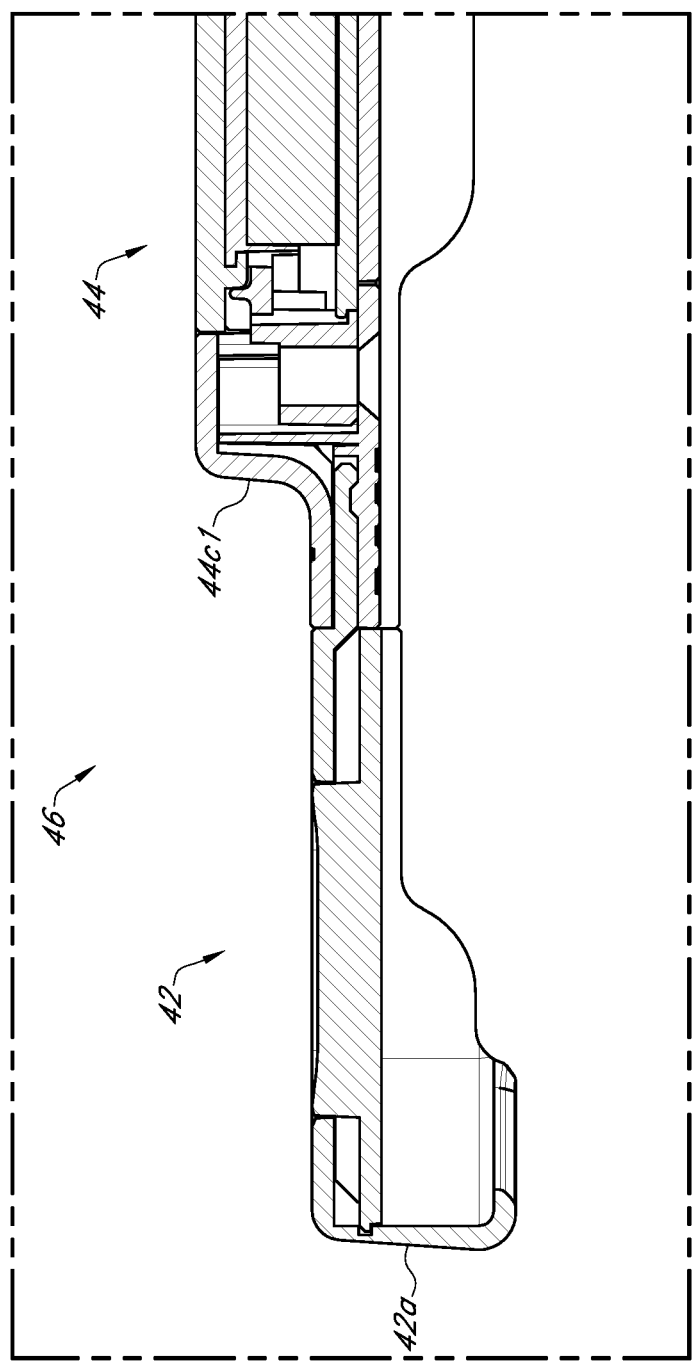
FIG. 70 is a portion of a cross-sectional-side-elevational view of the case assembly of FIG. 58.

Turning to FIG. 70, depicted therein is a portion of a cross-sectional-side-elevational view of case assembly 40.

Figure 71:
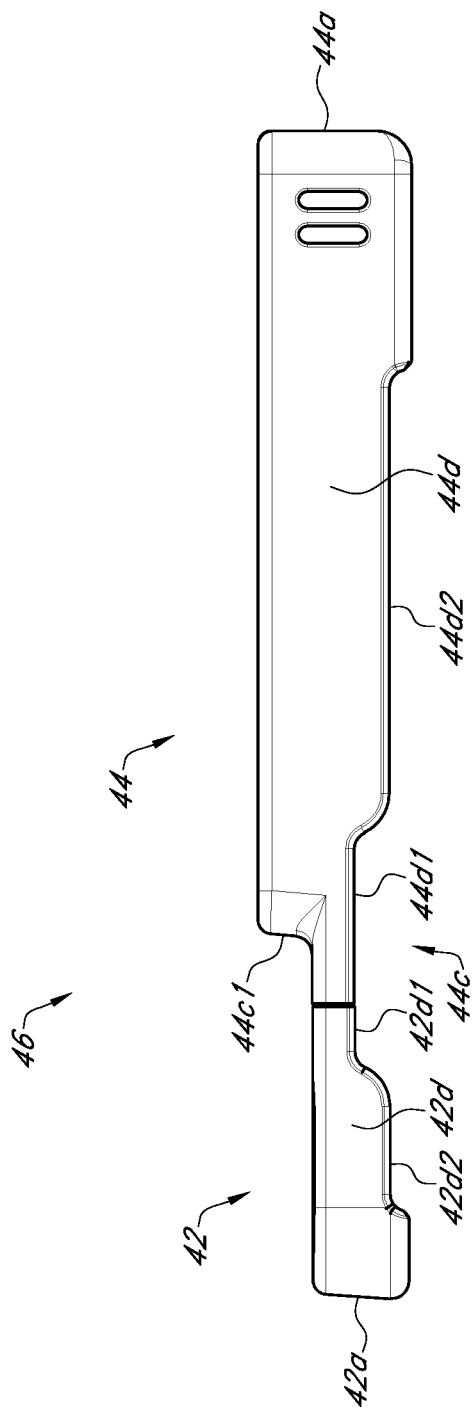
FIG. 71 is a side-elevational view of the case assembly of FIG. 58.

Turning to FIG. 71, depicted therein is a side-elevational view of case assembly 40.

Figure 72:
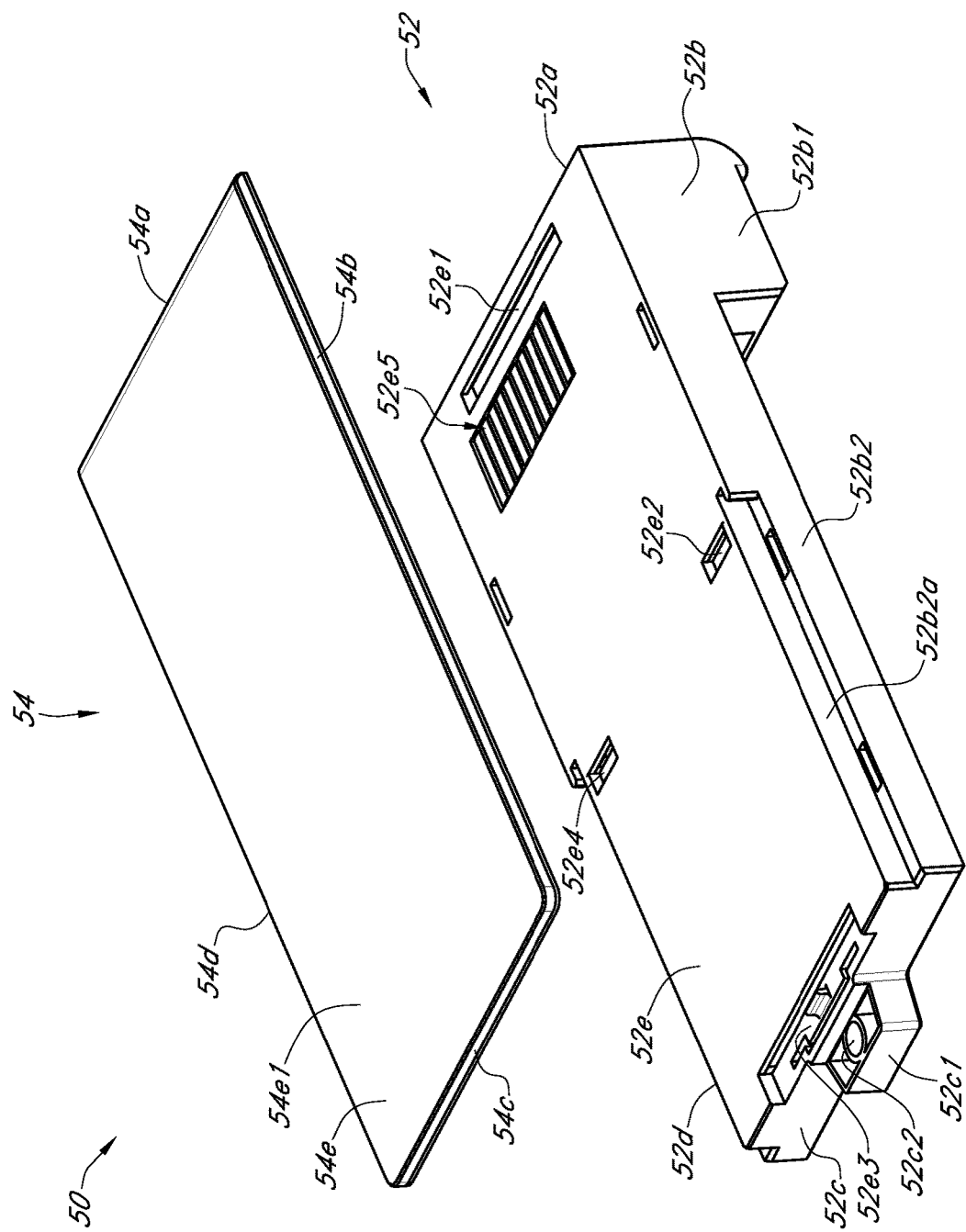
FIG. 72 is an exploded front-bottom-perspective view of an accessory assembly.

Turning to FIG. 72, depicted therein is an exploded front-bottom-perspective view of accessory assembly 50. Depicted implementation of accessory assembly 50 is shown to include main assembly 52, and cover assembly 54. Depicted implementation of main assembly 52 is shown to include side 52a, side 52b, side 52c, side 52d, and back side 52e. Depicted implementation of side 52b is shown to include base portion 52b1, extended portion 52b2, and elongated groove 52b2a, which can be seen as having an L-shaped side profile. Depicted implementation of side 52c is shown to include protrusion 52c1, and aperture 52c2. Depicted implementation of back side 52e is shown to include notch 52e1, notch 52e2, notch 52e3, notch 52e4, and electric contacts interface 52e5. Depicted implementation of cover assembly 54 is shown to include side 54a, side 54b, side 54c, side 54d, base 54e, and exterior side 54e1. In implementations, accessory assembly 50 can include various service functions for portable electronic device 100 such as storage of electrical power and electronic-based communication.

Figure 73:
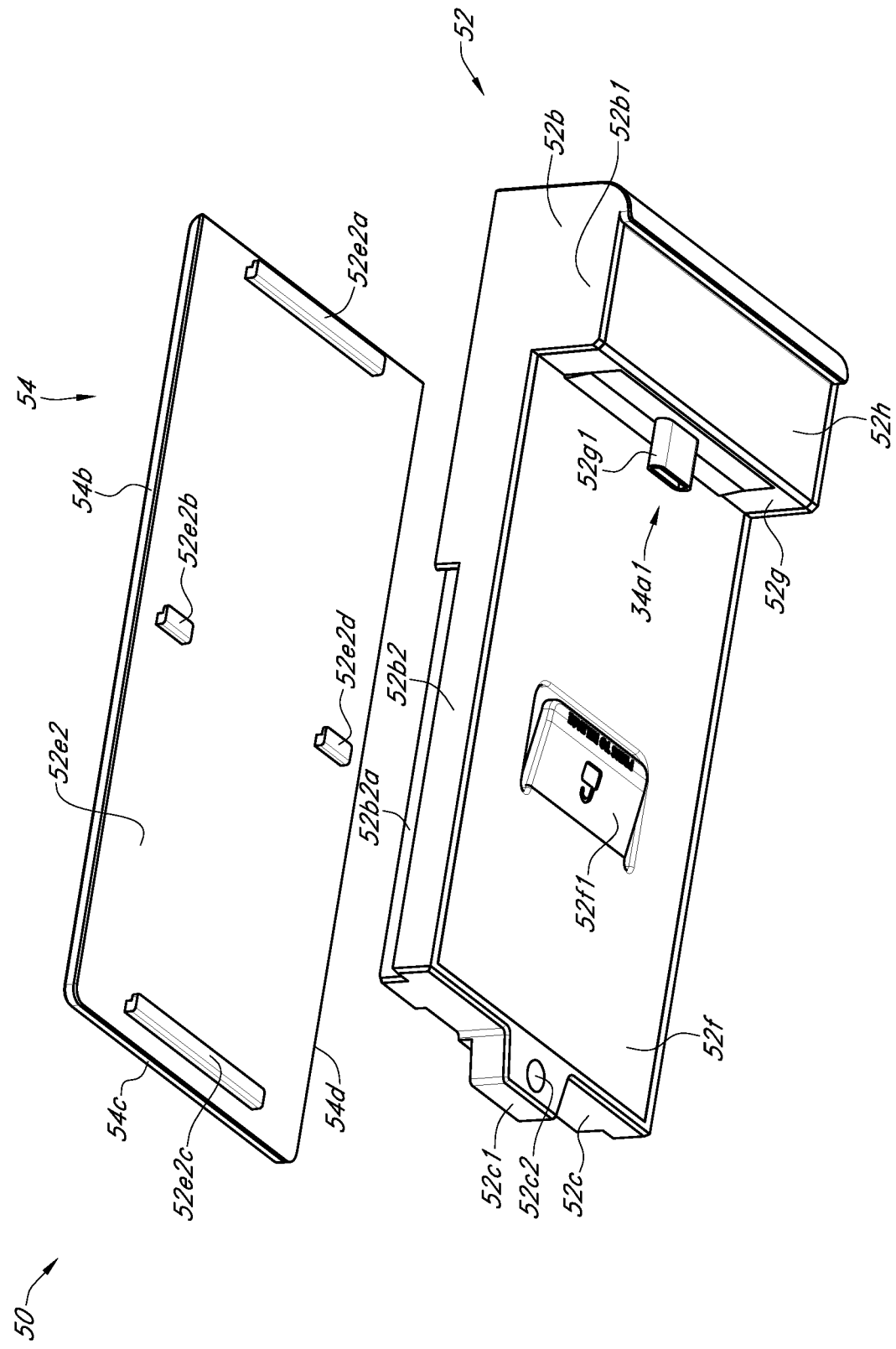
FIG. 73 is an exploded front-top-perspective view of the accessory assembly of FIG. 72.

Turning to FIG. 73, depicted therein is an exploded front-top-perspective view of accessory assembly 50. Depicted implementation of back side 52e is shown to include notch 52e2, protrusion 52e2a, protrusion 52e2b, protrusion 52e2c, and protrusion 52e2d. Depicted implementation of main assembly 52 is shown to include front portion 52f with hinged tab 52f1, coupling side 52g with electric plug 52g1, and front portion 52h.

Figure 74:
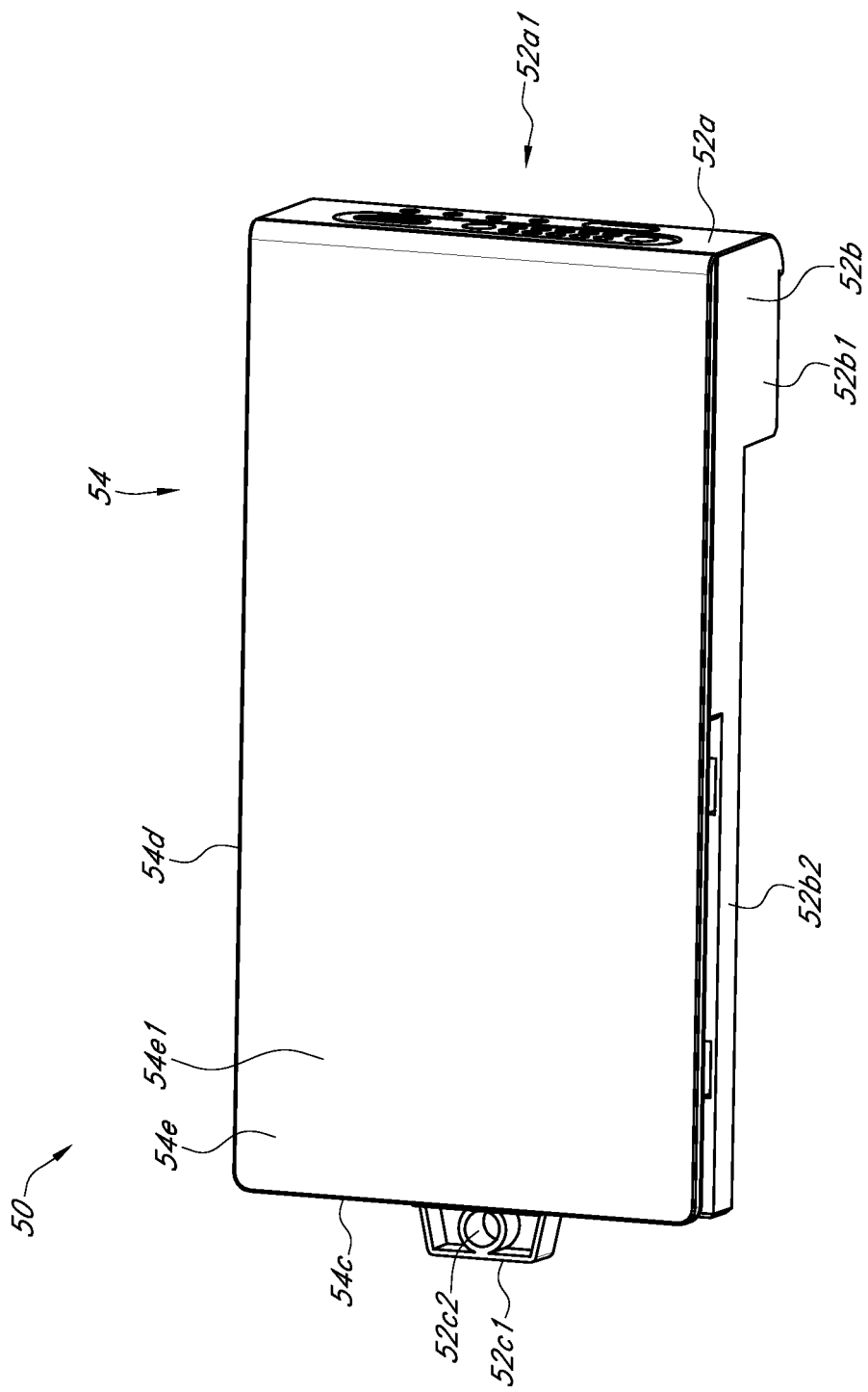
FIG. 74 is a bottom-perspective view of the accessory assembly of FIG. 72.

Turning to FIG. 74, depicted therein is a bottom-perspective view of accessory assembly 50. Depicted implementation of main assembly 52 is shown to include exterior electric interface 52a1.

Figure 75:
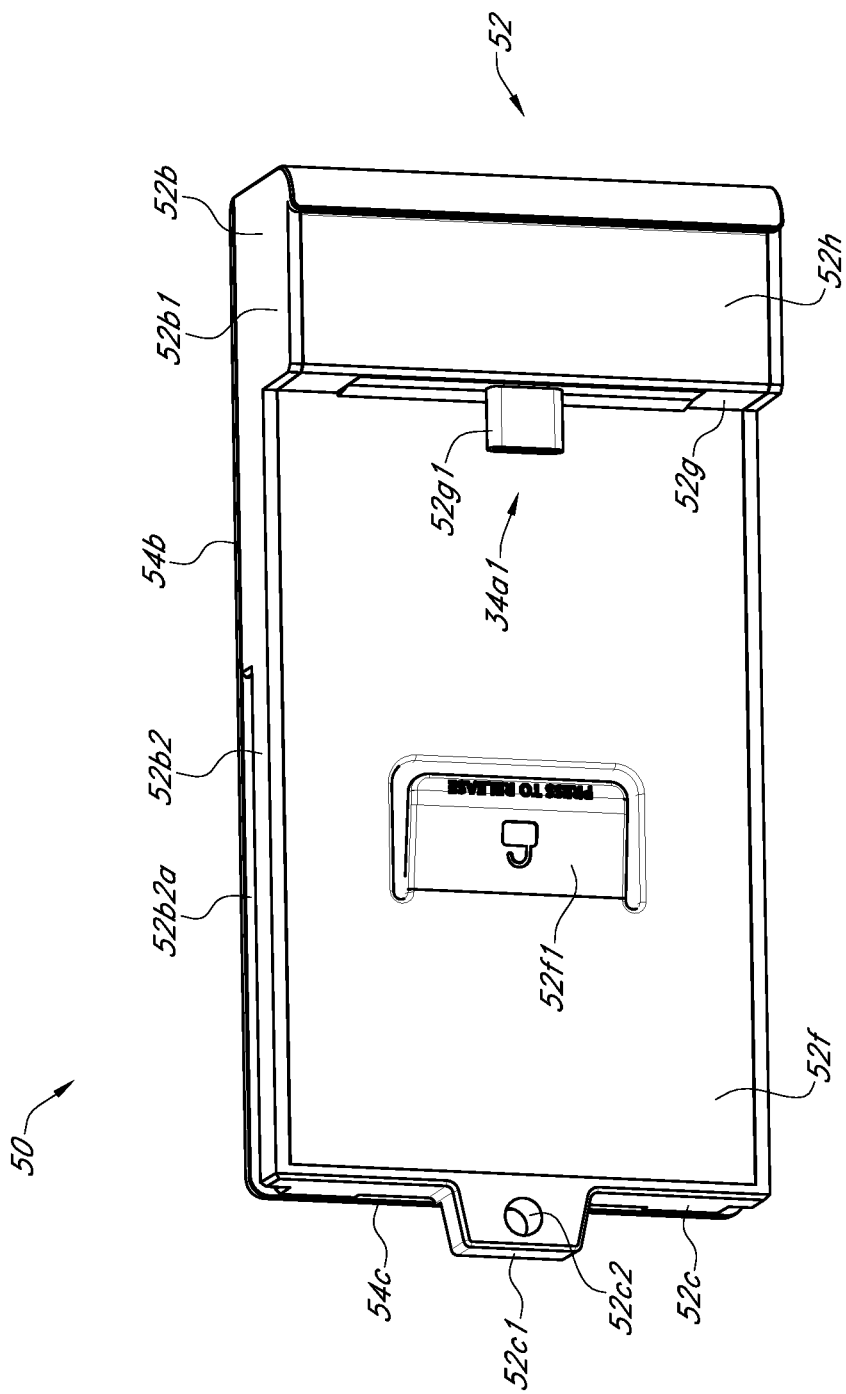
FIG. 75 is a top-perspective view of the accessory assembly of FIG. 72.

Turning to FIG. 75, depicted therein is a top-perspective view of accessory assembly 50.

Figure 76:
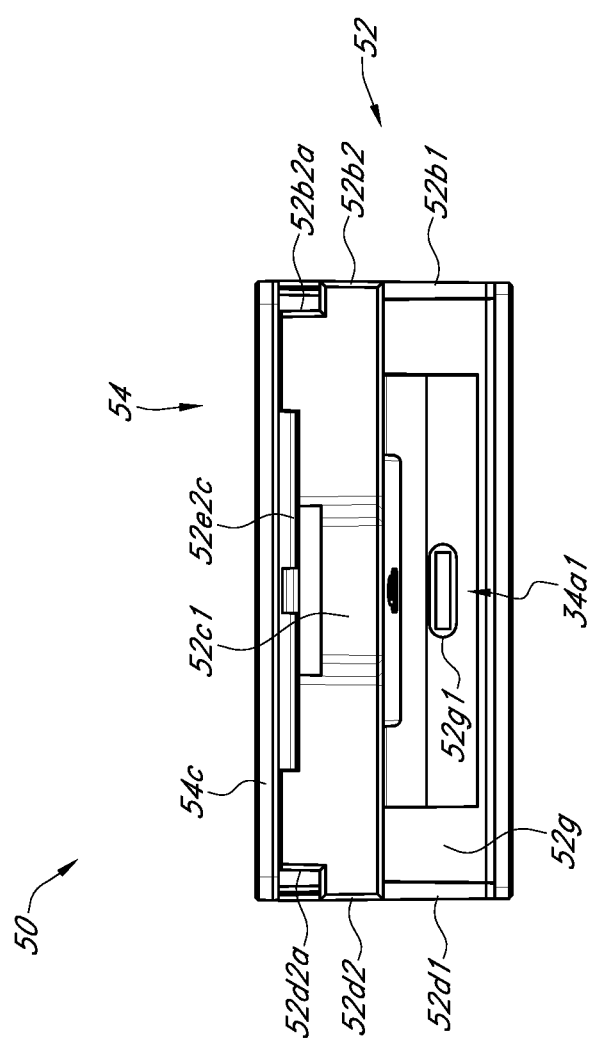
FIG. 76 is a front-elevational view of the accessory assembly of FIG. 72.

Turning to FIG. 76, depicted therein is a front-elevational view of accessory assembly 50. Depicted implementation of main assembly 52 is shown to include base portion 52d1, extended portion 52d2, and elongated groove 52d2a.

Figure 77:
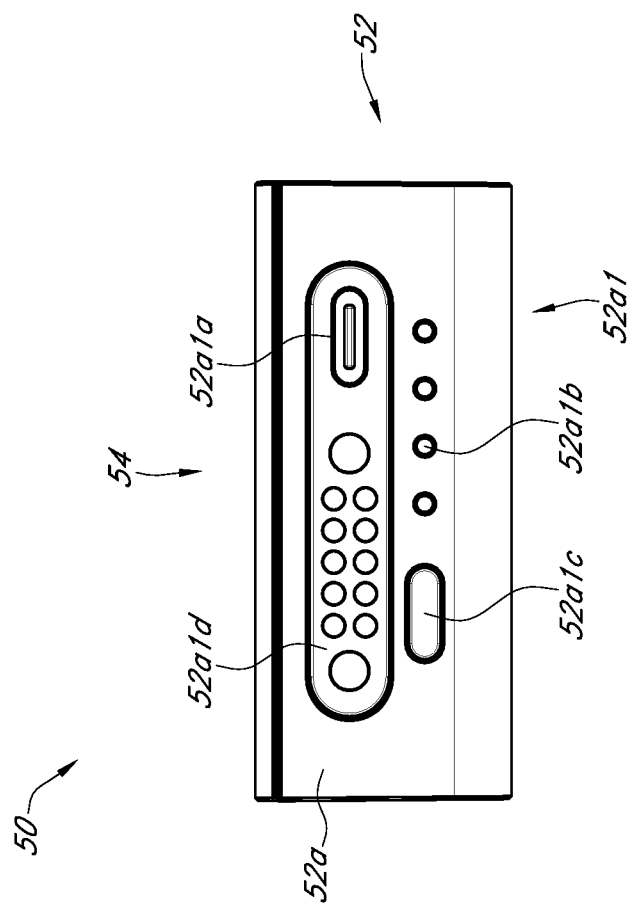
FIG. 77 is a rear-elevational view of the accessory assembly of FIG. 72.

Turning to FIG. 77, depicted therein is a rear-elevational view of accessory assembly 50. Depicted implementation of exterior electric interface 52a1 is shown to include interface portion 52a1a, interface portion 52a1b, interface portion 52a1c, and interface portion 52a1d.

Figure 78:
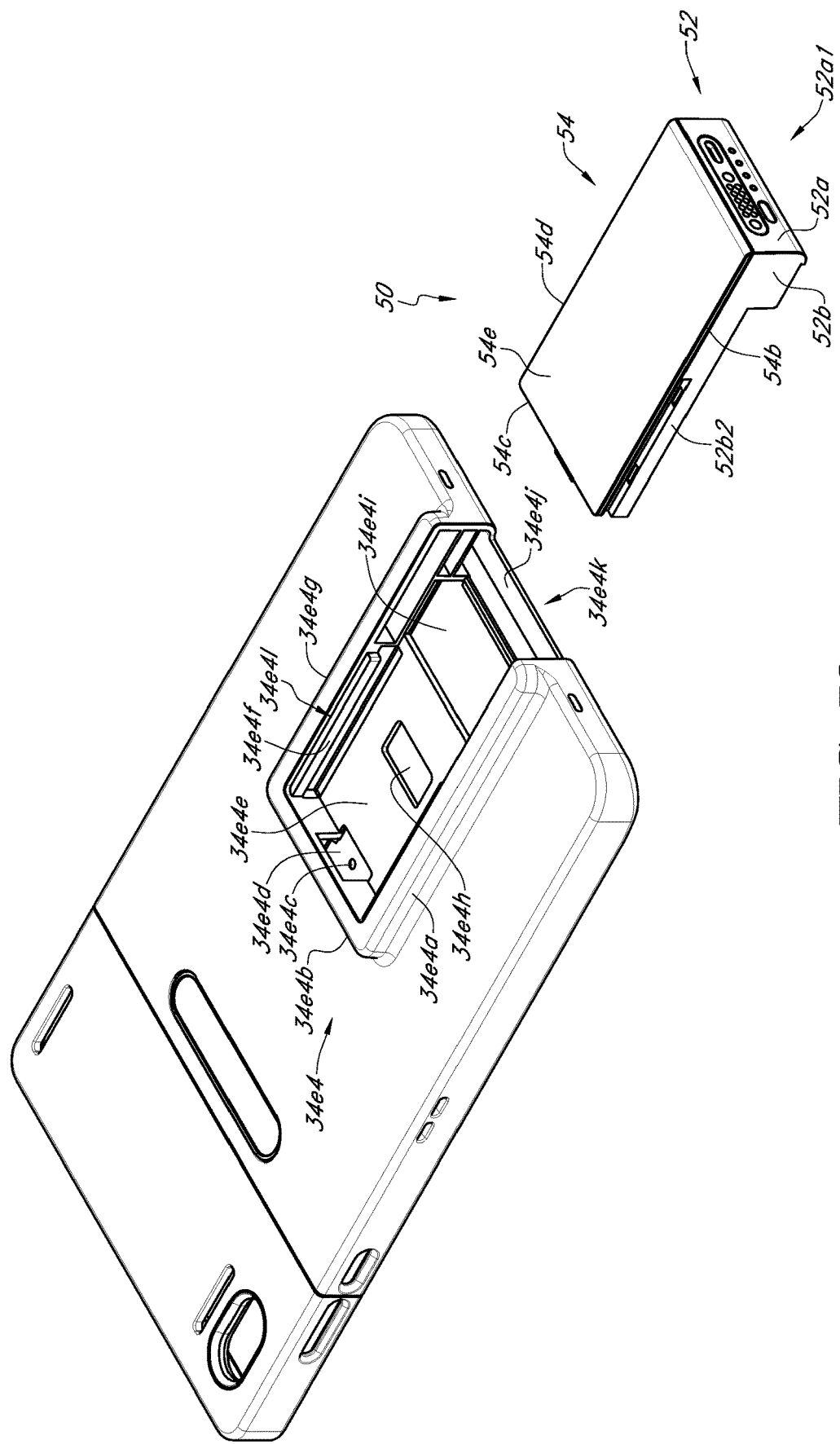
FIG. 78 is a rear-bottom perspective view of the accessory assembly of FIG. 72 uncoupled from the case assembly of FIG. 24.

Turning to FIG. 78, depicted therein is a rear-bottom perspective view of accessory assembly 50 uncoupled from device case assembly 30. Depicted implementation of coupler assembly 34e4 is shown to include side wall 34e4a, side wall 34e4b, aperture 34e4c, aperture 34e4d, raised base portion 34e4e, elongated protrusion 34e4f, side wall 34e4g, aperture 34e4h, aperture 34e4i, recessed base portion 34e4j, opening 34e4k, and interior area 34e4l. As depicted, interior area 34e4l is in part bounded by side wall 34e4a, side wall 34e4b, raised base portion 34e4e, side wall 34e4g, and recessed base portion 34e4j to couple with accessory assembly 50.

Figure 79:
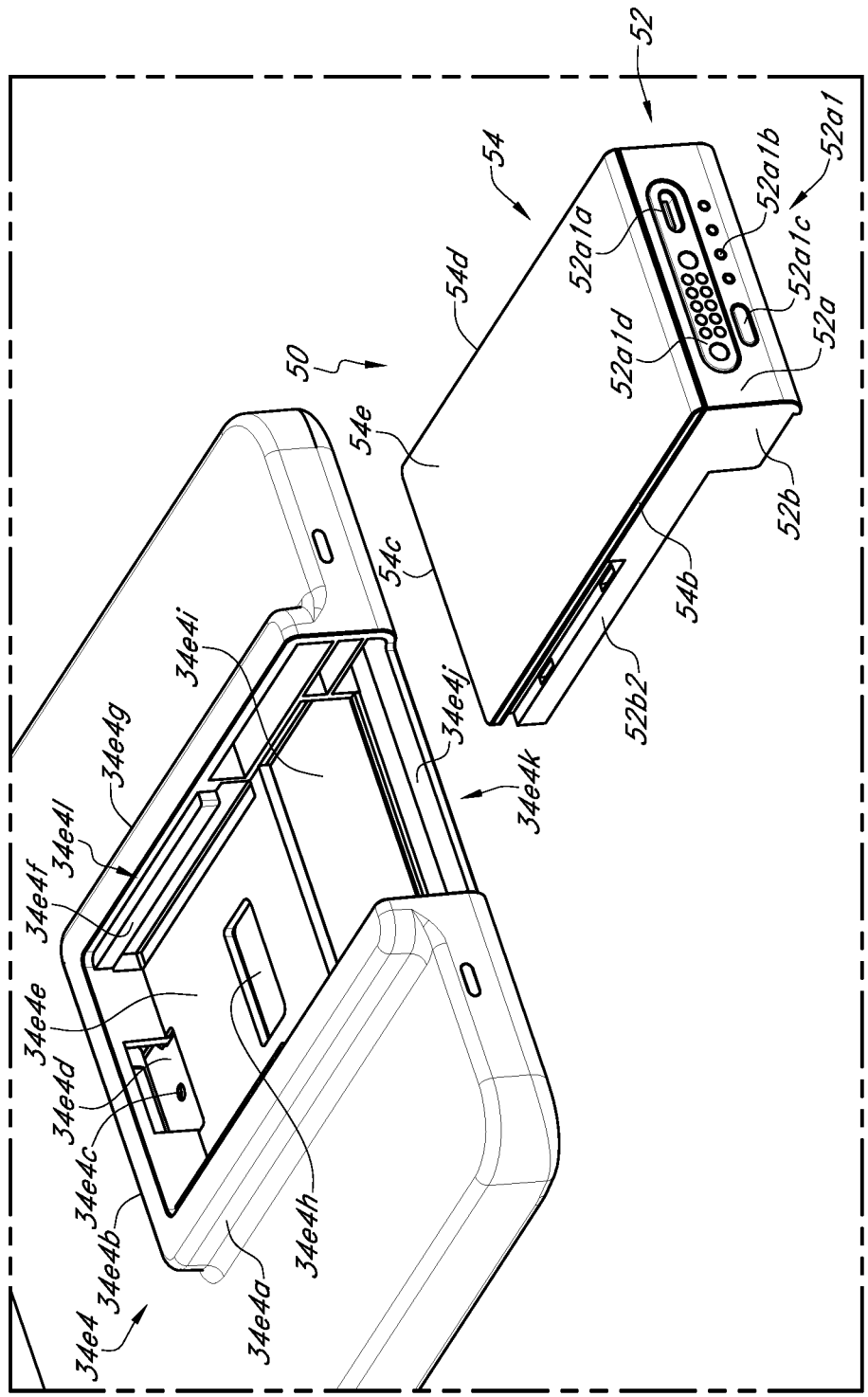
FIG. 79 is a rear-bottom perspective view of the accessory assembly of FIG. 72 uncoupled from a portion of the case assembly of FIG. 24.

Turning to FIG. 79, depicted therein is a rear-bottom perspective view of accessory assembly 50 uncoupled from a portion of device case assembly 30.

Figure 80:
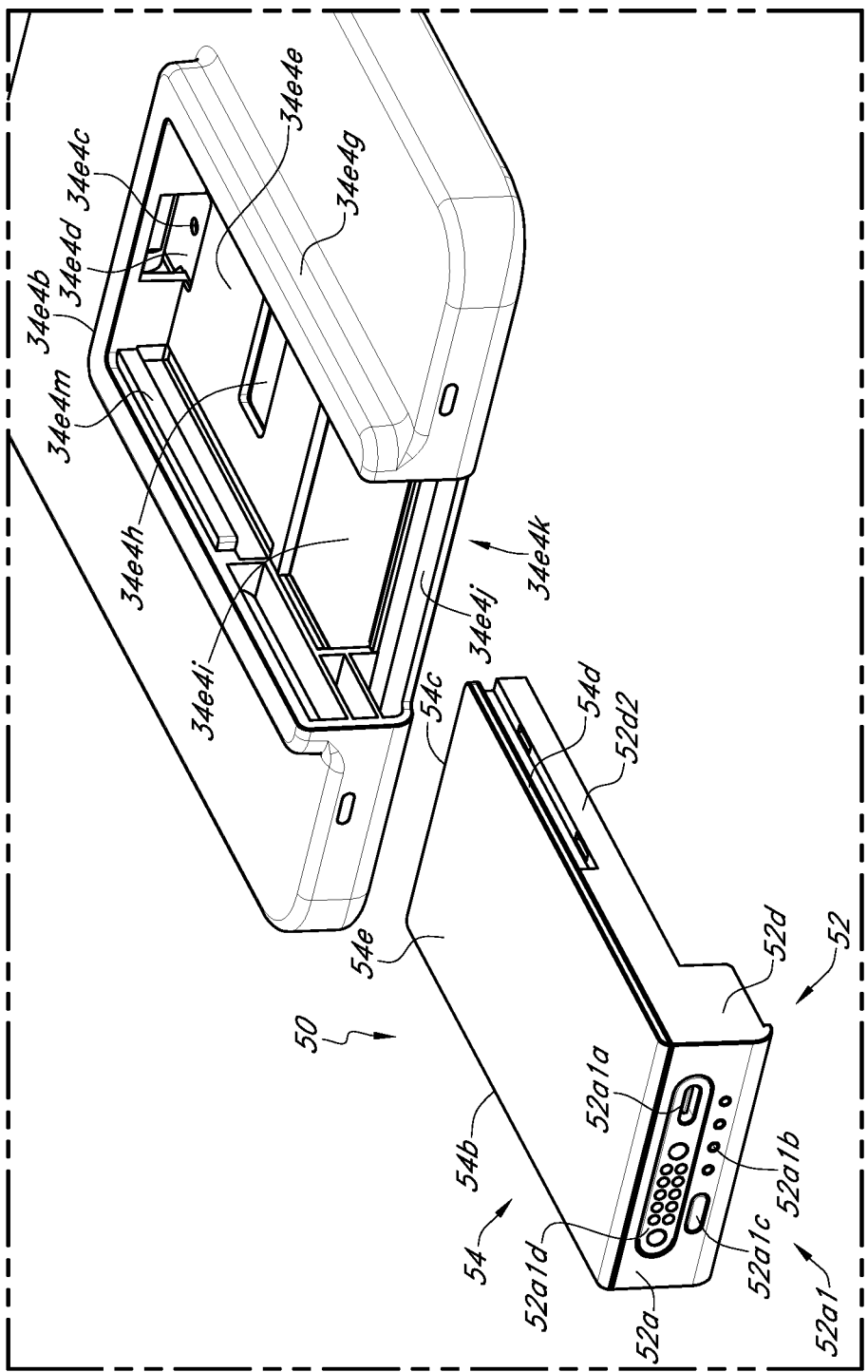
FIG. 80 is a rear-bottom perspective view of the accessory assembly of FIG. 72 uncoupled from a portion of the case assembly of FIG. 24.

Turning to FIG. 80, depicted therein is a rear-bottom perspective view of accessory assembly 50 uncoupled from a portion of device case assembly 30. Depicted implementation of coupler assembly 34e4 is shown to include elongated protrusion 34e4m.

Figure 81:
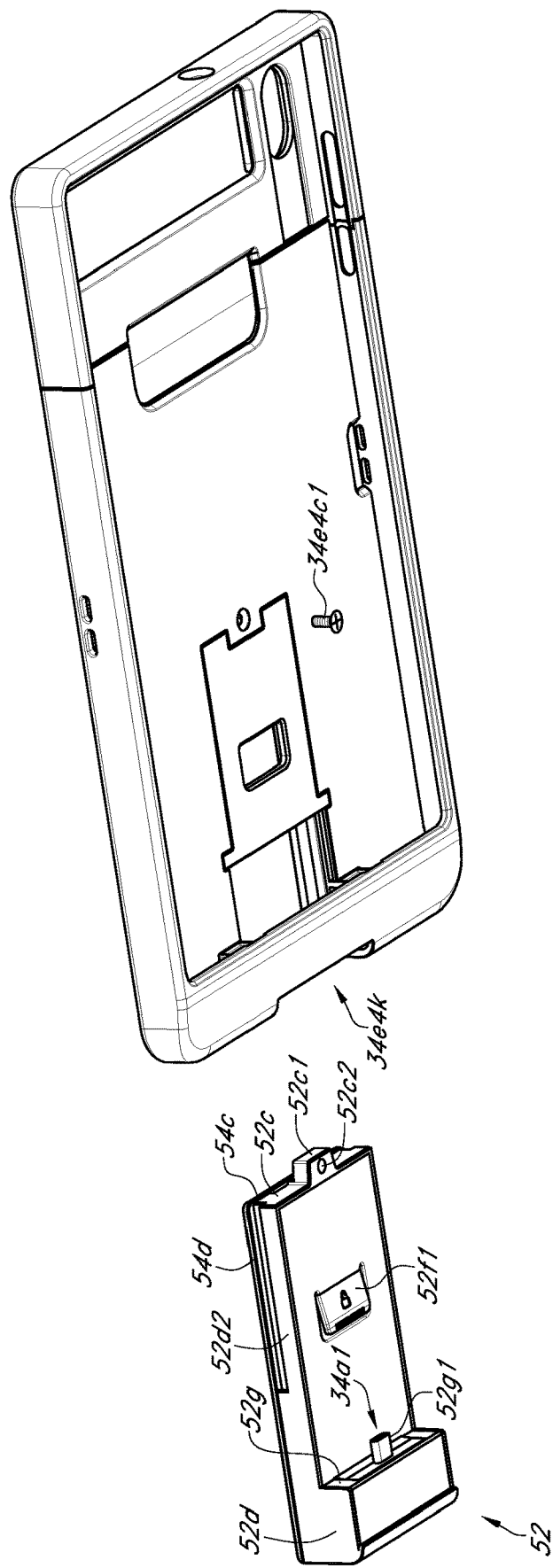
FIG. 81 is a front-top perspective view of the accessory assembly of FIG. 72 uncoupled from the case assembly of FIG. 24.

Turning to FIG. 81, depicted therein is a front-top perspective view of accessory assembly 50 uncoupled from device case assembly 30. Depicted implementation of aperture 34e4c is shown to include threaded coupler 34e4c1.

Figure 82:
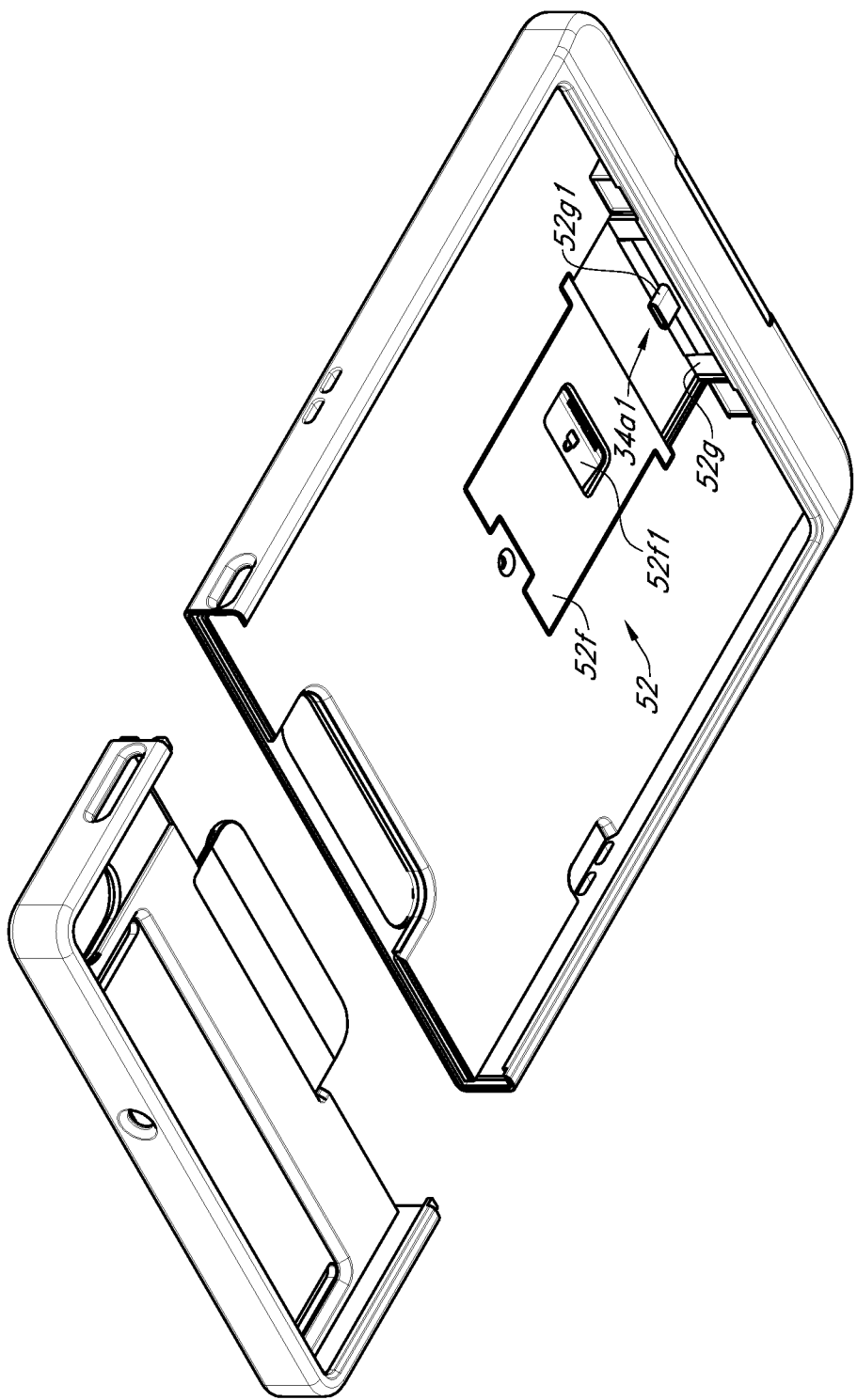
FIG. 82 is a front-top perspective view of the accessory assembly of FIG. 72 coupled with a portion of an exploded view of the case assembly of FIG. 24.

Turning to FIG. 82, depicted therein is a front-top perspective view of accessory assembly 50 coupled with a portion of an exploded view of device case assembly 30.

Figure 83:
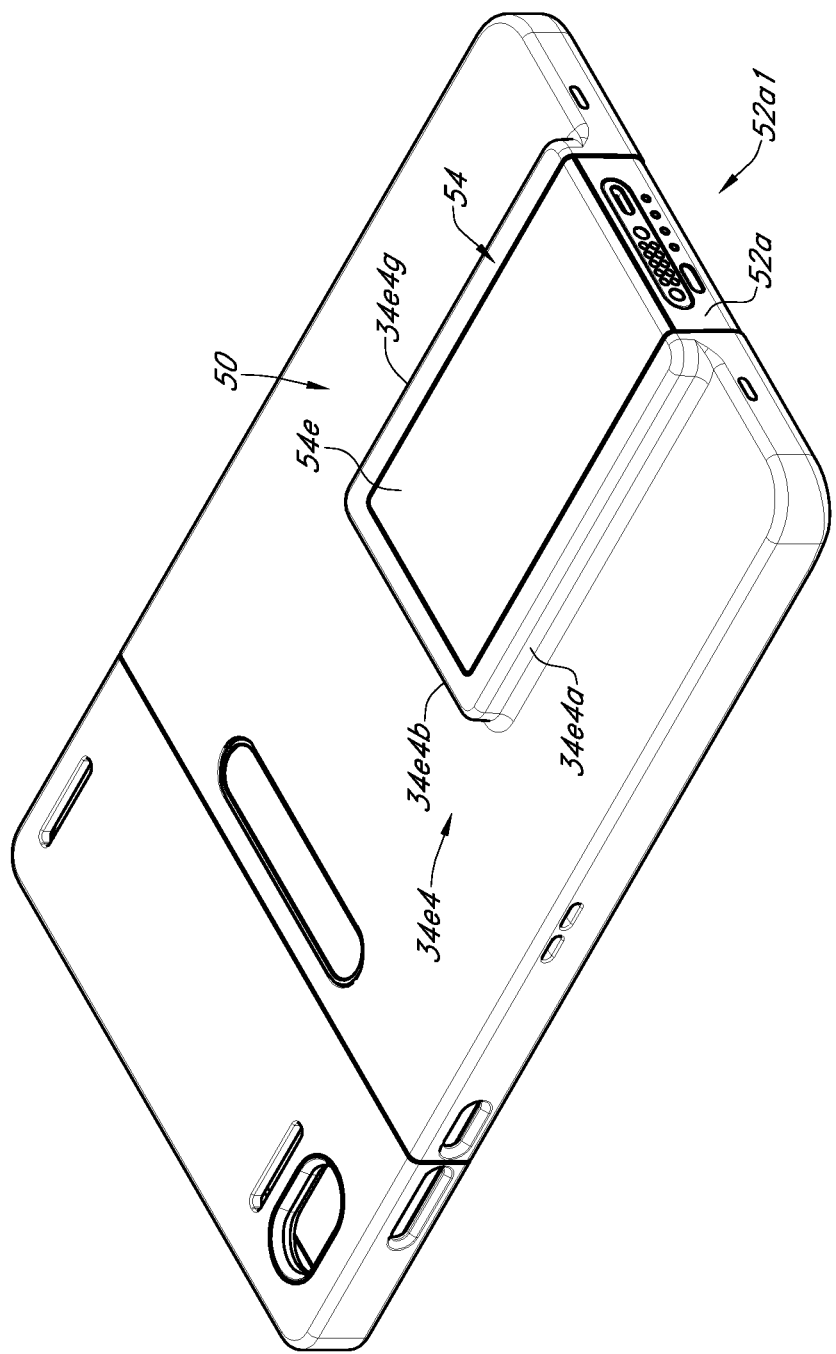
FIG. 83 is a rear-bottom perspective view of the accessory assembly of FIG. 72 coupled with the case assembly of FIG. 24.

Turning to FIG. 83, depicted therein is a rear-bottom perspective view of accessory assembly 50 coupled with device case assembly 30.

Figure 84:
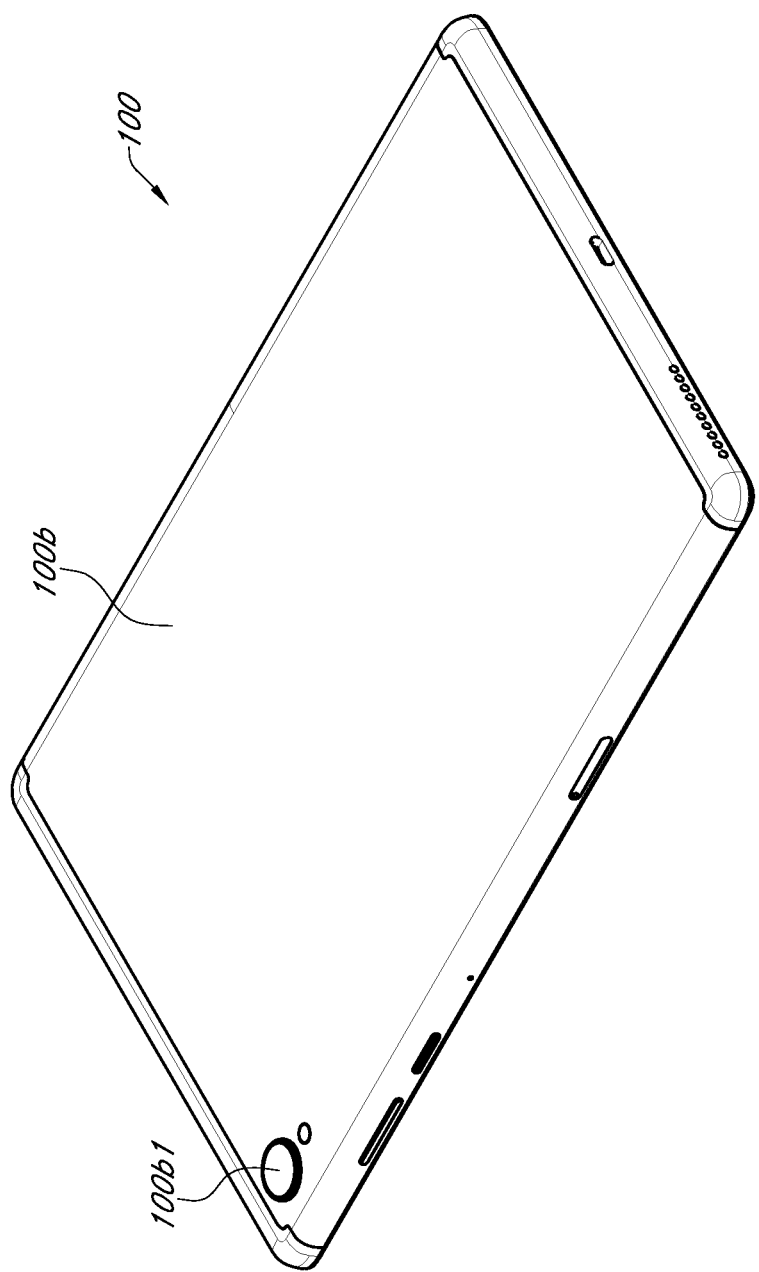
FIG. 84 is a bottom perspective view of the electronic device of FIG. 30.

Turning to FIG. 84, depicted therein is a bottom perspective view of portable electronic device 100. Depicted implementation of portable electronic device 100 is shown to include camera 100b1.

Figure 85:
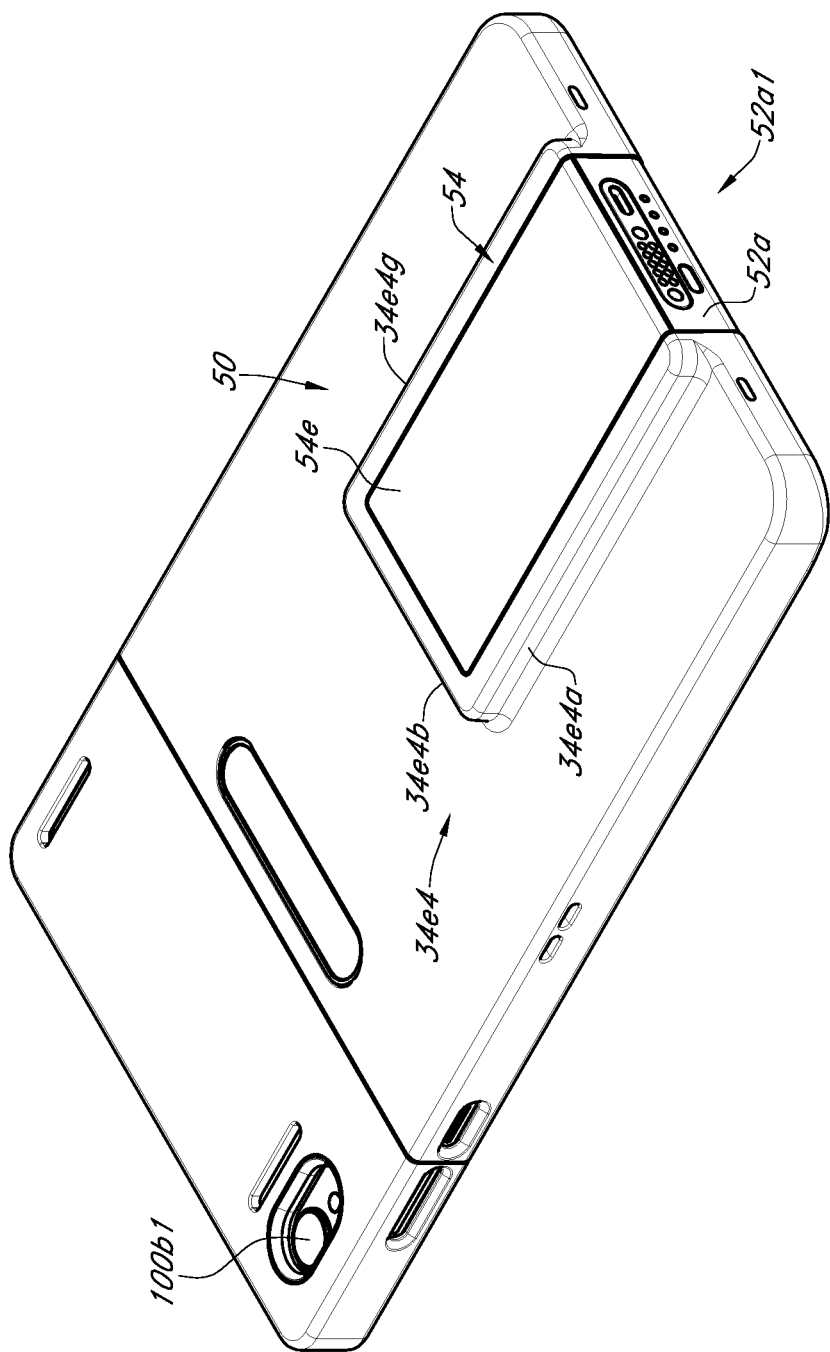
FIG. 85 is a rear-bottom perspective view of the accessory assembly of FIG. 72 coupled with the case assembly of FIG. 24 which is coupled with the electronic device of FIG. 30.

Turning to FIG. 85, depicted therein is a rear-bottom perspective view of accessory assembly 50 coupled with device case assembly 30 which is coupled with portable electronic device 100.

Figure 86:
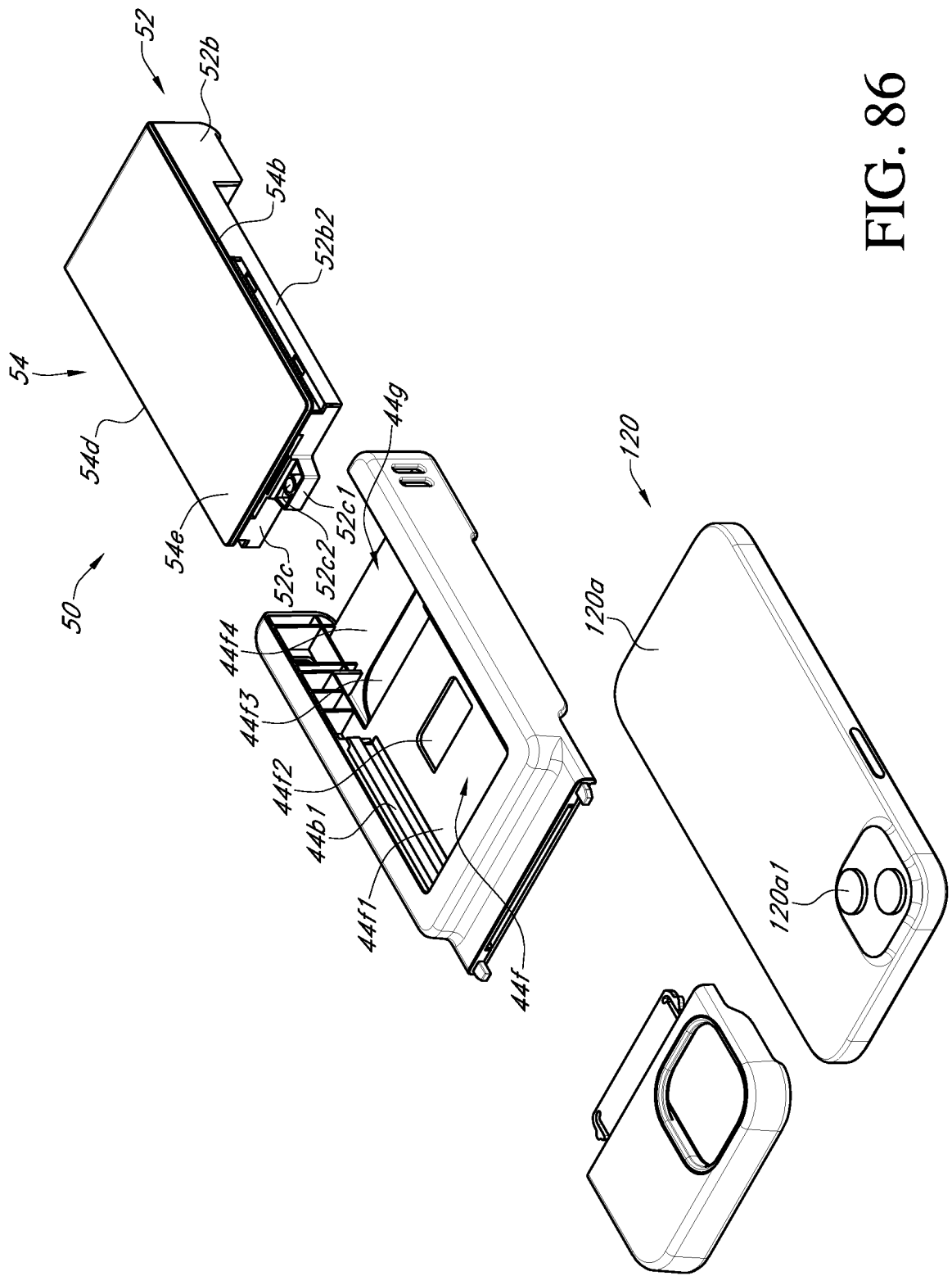
FIG. 86 is an exploded front-bottom perspective view of the case assembly of FIG. 58, the accessory assembly of FIG. 72, and an electronic device.

Turning to FIG. 86, depicted therein is an exploded front-bottom perspective view of case assembly 40, accessory assembly 50, and electronic device 120. Depicted implementation of main assembly 44 is shown to include elongated protrusion 44b1, and interior area 44f with raised base portion 44f1, aperture 44f2, aperture 44f3, and recessed base portion 44f4. Depicted implementation of electronic device 120 is shown to include back 120a with camera 120a1.

Figure 87:
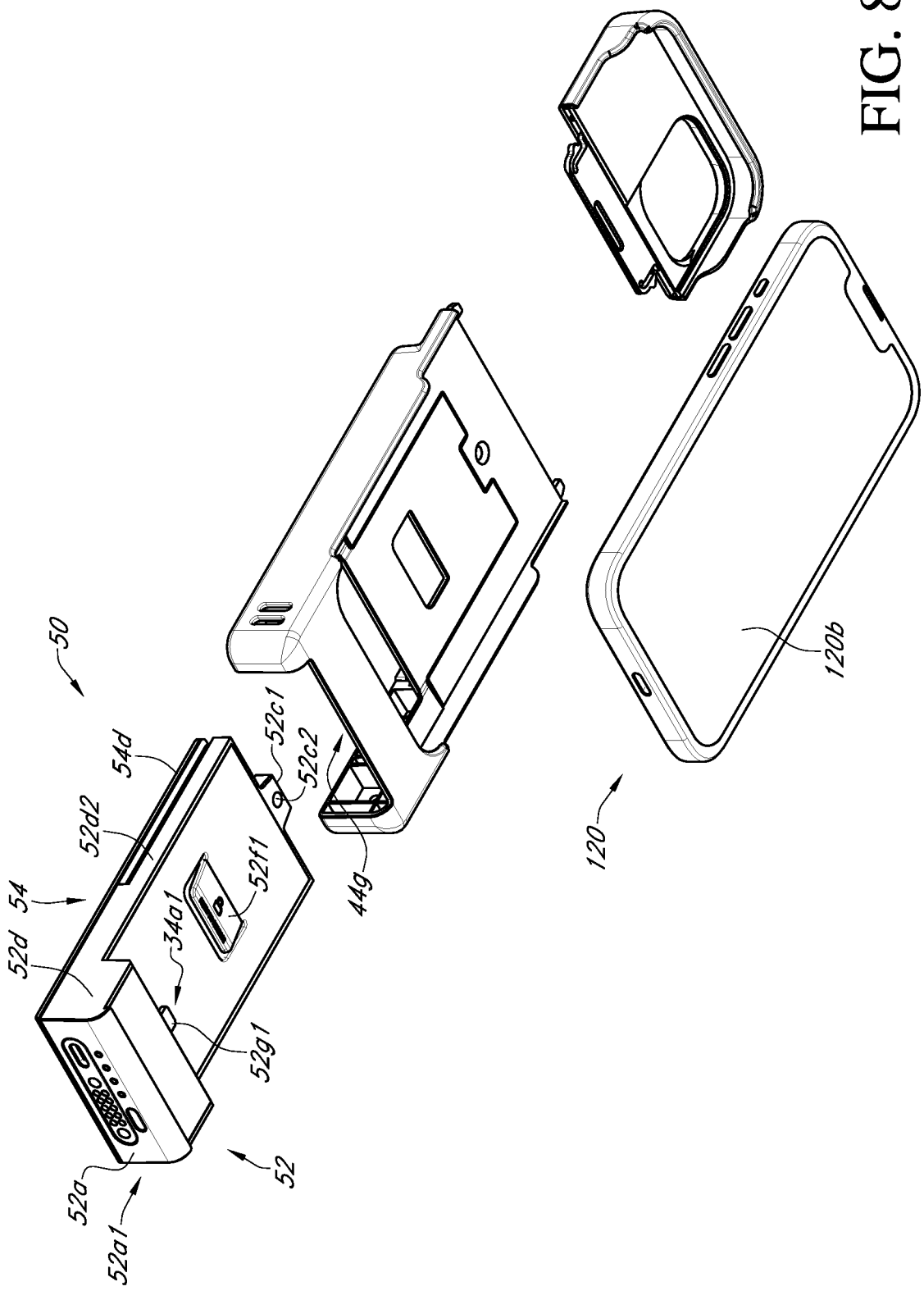
FIG. 87 is an exploded rear-top perspective view of the case assembly of FIG. 58, the accessory assembly of FIG. 72, and an electronic device.

Turning to FIG. 87, depicted therein is an exploded rear-top perspective view of case assembly 40, accessory assembly 50, and electronic device 120. Depicted implementation of electronic device 120 is shown to include front 120b.

Figure 88:
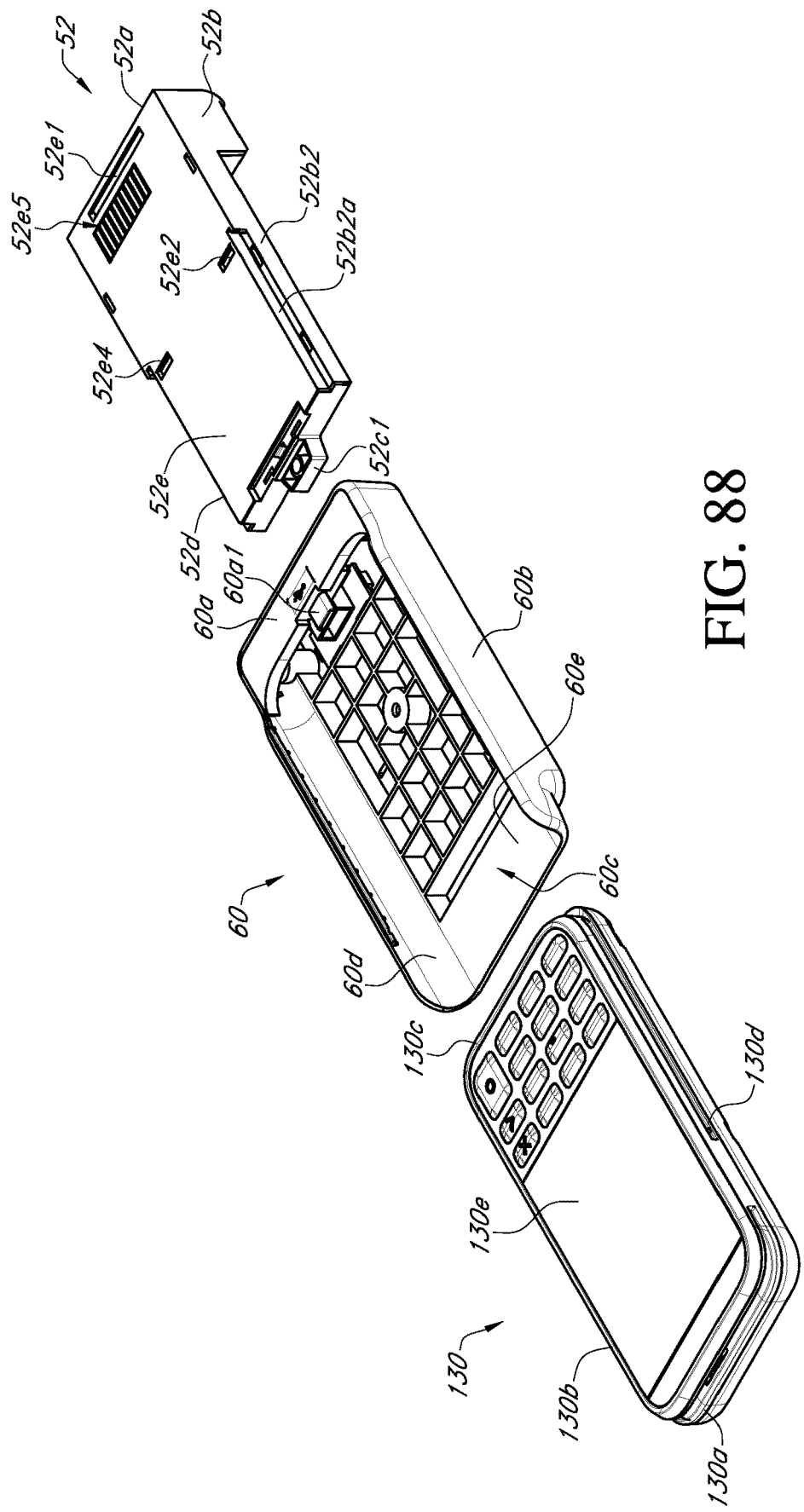
FIG. 88 is an exploded front-bottom perspective view of a portion of the accessory assembly of FIG. 72, an interface assembly, and a keypad assembly.

Turning to FIG. 88, depicted therein is an exploded front-bottom perspective view of a portion of accessory assembly 50, interface assembly 60, and keypad 130. Depicted implementation of interface assembly 60 is shown to include end wall 60a with electric plug 60a1, side wall 60b, interior area 60c, side wall 60d, and base 60e. Depicted implementation of keypad 130 is shown to include side 130a, side 130b, side 130c, side 130d, and side 130e.

Figure 89:
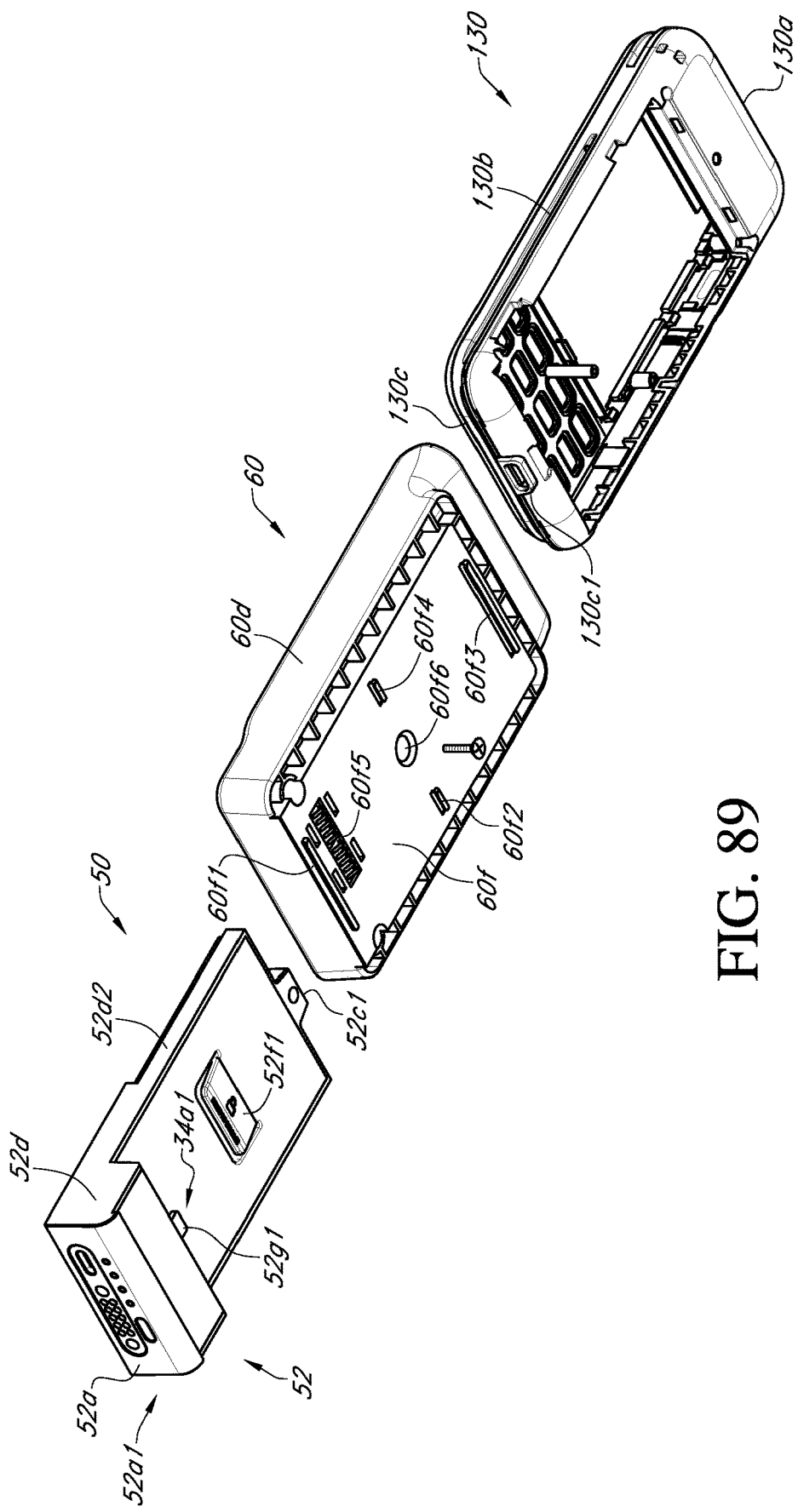
FIG. 89 is an exploded rear-top perspective view of a portion of the accessory assembly of FIG. 72, the interface assembly of FIG. 88, and the keypad assembly of FIG. 88.

Turning to FIG. 89, depicted therein is an exploded rear-top perspective view of a portion of accessory assembly 50, interface assembly 60, and keypad 130. Depicted implementation of base 60f is shown to include prong 60f1, prong 60f2, prong 60f3, prong 604f4, electric contacts interface 60f5, and aperture 60f6. In implementations electric contacts interface 60f5 is sized and positioned to engage with electric contacts interface 52e5 when interface assembly 60 is coupled with main assembly 52. Depicted implementation of side 130c is shown to include receptacle 130c1.

Figure 90:
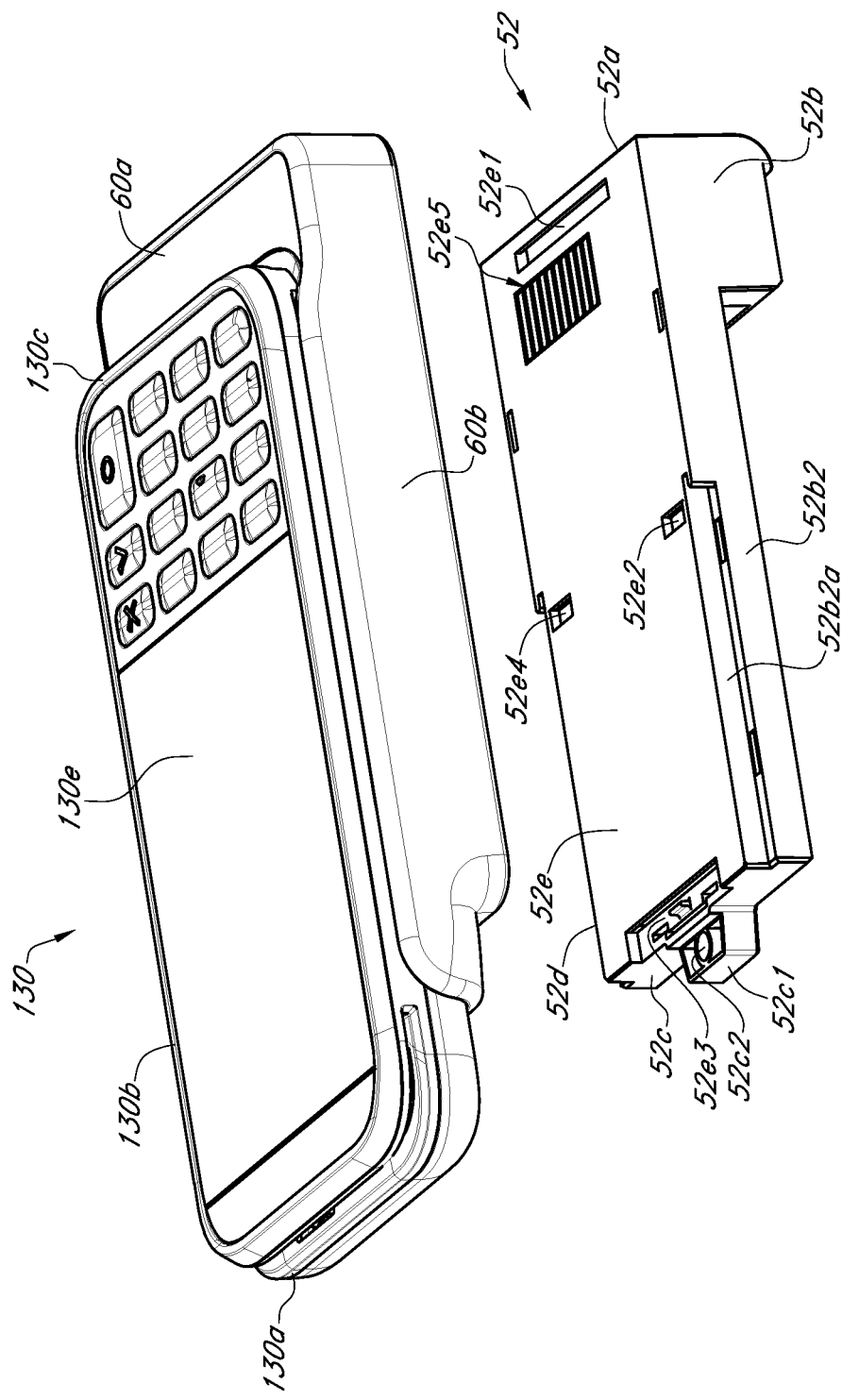
FIG. 90 is a partial exploded front-bottom perspective view of the keypad assembly of FIG. 88 coupled with the interface assembly of FIG. 88, and uncoupled with a portion of the accessory assembly of FIG. 72.

Turning to FIG. 90, depicted therein is a partial exploded front-bottom perspective view of keypad 130, coupled with interface assembly 60, and uncoupled with a portion of accessory assembly 50.

Figure 91:
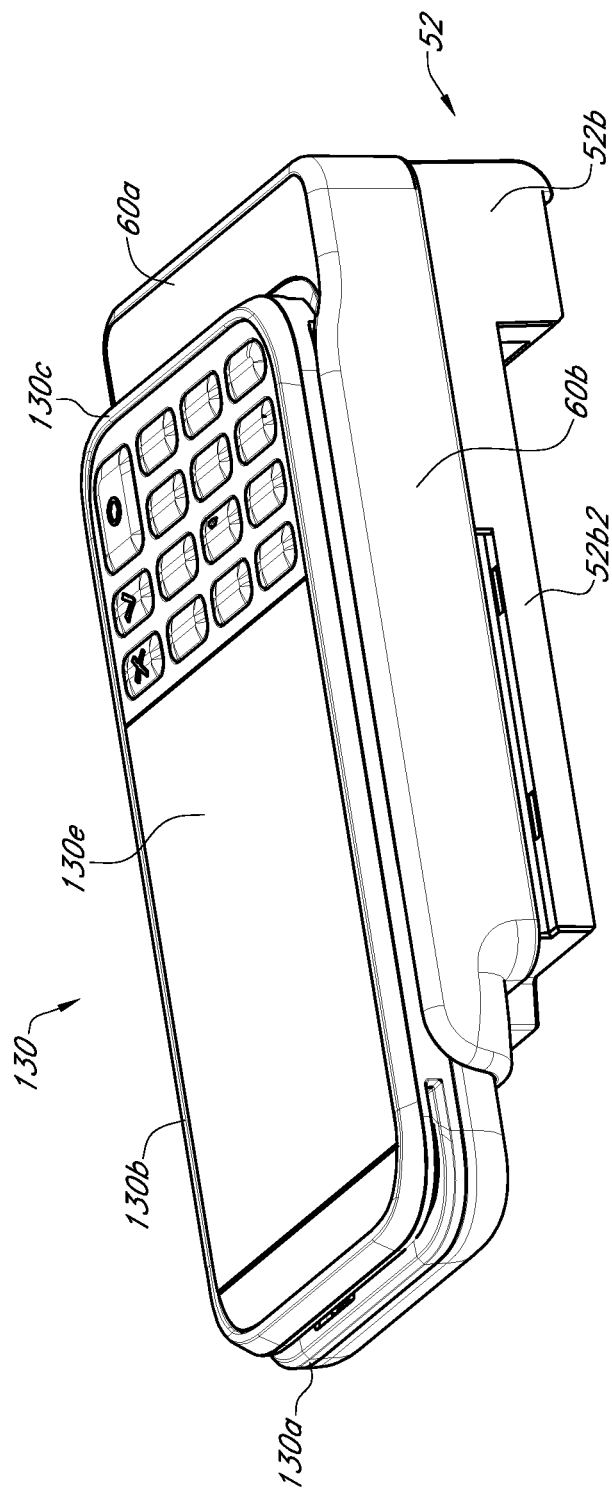
FIG. 91 is a front-bottom perspective view of the keypad assembly of FIG. 88 coupled with the interface assembly of FIG. 88, and coupled with a portion of the accessory assembly of FIG. 72.

Turning to FIG. 91, depicted therein is a front-bottom perspective view of keypad 130 coupled with interface assembly 60, and coupled with a portion of accessory assembly 50.

Figure 92:
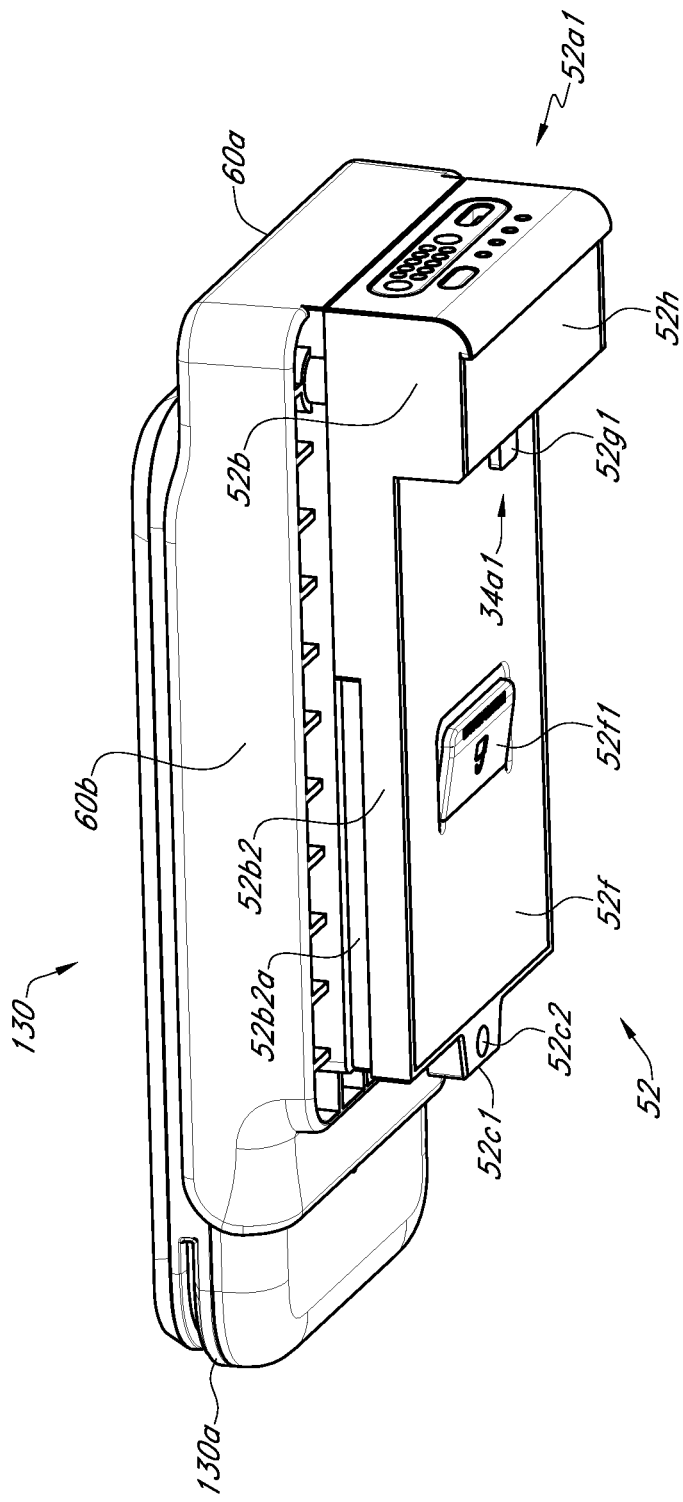
FIG. 92 is a partial exploded rear-top perspective view of the keypad assembly of FIG. 88 coupled with the interface assembly of FIG. 88, and uncoupled with a portion of the accessory assembly of FIG. 72.

Turning to FIG. 92, depicted therein is a partial exploded rear-top perspective view of keypad 130, coupled with interface assembly 60, and uncoupled with a portion of accessory assembly 50.

Figure 93:
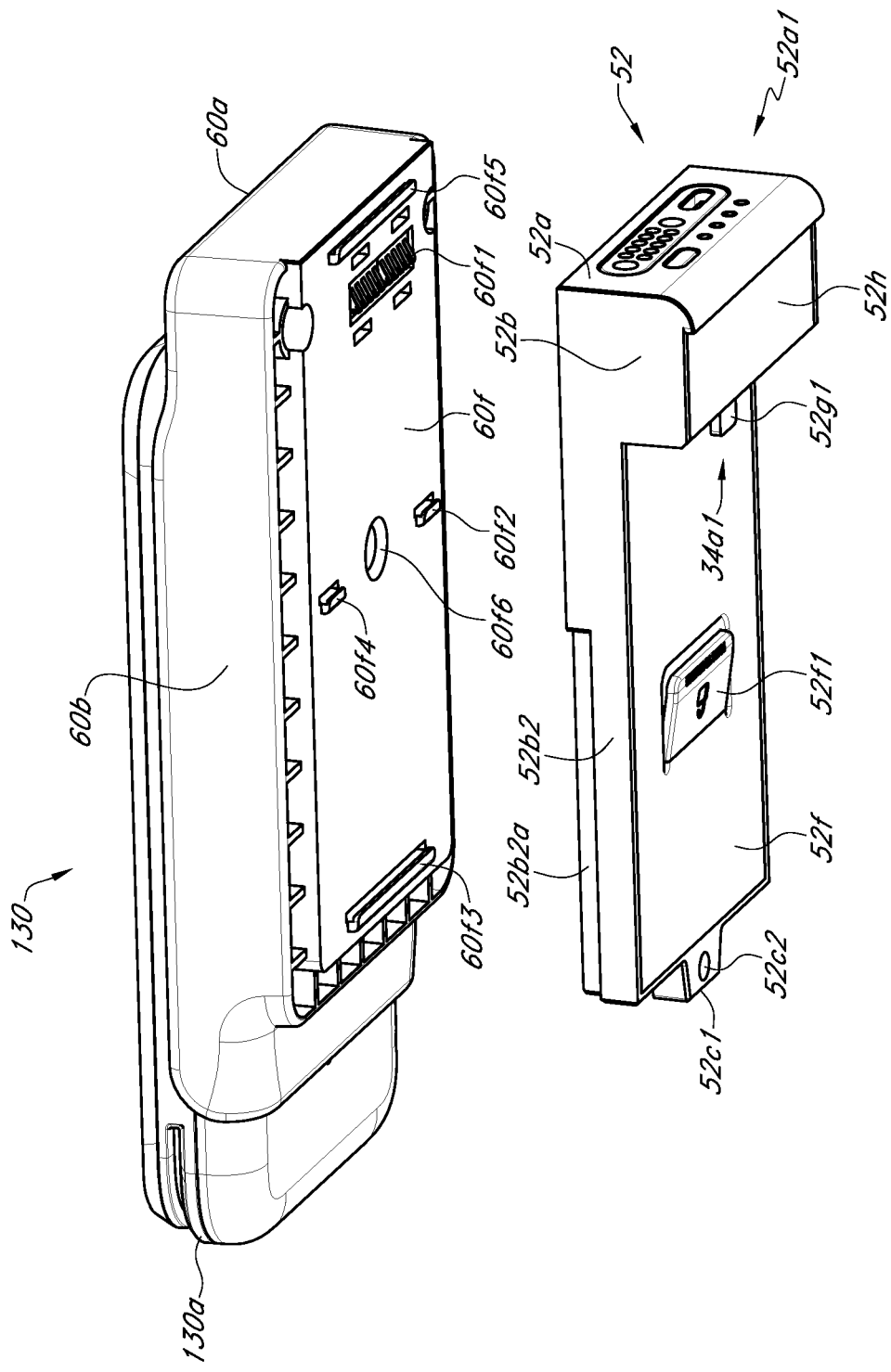
FIG. 93 is a rear-top perspective view of the keypad assembly of FIG. 88 coupled with the interface assembly of FIG. 88, and coupled with a portion of the accessory assembly of FIG. 72.

Turning to FIG. 93, depicted therein is a rear-top perspective view of keypad 130 coupled with interface assembly 60, and coupled with a portion of accessory assembly 50.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms unless context dictates otherwise. For example, the phrase "A or B" will be typically understood to include the possibilities of "A" or "B" or "A and B."

With respect to the appended claims, those skilled in the art will appreciate that recited operations therein may generally be performed in any order. Also, although various operational flows are presented in a sequence(s), it should be understood that the various operations may be performed in other orders than those which are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

What is claimed is:

1. A system for a portable electronic device, the system comprising:
    (I) a case assembly including
        (A) a base having a first surface and a second surface, the first surface facing in a first direction, the second surface facing in a second direction, the first direction and the second direction being opposite directions,
        (B) a portable electronic device coupler assembly including
            (i) a first side wall perpendicularly extending from the first surface of the base, (ii) a second side wall perpendicularly extending from the first surface of the base and extending perpendicular to the first side wall, and (iii) a third side wall perpendicularly extending from the first surface of the base and extending perpendicular to the first side wall, wherein the first side wall, the second side wall, the third side wall, and the first surface of the base at least in part bound an interior area to couple with the portable electronic device, and (C) an accessory coupler assembly including (i) a first side wall perpendicularly extending from the second surface of the base, (ii) a second side wall perpendicularly extending from the second surface of the base and extending perpendicular to the first side wall, and (iii) a third side wall perpendicularly extending from the second surface of the base and extending perpendicular to the first side wall, wherein the first side wall of the accessory coupler assembly, the second side wall of the accessory coupler assembly, the third side wall of the accessory coupler assembly, and a first portion of the second surface of the base at least in part bound an interior area, wherein the base is positioned between the interior area of the portable electronic device coupler and the interior area of the accessory coupler assembly;

(II) an accessory assembly configured to provide at least one portable electronic device service function, wherein the accessory assembly includes a back side planar portion, a front side planar portion extending parallel with the back side planar portion, a first side planar portion extending perpendicular to the front side planar portion, and a second side planar portion extending parallel to the first side planar portion, wherein the accessory assembly being sized and shaped to linearly slide at least partially into the interior area of the accessory coupler assembly to non-rotatably couple with the accessory coupler assembly, wherein the first side planar portion of the accessory assembly is adjacent to a planar portion of the second side wall of the accessory coupler assembly when the accessory assembly is coupled with the accessory coupler assembly, wherein the second side planar portion of the accessory assembly is adjacent to a planar portion the third side wall of the accessory coupler assembly when the accessory assembly is coupled with the accessory coupler assembly, and wherein the front side planar portion of the accessory assembly is adjacent to a planar portion of the first portion of the second surface of the base of the accessory coupler assembly when the accessory assembly is coupled with the accessory coupler assembly; and (III) a cover assembly wherein the cover assembly includes a rectangularly shaped base as a rigid sheet with an exterior side facing in a first direction and an interior side facing is a second direction that is opposite of the first direction, and wherein the interior side of the cover assembly removably engages with the back side planar portion of the accessory assembly to cover the back side planar portion of the accessory assembly.

2. The system of claim 1 wherein the accessory assembly includes a multi-planar-sided base portion linearly extending in a first direction, wherein the accessory assembly includes a multi-planar-sided extended portion linearly extending in a second direction perpendicular to the first direction of the base portion, wherein the base portion and the extended portion are integrally formed with each other as portions of the accessory assembly, wherein the extended portion includes the back side planar portion, the front side planar portion, the first side planar portion and the second side planar portion of the accessory assembly, wherein the extended portion includes a first linear groove adjacent the first side planar portion, the first linear groove having a first greatest length with a dimension greater than any other dimensions of the first linear groove, wherein the first linear groove has at least one rectangular face extending along the first greatest length of the first linear groove, wherein the extended portion includes a second linear groove adjacent the second side planar portion, the second linear groove having a second greatest length with a dimension greater than any other dimensions of the second linear groove, and wherein the second linear groove has at least one rectangular face extending along the second greatest length of the second linear groove.

3. The system of claim 2 wherein the accessory coupler includes a first multi-planar-sided protrusion extending from the second side wall of the accessory coupler assembly, the first protrusion linearly extending along the second side wall with a greatest length at least seventy-five percent of the first greatest length of the first linear groove of the accessory assembly, wherein the accessory coupler includes a second multi-planar-sided protrusion extending from the third side wall of the accessory coupler assembly, the second protrusion linearly extending along the third side with a greatest length at least seventy-five percent of the second greatest length of the second linear groove of the accessory assembly, wherein the first protrusion of the accessory coupler assembly couples with the first linear groove of the accessory assembly when the accessory assembly is coupled with the accessory coupler assembly, and wherein the second protrusion of the accessory coupler assembly couples with the second linear groove of the accessory assembly when the accessory assembly is coupled with the accessory coupler assembly.

4. The system of claim 1 wherein the cover assembly includes at least one protrusion extending from the interior side of the cover assembly, wherein the back side planar portion of the accessory assembly includes at least one notch, and wherein the at least one protrusion of the cover assembly couples with the at least one notch of the accessory assembly when the cover assembly is coupled with the accessory assembly.

5. The system of claim 4 wherein the accessory assembly includes a plurality of electrical contacts adjacent the back side planar portion of the accessory assembly.

6. The system of claim 2
wherein the base portion of the accessory assembly includes a coupling side facing in the second direction of the extended portion of the accessory assembly,
wherein front side planar portion of the extended portion of the accessory assembly and the coupling side of the base portion of the accessory assembly partially bound an interior area, and
wherein the accessory assembly includes an electric plug that protrudes from the coupling side of the base portion o the accessory assembly.

7. The system of claim 6
wherein the base portion of the accessory assembly includes an exterior side facing in a direction that is opposite to what of the coupling side of the base portion faces, and
wherein the exterior side of the base portion of the accessory assembly includes an exterior electrical interface.

8. The system of claim 6
wherein the first side wall of the accessory coupler assembly includes an aperture, and
wherein the aperture of the first side wall of the accessory coupler assembly couples with the electric plug of the accessory assembly when the accessory assembly couples with the accessory coupler assembly.

9. The system of claim 1
wherein the extended portion of the accessory assembly includes a hinged tab extending from the front side planar portion of the extended portion, and
wherein a portion of the base of the case assembly that has the first portion of the second surface of the base that in part bounds the interior area of the accessory coupler assembly includes an aperture to couple with the hinged tab when the accessory assembly is coupled with the accessory coupler assembly.

10. The system of claim 1 further including an interface assembly and a keypad assembly,
wherein the interface assembly includes a base with at least one prong extending from the base,
wherein the back side planar portion of the accessory assembly includes at least one notch,
wherein the at least one prong of the interface assembly couples with the at least one notch of the accessory assembly when the accessory assembly is coupled with the interface assembly,
wherein the keypad assembly includes a keypad,
wherein the interface assembly includes an interior area, and
wherein the keypad assembly is coupled with the interior area of the interface assembly when the keypad assembly is coupled with the interface assembly.

11. The system of claim 1 wherein the at least one portable electronic device service function of the accessory assembly includes one or more of the following:
storage of electrical power and electronic-based communication.

12. A system for a portable electronic device, the system comprising:
(I) a case assembly including
(A) a base having a first surface and a second surface, the first surface facing in a first direction, the second surface facing in a second direction, the first direction and the second direction being opposite directions,
(B) a portable electronic device coupler assembly including
(i) a first side wall perpendicularly extending from the first surface of the base,
(ii) a second side wall perpendicularly extending from the first surface of the base and extending perpendicular to the first side wall, and
(iii) a third side wall perpendicularly extending from the first surface of the base and extending perpendicular to the first side wall,
wherein the first side wall, the second side wall, the third side wall, and the first surface of the base at least in part bound an interior area to couple with the portable electronic device, and
(C) an accessory coupler assembly including
(i) a first side wall perpendicularly extending from the second surface of the base,
(ii) a second side wall perpendicularly extending from the second surface of the base and extending perpendicular to the first side wall, and
(iii) a third side wall perpendicularly extending from the second surface of the base and extending perpendicular to the first side wall,
wherein the first side wall of the accessory coupler assembly, the second side wall of the accessory coupler assembly, the third side wall of the accessory coupler assembly, and a first portion of the second surface of the base at least in part bound an interior area,
wherein the base is positioned between the interior area of the portable electronic device coupler and the interior area of the accessory coupler assembly;
(II) an accessory assembly configured to provide at least one portable electronic device service function,
wherein the accessory assembly includes a back side planar portion, a front side planar portion extending parallel with the back side planar portion, a first side planar portion extending perpendicular to the front side planar portion, and a second side planar portion extending parallel to the first side planar portion,
wherein the accessory assembly being sized and shaped to non-rotatably couple with the accessory coupler assembly,
wherein the first side planar portion of the accessory assembly is adjacent to a planar portion of the second side wall of the accessory coupler assembly when the accessory assembly is coupled with the accessory coupler assembly,
wherein the second side planar portion of the accessory assembly is adjacent to a planar portion the third side wall of the accessory coupler assembly when the accessory assembly is coupled with the accessory coupler assembly, and
wherein the front side planar portion of the accessory assembly is adjacent to a planar portion of the first portion of the second surface of the base of the accessory coupler assembly when the accessory assembly is coupled with the accessory coupler assembly; and
(III) a cover assembly
wherein the cover assembly includes a rectangularly shaped base as a rigid sheet with an exterior side facing in a first direction and an interior side facing is a second direction that is opposite of the first direction, and
wherein the interior side of the cover assembly removably engages with the back side planar portion of the accessory assembly to cover the back side planar portion of the accessory assembly.

13. The system of claim 12
wherein the accessory assembly includes a multi-planar-sided base portion linearly extending in a first direction,
wherein the accessory assembly includes a multi-planar-sided extended portion linearly extending in a second direction perpendicular to the first direction of the base portion,
wherein the base portion and the extended portion are integrally formed with each other as portions of the accessory assembly,
wherein the extended portion includes the back side planar portion, the front side planar portion, the first side planar portion and the second side planar portion of the accessory assembly,
wherein the extended portion includes a first linear groove adjacent the first side planar portion, the first linear groove having a first greatest length with a dimension greater than any other dimensions of the first linear groove,
wherein the first linear groove has at least one rectangular face extending along the first greatest length of the first linear groove,
wherein the extended portion includes a second linear groove adjacent the second side planar portion, the second linear groove having a second greatest length with a dimension greater than any other dimensions of the second linear groove, and
wherein the second linear groove has at least one rectangular face extending along the second greatest length of the second linear groove.

14. The system of claim 13
wherein the accessory coupler includes a first multi-planar-sided protrusion extending from the second side wall of the accessory coupler assembly, the first protrusion linearly extending along the second side wall with a greatest length at least seventy-five percent of the first greatest length of the first linear groove of the accessory assembly,
wherein the accessory coupler includes a second multi-planar-sided protrusion extending from the third side wall of the accessory coupler assembly, the second protrusion linearly extending along the third side with a greatest length at least seventy-five percent of the second greatest length of the second linear groove of the accessory assembly,
wherein the first protrusion of the accessory coupler assembly couples with the first linear groove of the accessory assembly when the accessory assembly is coupled with the accessory coupler assembly, and
wherein the second protrusion of the accessory coupler assembly couples with the second linear groove of the accessory assembly when the accessory assembly is coupled with the accessory coupler assembly.

15. The system of claim 12 further including an interface assembly and a keypad assembly,
wherein the interface assembly includes a base with at least one prong extending from the base,
wherein the back side planar portion of the accessory assembly includes at least one notch,
wherein the at least one prong of the interface assembly couples with the at least one notch of the accessory assembly when the accessory assembly is coupled with the interface assembly,
wherein the keypad assembly includes a keypad,
wherein the interface assembly includes an interior area, and
wherein the keypad assembly is coupled with the interior area of the interface assembly when the keypad assembly is coupled with the interface assembly.

\* \* \* \* \*